(12) United States Patent
Huang et al.

(10) Patent No.: US 12,125,437 B2
(45) Date of Patent: Oct. 22, 2024

(54) DISPLAY SUBSTRATE AND PREPARATION METHOD THEREOF, AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Yao Huang, Beijing (CN); Yudiao Cheng, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/638,862

(22) PCT Filed: Apr. 27, 2021

(86) PCT No.: PCT/CN2021/090323
§ 371 (c)(1),
(2) Date: Feb. 28, 2022

(87) PCT Pub. No.: WO2022/226801
PCT Pub. Date: Nov. 3, 2022

(65) Prior Publication Data
US 2024/0038163 A1     Feb. 1, 2024

(51) Int. Cl.
*G09G 3/3233*     (2016.01)

(52) U.S. Cl.
CPC ... *G09G 3/3233* (2013.01); *G09G 2300/0842* (2013.01); *G09G 2330/021* (2013.01); *G09G 2360/14* (2013.01)

(58) Field of Classification Search
CPC ......... G09G 3/3233; G09G 2300/0842; G09G 2330/021; G09G 2360/14
See application file for complete search history.

(56) References Cited

U.S. PATENT DOCUMENTS

2010/0190338 A1*   7/2010   Koike ............... H01L 27/14689
                                                                                                               257/E21.597
2016/0224157 A1*   8/2016   Yang ...................... G06F 3/042
(Continued)

FOREIGN PATENT DOCUMENTS

| CN | 107910352 A | 4/2018 |
|---|---|---|
| CN | 109390351 A | 2/2019 |

(Continued)

OTHER PUBLICATIONS

Office Action dated Jun. 7, 2024 for Chinese Patent Application No. 2021800009521 and English Translation.

*Primary Examiner* — Kenneth B Lee, Jr.
(74) *Attorney, Agent, or Firm* — Ling Wu; Stephen Yang; Ling and Yang Intellectual Property

(57) ABSTRACT

Provided is a display substrate, which includes: a base substrate disposed with a first display region and a second display region, multiple second-region light emitting elements located in the second display region, and multiple second-type pixel circuits located in the first display region. The first display region is located at at least one side of the second display region. The multiple second-type pixel circuits include multiple pixel circuits of a first structure and multiple pixel circuits of a second structure. At least one pixel circuit of the multiple pixel circuits of the first structure is connected with at least one second-region light emitting element of the multiple second-region light emitting elements through a first group of conductive lines.

19 Claims, 28 Drawing Sheets

(56) References Cited

U.S. PATENT DOCUMENTS

| | | | | |
|---|---|---|---|---|
| 2019/0363155 A1* | 11/2019 | Xiao | ................... | H01L 27/1218 |
| 2022/0069047 A1* | 3/2022 | Yang | ................... | H10K 59/1216 |
| 2022/0319411 A1* | 10/2022 | Cheng | ................... | H10K 71/621 |

FOREIGN PATENT DOCUMENTS

| | | | |
|---|---|---|---|
| CN | 110767665 | A | 2/2020 |
| CN | 111025798 | A | 4/2020 |
| CN | 111128080 | A | 5/2020 |
| CN | 111180494 | A | 5/2020 |
| CN | 111261677 | A | 6/2020 |
| CN | 111463254 | A | 7/2020 |
| CN | 111710276 | A | 9/2020 |
| CN | 111916486 | A | 11/2020 |
| CN | 111969027 | A | 11/2020 |
| CN | 112037715 | A | 12/2020 |
| CN | 112216733 | A | 1/2021 |
| CN | 112259589 | A | 1/2021 |
| CN | 112271203 | A | 1/2021 |
| CN | 112490277 | A | 3/2021 |
| CN | 112562518 | A | 3/2021 |
| JP | 2014068035 | A | 4/2014 |
| KR | 20190079856 | A | 7/2019 |

\* cited by examiner

| R | G1 | R | G1 | R | G1 | Second-type pixel circuit | R | G1 | R | G1 | Second-type pixel circuit | Second-region light emitting element | Second-region light emitting element |
|---|----|---|----|---|----|---------------------------|---|----|---|----|---------------------------|---------------------------------------|---------------------------------------|
| B | G2 | B | G2 | B | G2 |                           | B | G2 | B | G2 |                           |                                       |                                       |
| R | G1 | R | G1 | R | G1 | Second-type pixel circuit | R | G1 | R | G1 | Second-type pixel circuit | Second-region light emitting element | Second-region light emitting element |
| B | G2 | B | G2 | B | G2 |                           | B | G2 | B | G2 |                           |                                       |                                       |
| R | G1 | R | G1 | R | G1 | Second-type pixel circuit | R | G1 | R | G1 | Second-type pixel circuit | Second-region light emitting element | Second-region light emitting element |
| B | G2 | B | G2 | B | G2 |                           | B | G2 | B | G2 |                           |                                       |                                       |
| R | G1 | R | G1 | R | G1 | Second-type pixel circuit | R | G1 | R | G1 | Second-type pixel circuit | Second-region light emitting element | Second-region light emitting element |
| B | G2 | B | G2 | B | G2 |                           | B | G2 | B | G2 |                           |                                       |                                       |
| R | G1 | R | G1 | R | G1 | Second-type pixel circuit | R | G1 | R | G1 | Second-type pixel circuit | Second-region light emitting element | Second-region light emitting element |
| B | G2 | B | G2 | B | G2 |                           | B | G2 | B | G2 |                           |                                       |                                       |
| R | G1 | R | G1 | R | G1 | Second-type pixel circuit | R | G1 | R | G1 | Second-type pixel circuit | Second-region light emitting element | Second-region light emitting element |
| B | G2 | B | G2 | B | G2 |                           | B | G2 | B | G2 |                           |                                       |                                       |
| R | G1 | R | G1 | R | G1 | Second-type pixel circuit | R | G1 | R | G1 | Second-type pixel circuit | Second-region light emitting element | Second-region light emitting element |
| B | G2 | B | G2 | B | G2 |                           | B | G2 | B | G2 |                           |                                       |                                       |

FIG. 3

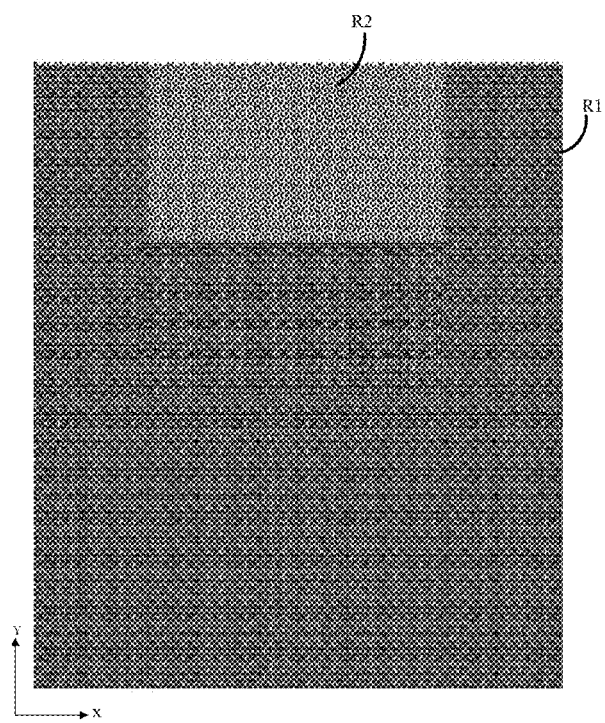

FIG. 4A

DISPLAY SUBSTRATE AND PREPARATION METHOD THEREOF, AND DISPLAY APPARATUS

CROSS-REFERENCE TO RELATED APPLICATION

The present application is a U.S. National Phase Entry of International Application No. PCT/CN2021/090323 having an international filing date of Apr. 27, 2021. The above-identified application is hereby incorporated by reference.

TECHNICAL FIELD

The present disclosure relates to, but is not limited to, the field of display technologies, and particularly to a display substrate and a preparation method thereof, and a display apparatus.

BACKGROUND

An Organic Light Emitting Diode (OLED) is an active light emitting display device, which has advantages such as self-emission, a wide angle of view, high contrast, low power consumption, an extremely high response speed, lightness and thinness, flexibility, and a low cost. With continuous development of display technologies, a Flexible Display with an OLED as a light emitting device and a Thin Film Transistor (TFT) for performing signal controlling has become a mainstream product in a current display field.

An under-screen camera technology is a brand-new technology proposed to increase a screen-to-body ratio of a display apparatus.

SUMMARY

The following is a summary about the subject matter described in the present disclosure in detail. The summary is not intended to limit the scope of protection of claims.

Embodiments of the present disclosure provide a display substrate and a preparation method thereof, and a display apparatus.

In one aspect, an embodiment of the present disclosure provides a display substrate, which includes a base substrate disposed with a first display region and a second display region, multiple second-region light emitting elements located in the second display region, and multiple second-type pixel circuits located in the first display region. The first display region is located at at least one side of the second display region. The multiple second-type pixel circuits include multiple pixel circuits of a first structure and multiple pixel circuits of a second structure. At least one pixel circuit of the multiple pixel circuits of the first structure is connected with at least one second-region light emitting element of the multiple second-region light emitting elements through a first group of conductive lines. At least one pixel circuit of the multiple pixel circuits of the second structure is connected with at least one light emitting element of the multiple second-region light emitting elements through a second group of conductive lines. A length of the second group of conductive lines is greater than a length of the first group of conductive lines.

In some exemplary embodiments, the pixel circuit of the first structure is connected with a first initial signal line, and the pixel circuit of the second structure is connected with the first initial signal line and a second initial signal line; and the first initial signal line and the second initial signal line provide different initial signals.

In some exemplary embodiments, the display substrate further includes multiple first-region light emitting elements and multiple first-type pixel circuits located in the first display region. At least one first-type pixel circuit of the multiple first-type pixel circuits is connected with at least one first-region light emitting element of the multiple first-region light emitting elements, and an orthographic projection of the at least one first-type pixel circuit on the base substrate at least partially overlaps with an orthographic projection of the at least one first-region light emitting element on the base substrate. The multiple first-type pixel circuits are all pixel circuits of the first structure.

In some exemplary embodiments, the pixel circuit of the first structure includes a drive transistor, a first reset transistor, and a second reset transistor. A gate electrode of the first reset transistor is connected with a first reset control line, a first electrode of the first reset transistor is connected with a gate electrode of the drive transistor, and a second electrode of the first reset transistor is connected with the first initial signal line. A gate electrode of the second reset transistor is connected with a second reset control line, a first electrode of the second reset transistor is connected with a first electrode of a light emitting element, and a second electrode of the second reset transistor is connected with the first initial signal line.

In some exemplary embodiments, the pixel circuit of the second structure includes a drive transistor, a first reset transistor, and a second reset transistor. A gate electrode of the first reset transistor is connected with a first reset control line, a first electrode of the first reset transistor is connected with a gate electrode of the drive transistor, and a second electrode of the first reset transistor is connected with the first initial signal line. A gate electrode of the second reset transistor is connected with a second reset control line, a first electrode of the second reset transistor is connected with a first electrode of a light emitting element, and a second electrode of the second reset transistor is connected with the second initial signal line. A second initial signal provided by the second initial signal line is different from a first initial signal provided by the first initial signal line.

In some exemplary embodiments, the first initial signal provided by the first initial signal line is a constant voltage signal.

In some exemplary embodiments, the second initial signal provided by the second initial signal line is a constant voltage signal, and the second initial signal is larger than the first initial signal provided by the first initial signal line.

In some exemplary embodiments, a magnitude of the second initial signal provided by the second initial signal line with which the pixel circuit of the second structure is connected is proportional to the length of the second group of conductive lines with which the pixel circuit of the second structure is connected.

In some exemplary embodiments, the pixel circuit of the first structure or the pixel circuit of the second structure further includes a data writing transistor, a threshold compensation transistor, a first light emitting control transistor, and a second light emitting control transistor. A gate electrode of the data writing transistor is connected with the scan line, a first electrode of the data writing transistor is connected with a data line, and a second electrode of the data writing transistor is connected with a first electrode of the drive transistor. A gate electrode of the threshold compensation transistor is connected with the scan line, a first electrode of the threshold compensation transistor is connected with the gate electrode of the drive transistor, and a second electrode of the threshold compensation transistor is connected with a second electrode of the drive transistor. A gate electrode of the first light emitting control transistor is connected with a light emitting control line, a first electrode of the first light emitting control transistor is connected with a first power supply line, and a second electrode of the first light emitting control transistor is connected with the first electrode of the drive transistor. A gate electrode of the second light emitting control transistor is connected with a light emitting control line, a first electrode of the second light emitting control transistor is connected with the second electrode of the drive transistor, and a second electrode of the second light emitting control transistor is connected with the first electrode of the light emitting element.

In some exemplary embodiments, in a plane perpendicular to the display substrate, the display substrate at least includes a semiconductor layer, a first conductive layer, a second conductive layer, and a third conductive layer which are disposed on the base substrate. The semiconductor layer at least includes active layers of multiple transistors. The first conductive layer at least includes gate electrodes of the multiple transistors and a first electrode of a storage capacitor, the scan line, the light emitting control line, the first reset control line, and the second reset control line. The second conductive layer at least includes a second electrode of the storage capacitor, a first initial signal line, and a second initial signal line. The second conductive layer at least includes first and second electrodes of the multiple transistors, the first power supply line, and the data line.

In some exemplary embodiments, active layers of the first reset transistor and the second reset transistor of the pixel circuit of the first structure have an integrated structure; an active layer of a second reset transistor of a pixel circuit of a first structure in a n-th row and an active layer of a first reset transistor of a pixel circuit in a (n+1)-th row have an integrated structure, and n is a positive integer.

In some exemplary embodiments, active layers of the first reset transistor and the second reset transistor of the pixel circuit of the second structure have an integrated structure; an active layer of a second reset transistor of a pixel circuit of a second structure in a n-th row is not connected with an active layer of a first reset transistor of a pixel circuit in a (n+1)-th row, and n is a positive integer.

In some exemplary embodiments, the third conductive layer includes a second electrode of the second reset transistor of the pixel circuit of the second structure and a second electrode of a second reset transistor of the pixel circuit of the first structure. The second electrode of the second reset transistor of the pixel circuit of the second structure is connected with the second initial signal line through a via. The second electrode of the second reset transistor of the pixel circuit of the first structure is not connected with the second initial signal line.

In some exemplary embodiments, the first group of conductive lines and the second group of conductive lines are made of transparent conductive materials.

In some exemplary embodiments, multiple second-type pixel circuits are distributed among multiple first-type pixel circuits at intervals.

In some exemplary embodiments, among multiple first-type pixel circuits and multiple second-type pixel circuits, a size of any pixel circuit in a first direction is smaller than a size of the first-region light emitting element in the first direction.

In some exemplary embodiments, the multiple second-region light emitting elements include multiple groups of second-region light emitting elements, second-region light emitting elements in each group are arranged along the first direction, and the multiple groups of second-region light emitting elements are arranged along a second direction. The multiple second-type pixel circuits include multiple groups of second-type pixel circuits, second-type pixel circuits in each group are arranged along the first direction, and the multiple groups of second-type pixel circuits are arranged along the second direction. The multiple second-region light emitting elements at least include multiple first light emitting elements, multiple second light emitting elements, and multiple third light emitting elements. The multiple second-type pixel circuits include multiple first pixel circuits, multiple second pixel circuits, and multiple third pixel circuits; the multiple first light emitting elements are connected with the multiple first pixel circuits, the multiple second light emitting elements are connected with the multiple second pixel circuits, and the multiple third light emitting elements are connected with the multiple third pixel circuits. In at least one group of second-region light emitting elements and at least one group of second-type pixel circuits, the multiple first pixel circuits connected with the multiple first light emitting elements are closer to the second display region than each of the multiple second pixel circuits connected with the multiple second light emitting elements and closer to the second display region than each of the multiple third pixel circuits connected with the multiple third light emitting elements.

In some exemplary embodiments, a second pixel circuit connected with a second light emitting element through the second group of conductive lines is a pixel circuit of the second structure, a third pixel circuit connected with a third light emitting element through the second group of conductive lines is a pixel circuit of the second structure, a first pixel circuit connected with a first light emitting element through the first group of conductive lines is a pixel circuit of the first structure, and a first pixel circuit connected with a first light emitting element through the second group of conductive lines is a pixel circuit of the second structure.

In some exemplary embodiments, the first light emitting element is configured to emit green light, one of the second light emitting element and the third light emitting element is configured to emit red light, and the other of the second light emitting element and the third light emitting element is configured to emit blue light.

In some exemplary embodiments, the length of the first group of conductive lines is smaller than a length boundary-dividing value, and the length of the second group of conductive lines is greater than or equal to the length boundary-dividing value. A ratio of the length boundary-dividing value to a maximum length of the second group of conductive lines is about 0.25 to 0.35.

In another aspect, an embodiment of the present disclosure provides a display apparatus, which includes the aforementioned display substrate.

In some exemplary embodiments, the display apparatus further includes: a photosensitive sensor located at a side of the display substrate, and an orthographic projection of the photosensitive sensor on the display substrate overlaps with a second display region of the display substrate.

In another aspect, an embodiment of the present disclosure further provides a preparation method of a display substrate, which includes: forming multiple second-type pixel circuits in a first display region of a base substrate, and forming multiple second-region light emitting elements in a second display region, wherein the first display region is located at at least one side of the second display region. The multiple second-type pixel circuits include multiple pixel circuits of the first structure and multiple pixel circuits of the second structure; at least one pixel circuit of the multiple pixel circuits of the first structure is connected with at least one second-region light emitting element of the multiple second-region light emitting elements through a first group of conductive lines. At least one pixel circuit of the multiple pixel circuits of the second structure is connected with at least one light emitting element of the multiple second-region light emitting elements through a second group of conductive lines. A length of the second group of conductive lines is greater than a length of the first group of conductive lines.

After reading and understanding the drawings and the detailed description, other aspects may be understood.

BRIEF DESCRIPTION OF DRAWINGS

The drawings provide a further understanding to the technical solutions of the present disclosure, form a part of the specification, and are adopted to explain, together with the embodiments of the present disclosure, the technical solutions of the present disclosure and not intended to form limits to the technical solutions of the present disclosure. The shapes and sizes of one or more components in the drawings do not reflect the true scale, and are only intended to schematically describe the contents of the present disclosure.

FIG. 3 is a schematic diagram of another structure of a display substrate according to at least one embodiment of the present disclosure;

FIG. 4A to FIG. 4F are schematic partial plan views of a display substrate according to at least one embodiment of the present disclosure;

DETAILED DESCRIPTION

Figure 1A:
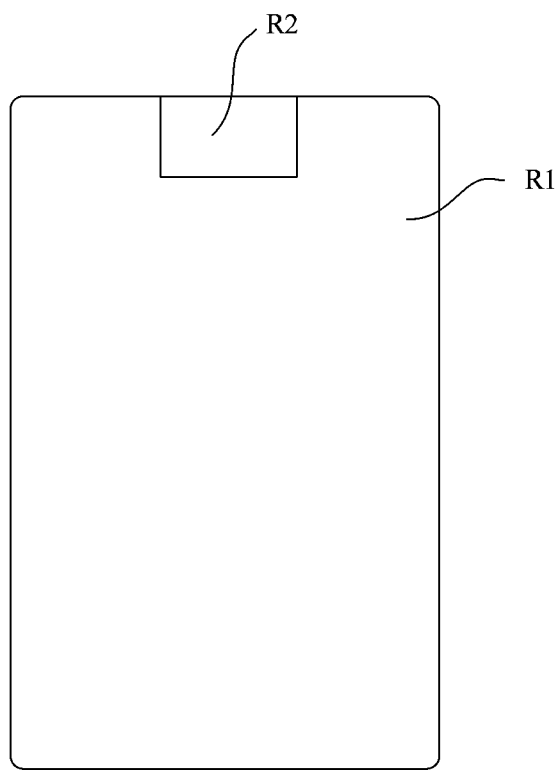
FIG. 1A is a schematic diagram of a display substrate according to at least one embodiment of the present disclosure.

The embodiments of the present disclosure will be described below in combination with the drawings in detail. The embodiments may be implemented in various forms. Those of ordinary skill in the art may easily understand such a fact that manners and contents may be transformed into other forms without departing from the purpose and scope of the present disclosure. Therefore, the present disclosure should not be explained as being limited to the contents recorded in the following implementations only. The embodiments in the present disclosure and features in the embodiments may be combined with each other arbitrarily in a case of no conflict.

In the drawings, the size/sizes of one or more constituent elements, the thicknesses of layers, or regions are exaggerated sometimes for clarity. Therefore, a mode of the present disclosure is not necessarily limited to the size shown, and the shape and size of one or more components in the drawings do not reflect true proportions. In addition, the drawings schematically illustrate ideal examples, and a mode of the present disclosure is not limited to the shapes, numerical values, or the like shown in the drawings.

"First", "second", "third" and other ordinal numerals in this specification are set to avoid the confusion of the constituent elements, rather than to limit the quantity. In the present disclosure, "multiple" represents two or more than two.

For convenience, in this specification, the terms such as "middle", "up", "down", "front", "back", "vertical", "horizontal", "top", "bottom", "inside" and "outside" indicating the orientation or position relationship are used to describe the position relationship between the constituent elements with reference to the drawings, only for the convenience of describing this specification and simplifying the description, instead of indicating or implying that the apparatus or element referred to must have a specific orientation or be constructed and operated in a specific orientation, so they should not be understood as limitations to the present disclosure. The positional relationships between the constituent elements may be changed as appropriate according to the direction where the constituent elements are described. Therefore, appropriate replacements based on situations are allowed, not limited to the expressions in this specification.

Unless otherwise specified and limited, in this specification the terms "mount", "connected" and "connect" should be understood in a broad sense. For example, it may be fixed connection, detachable connection or integrated connection, may be mechanical connection or connection, or may be direct connection, indirect connection through intermediate components, or communication inside two components. For those of skill in the art, the meanings of the above terms in the present disclosure may be understood according to the situation.

In this specification, a transistor refers to a element which at least includes three terminals, i.e., a gate electrode, a drain electrode, and a source electrode. The transistor has a channel region between the drain electrode (drain electrode terminal, drain region, or drain electrode) and the source electrode (source electrode terminal, source region, or source electrode), and a current can flow through the drain electrode, the channel region, and the source electrode. In this specification, the channel region refers to a region which the current mainly flows through.

In this specification, a first electrode may be a drain electrode and a second electrode may be a source electrode, or, a first electrode may be a source electrode and a second electrode may be a drain electrode. In a case that transistors with opposite polarities are used, or in a case that a direction of a current changes during work of a circuit, or the like, functions of the "source electrode" and the "drain electrode" may sometimes be exchanged. Therefore, the "source electrode" and the "drain electrode" may be exchanged in this specification.

In this specification, "connection" includes connection of constituent elements through an element with a certain electric action. "The element with the certain electric action" is not particularly limited as long as electric signals between the connected constituent elements may be sent and received. Examples of "the element with the certain electric action" not only include an electrode and a wiring, but further include a switch element such as a transistor, a resistor, an inductor, a capacitor, another element with various functions, etc.

In this specification, "parallel" refers to a state in which an angle formed by two straight lines is more than −10° and smaller than 10°. Thereby, it also includes a state in which an angle is more than −5° and smaller than 5°. In addition, "vertical" refers to a state in which an angle formed by two straight lines is more than 80° and smaller than 100°. Therefore, it also includes a state in which an angle is more than 85° and smaller than 95°.

In the present disclosure, "about" refers to that a boundary is defined not so strictly and numerical values in process and measurement error ranges are allowed.

With development of display technologies, existing designs of a bangs or water drop screen are gradually unable to meet a user's demand for a high screen-to-body ratio of a display apparatus, and a series of display apparatuses with a light-transmitting display region have emerged as the times require. In this type of display apparatus, hardware such as a photosensitive sensor (such as a camera) may be disposed in the light-transmitting display region. Since there is no need to punch a hole, under a premise of ensuring practicability of the display apparatus, it is possible to achieve a true full screen.

An embodiment of the present disclosure provides a display substrate, which includes a base substrate with a first display region and a second display region, multiple second-region light emitting elements located in the second display region, and multiple second-type pixel circuits located in the first display region. The first display region is located at at least one side of the second display region. The multiple second-type pixel circuits include multiple pixel circuits of a first structure and multiple pixel circuits of a second structure. At least one pixel circuit of the multiple pixel circuits of the first structure is connected with at least one light emitting element of the multiple second-region light emitting elements through a first group of conductive lines. At least one pixel circuit of the multiple pixel circuits of the second structure is connected with at least one light emitting element of the multiple second-region light emitting elements through a second group of conductive lines. A length of the second group of conductive lines is greater than a length of the first group of conductive lines.

In some exemplary embodiments, the first display region may be a non-light-transmitting display region and the second display region may be a light-transmitting display region. Disposing a pixel circuit for driving a light emitting element in the second display region in the first display region instead of the second display region may ensure that a light transmittance of the second display region is better.

According to the display substrate provided by the embodiment of the present disclosure, poor display caused by a difference in lengths of conductive lines may be reduced or eliminated by adjusting a structure of a second-type pixel circuit. That is, a length of a conductive line connecting the second-region light emitting element and the second-type pixel circuit is considered when a second-type pixel circuit connected with a second-region light emitting element is designed.

In some exemplary embodiments, the pixel circuit of the first structure is connected with a first initial signal line, and the pixel circuit of the second structure is connected with a first initial signal line and a second initial signal line. The first initial signal line and the second initial signal line provide different initial signals. In this example, a design of a single initial signal is adopted for the pixel circuit of the first structure, and a design of double initial signals is adopted for the pixel circuit of the second structure.

In some exemplary embodiments, the display substrate further includes multiple first-region light emitting elements and multiple first-type pixel circuits located in the first display region. At least one first-type pixel circuit of the multiple first-type pixel circuits is connected with at least one first-region light emitting element of the multiple first-region light emitting elements, and an orthographic projection of the at least one first-type pixel circuit on the base substrate at least partially overlaps with an orthographic projection of the at least one first-region light emitting element on the base substrate. The multiple first-type pixel circuits are all pixel circuits of the first structure.

In some exemplary embodiments, the pixel circuit of the first structure includes a drive transistor, a first reset transistor, and a second reset transistor. A gate electrode of the first reset transistor is connected with a first reset control line, a first electrode of the first reset transistor is connected with a gate electrode of the drive transistor, and a second electrode of the first reset transistor is connected with the first initial signal line. A gate electrode of the second reset transistor is connected with the second reset control line, a first electrode of the second reset transistor is connected with a first electrode of a light emitting element, and a second electrode of the second reset transistor is connected with the first initial signal line. In this example, a design of a single initial signal may be adopted for the pixel circuit of the first structure.

In some exemplary embodiments, the pixel circuit of the second structure includes a drive transistor, a first reset transistor, and a second reset transistor. A gate electrode of the first reset transistor is connected with a first reset control line, a first electrode of the first reset transistor is connected with a gate electrode of the drive transistor, and a second electrode of the first reset transistor is connected with the first initial signal line. A gate electrode of the second reset transistor is connected with the second reset control line, a first electrode of the second reset transistor is connected with a first electrode of a light emitting element, and a second electrode of the second reset transistor is connected with a second initial signal line. A second initial signal provided by the second initial signal line is different from a first initial signal provided by the first initial signal line. In this example, a design of two initial signals may be adopted for the pixel circuit of the second structure.

In some exemplary embodiments, the first initial signal provided by the first initial signal line is a constant voltage signal. For example, the first initial signal may be about −3V. However, this embodiment is not limited thereto.

In some exemplary embodiments, the second initial signal provided by the second initial signal line may be a constant voltage signal, and the second initial signal may be larger than the first initial signal provided by the first initial signal line. For example, the first initial signal may be about −3.0V, and the second initial signal may be about −2.0V, −1.5V, −1.0V, or −0.5V. However, this embodiment is not limited thereto.

In some exemplary embodiments, a magnitude of the second initial signal provided by the second initial signal line with which the pixel circuit of the second structure is connected is proportional to the length of the second group of conductive lines with which the pixel circuit of the second structure is connected. In this example, the longer the length of the second group of conductive lines connected with the pixel circuit of the second structure is, the larger the second initial signal provided by the second initial signal line connected with the pixel circuit of the second structure has. However, this embodiment is not limited thereto.

In some exemplary embodiments, the pixel circuit of the first structure or the pixel circuit of the second structure may further include a data writing transistor, a threshold compensation transistor, a first light emitting control transistor, and a second light emitting control transistor. A gate electrode of the data writing transistor is connected with a scan line, a first electrode of the data writing transistor is connected with a data line, and a second electrode of the data writing transistor is connected with a first electrode of the drive transistor. A gate electrode of the threshold compensation transistor is connected with the scan line, a first electrode of the threshold compensation transistor is connected with the gate electrode of the drive transistor, and a second electrode of the threshold compensation transistor is connected with a second electrode of the drive transistor. A gate electrode of the first light emitting control transistor is connected with a light emitting control line, a first electrode of the first light emitting control transistor is connected with a first power supply line, and a second electrode of the first light emitting control transistor is connected with the first electrode of the drive transistor. A gate electrode of the second light emitting control transistor is connected with a light emitting control line, a first electrode of the second light emitting control transistor is connected with the second electrode of the drive transistor, and a second electrode of the second light emitting control transistor is connected with the first electrode of the light emitting element. In this example, the pixel circuit of the first structure and the pixel circuit of the second structure may both have a 7T1C structure, that is, they include 7 transistors and one capacitor. However, this embodiment is not limited thereto. For example, the pixel circuit of the first structure and the pixel circuit of the second structure may include other numbers of transistors and capacitors.

In some exemplary embodiments, in a plane perpendicular to the display substrate, the display substrate at least includes a semiconductor layer, a first conductive layer, a second conductive layer, and a third conductive layer disposed on the base substrate. The semiconductor layer at least includes active layers of multiple transistors. The first conductive layer at least includes gate electrodes of the multiple transistors and a first electrode of a storage capacitor, the scan line, the light emitting control line, the first reset control line, and the second reset control line. The second conductive layer at least includes a second electrode of the storage capacitor, the first initial signal line, and the second initial signal line. The second conductive layer at least includes first and second electrodes of the multiple transistors, the first power supply line, and the data line.

In some exemplary embodiments, active layers of the first reset transistor and the second reset transistor of the pixel circuit of the first structure may have an integrated structure; an active layer of a second reset transistor of a pixel circuit of a first structure of a n-th row and an active layer of a first reset transistor of a pixel circuit of a first structure in a (n+1)-th row may have an integrated structure, and n is a positive integer.

In some exemplary embodiments, active layers of the first reset transistor and the second reset transistor of the pixel circuit of the second structure have an integrated structure; an active layer of a second reset transistor of a pixel circuit of a second structure in a n-th row is not connected with an active layer of a first reset transistor of a pixel circuit of a second structure in a (n+1)-th row, and n is a positive integer.

In some exemplary embodiments, the third conductive layer includes the second electrode of the second reset transistor of the pixel circuit of the second structure and the second electrode of the second reset transistor of the pixel circuit of the first structure. The second electrode of the second reset transistor of the pixel circuit of the second structure is connected with the second initial signal line through a via. The second electrode of the second reset transistor of the pixel circuit of the first structure is not connected with the second initial signal line.

In some exemplary embodiments, the first group of conductive lines and the second group of conductive lines are made of a transparent conductive material, such as Indium Tin Oxide (ITO) and Indium Zinc Oxide (IZO).

In some exemplary embodiments, multiple second-type pixel circuits are distributed among multiple first-type pixel circuits at intervals.

In some exemplary embodiments, among multiple first-type pixel circuits and multiple second-type pixel circuits, a size of any pixel circuit in a first direction is smaller than a size of the first-region light emitting element in the first direction. For example, a difference between the size of the first-region light emitting element in the first direction and the size of any pixel circuit in the first direction may be about 4 microns. However, this embodiment is not limited thereto.

In some exemplary embodiments, the multiple second-region light emitting elements include multiple groups of second-region light emitting elements, second-region light emitting elements in each group are arranged along the first direction, and the multiple groups of second-region light emitting elements are arranged along a second direction. The multiple second-type pixel circuits include multiple groups of second-type pixel circuits, second-type pixel circuits in each group are arranged along the first direction, and the multiple groups of second-type pixel circuits are arranged along the second direction. The multiple second-region light emitting elements at least include multiple first light emitting elements, multiple second light emitting elements, and multiple third light emitting elements. The multiple second-type pixel circuits include multiple first pixel circuits, multiple second pixel circuits, and multiple third pixel circuits. The multiple first light emitting elements are connected with the multiple first pixel circuits, the multiple second light emitting elements are connected with the multiple second pixel circuits, and the multiple third light emitting elements are connected with the multiple third pixel circuits. In at least one group of second-region light emitting elements and at least one group of second-type pixel circuits, multiple first pixel circuits connected with multiple first light emitting elements are closer to the second display region than each of multiple second pixel circuits connected with multiple second light emitting elements and closer to the second display region than each of multiple third pixel circuits connected with multiple third light emitting elements.

In some exemplary embodiments, a second pixel circuit connected with a second light emitting element through the second group of conductive lines is a pixel circuit of the second structure, a third pixel circuit connected with a third light emitting element through the second group of conductive lines is a pixel circuit of the second structure, a first pixel circuit connected with a first light emitting element through the first group of conductive lines is a pixel circuit of the first structure, and a first pixel circuit connected with a first light emitting element through the second group of conductive lines is a pixel circuit of the second structure. However, this embodiment is not limited thereto.

In some exemplary embodiments, the first light emitting element is configured to emit green light, one of the second light emitting element and the third light emitting element is configured to emit red light, and the other of the second light emitting element and the third light emitting element is configured to emit blue light. However, this embodiment is not limited thereto.

In some exemplary embodiments, the length of the first group of conductive lines is smaller than a length boundary-dividing value, and the length of the second group of conductive lines is greater than or equal to the length boundary-dividing value. A ratio of the length boundary-dividing value to a maximum length of the second group of conductive lines is about 0.25 to 0.35. For example, the maximum length of the second group of conductive lines is about 10000 microns, and the length boundary-dividing value is about 3000 microns. However, this embodiment is not limited thereto. Lengths of the first group of conductive lines and the second group of conductive lines will change with a size of the display substrate.

Solutions of the embodiments will be described below through some examples.

Figure 1B:
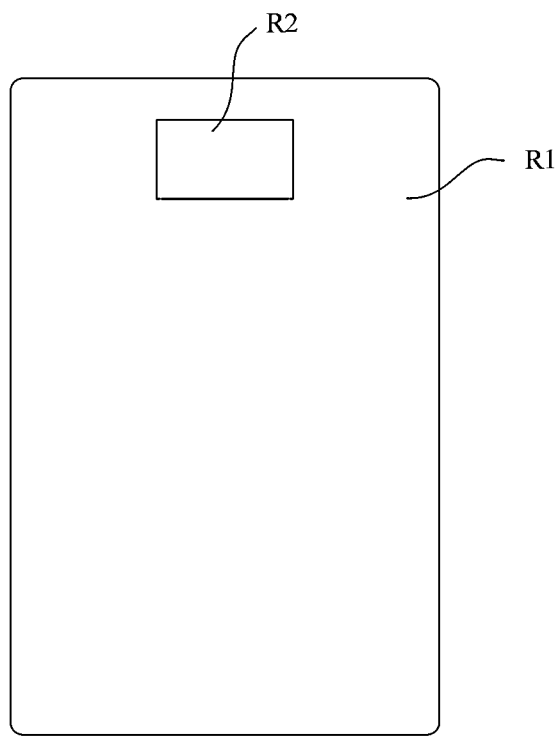
FIG. 1B is another schematic diagram of a display substrate according to at least one embodiment of the present disclosure.

FIG. 1A is a schematic diagram of a display substrate according to at least one embodiment of the present disclosure. FIG. 1B is another schematic diagram of a display substrate according to at least one embodiment of the present disclosure.

In some exemplary embodiments, a display substrate includes a first display region R1 and a second display region R2, and the first display region R1 may be located at at least one side of the second display region R2. In some examples, the first display region R1 partially surrounds the second display region R2. For example, as shown in FIG. 1A, the second display region R2 is located in the middle of a top of the display substrate, one side of the second display region R2 is adjacent to a peripheral region, and the other three sides are surrounded by the first display region R1. However, this embodiment is not limited thereto. For example, the second display region R2 may be located at another position such as an upper left corner position or an upper right corner position of the display substrate.

In some exemplary embodiments, as shown in FIG. 1B, the first display region R1 may surround the second display region R2. Among them, the second display region R2 may be located in the middle of an upper half of the display substrate. However, this embodiment is not limited thereto. A disposing position of the second display region R2 may be determined as required.

In some exemplary embodiments, as shown in FIG. 1A and FIG. 1B, the first display region R1 and the second display region R2 may both be rectangles, for example, rectangles with rounded corners. However, this embodiment is not limited thereto. For example, the first display region R1 may have another shape such as a circle or an ellipse, and the second display region R2 may have another shape such as a circle, a quadrilateral, or a pentagon. For example, shapes of the first display region R1 and the second display region R2 may be the same or different.

In some exemplary embodiments, the second display region R2 may be a light-transmitting display region. For example, an orthographic projection of hardware such as a photosensitive sensor (such as a camera) on the display substrate may be located within the second display region R2 of the display substrate. In this example, the display substrate does not need to be punched, and under a premise of ensuring practicability of the display substrate, it is possible to achieve a true full screen.

In some exemplary embodiments, the display substrate may include multiple sub-pixels disposed on a base substrate, and at least one sub-pixel includes a pixel circuit and a light emitting element. The pixel circuit is configured to drive the light emitting element. For example, the pixel circuit is configured to provide a drive current to drive the light emitting element to emit light. For example, the light emitting element may be an Organic Light Emitting Diode (OLED), and the light emitting element emits red light, green light, blue light, or white light, etc. under drive of its corresponding pixel circuit. A light emitting color of the light emitting element may be determined as required.

In some exemplary embodiments, in order to improve a light transmittance of the second display region R2, it is possible to dispose only a light emitting element in the second display region R2, and arrange a pixel circuit for driving the light emitting element of the second display region R2 in the first display region R1. That is, the light transmittance of the second display region R2 is improved by separately disposing the light emitting element and the pixel circuit. In this example, in the second display region R2, no pixel circuit is provided.

Figure 2:
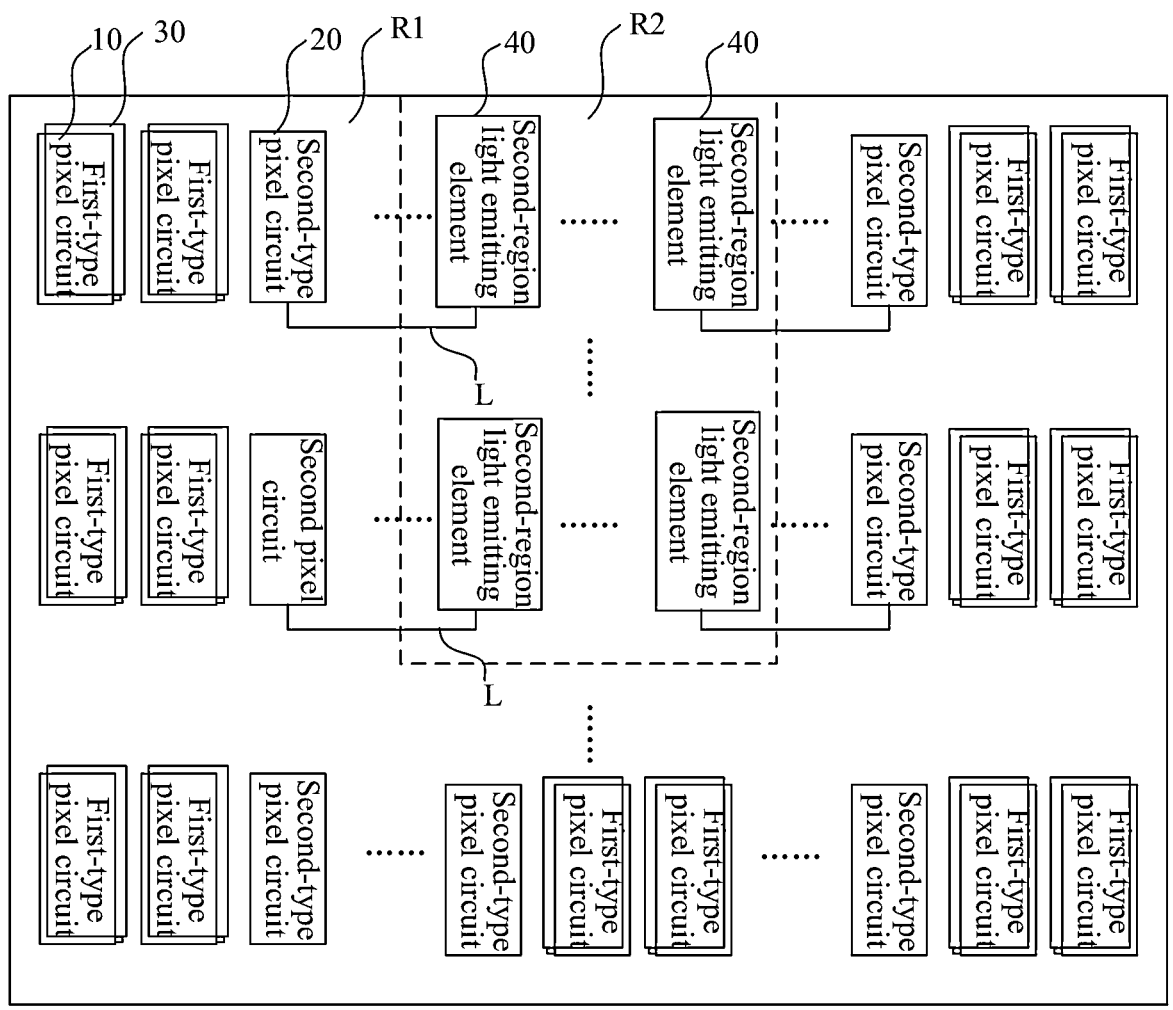
FIG. 2 is a schematic diagram of a structure of a display substrate according to at least one embodiment of the present disclosure.

FIG. 2 is a schematic diagram of a structure of a display substrate according to at least one embodiment of the present disclosure. In some exemplary embodiments, as shown in FIG. 2, a display substrate includes multiple first-type pixel circuits 10, multiple second-type pixel circuits 20, and multiple first-region light emitting elements 30 located in a first display region R1, and multiple second-region light emitting elements 40 located in a second display region R2. The multiple second-type pixel circuits 20 may be distributed among multiple first-type pixel circuits 10 at intervals. At least one first-type pixel circuit 10 among the multiple first-type pixel circuits 10 may be connected with at least one first-region light emitting element 30 among the multiple first-region light emitting elements 30, and an orthographic projection of at least one first-type pixel circuit 10 on a base substrate may at least partially overlap with an orthographic projection of at least one first-region light emitting element 30 on the base substrate. The at least one first-type pixel circuit 10 may be configured to provide a drive signal to a first-region light emitting element 30 connected thereto to drive the first-region light emitting element 30 to emit light. At least one second-type pixel circuit 20 of the multiple second-type pixel circuits 20 may be connected with at least one second-region light emitting element 40 of the multiple second-region light emitting elements 40 through a conductive line L, and the at least one second-type pixel circuit 20 may be configured to provide a drive signal to a second-region light emitting element 40 connected thereto to drive the second-region light emitting element 40 to emit light. Since a second-region light emitting element 40 and a second-type pixel circuit 20 are located in different regions, there is no overlap between an orthographic projection of at least one second-type pixel circuit 20 on the base substrate and an orthographic projection of at least one second-region light emitting element 40 on the base substrate.

In this exemplary embodiment, the first display region R1 may be set as a non-light-transmitting display region, and the second display region R2 may be set as a light-transmitting display region. That is, in this exemplary embodiment, the first display region R1 is non-transmissive and the second display region R2 is transmissive. Therefore, there is no need to drill a hole on the display substrate, and a required hardware structure such as a photosensitive sensor may be directly disposed in the second display region R2, which lays a solid foundation for achievement of a true full screen. In addition, since only a light emitting element is included in the second display region R2, and no pixel circuit is included, it is also possible to ensure that a light transmittance of the second display region R2 is better.

In this exemplary embodiment, the first-region light emitting element 30 may be referred to as an in-situ light emitting element, the first-type pixel circuit 10 may be referred to as an in-situ pixel circuit, and the second-type pixel circuit 20 may be referred to as an non-in-situ pixel circuit.

In some exemplary embodiments, as shown in FIG. 2, the second-region light emitting element 40 and the second-type pixel circuit 20 connected with the second-region light emitting element 40 are located in a same row. That is, a light emitting signal of the second-region light emitting elements 40 comes from the second-type pixel circuits 20 in the same row. For example, a pixel circuit of sub-pixels in a same row is connected with a same gate line.

In some exemplary embodiments, as shown in FIG. 2, the second-type pixel circuit 20 is connected with the second-region light emitting element 40 through the conductive line L. For example, the conductive line L may be made of a transparent conductive material. For example, the conductive line L may be made of a conductive oxide material. For example, the conductive oxide material may include Indium Tin Oxide (ITO), but is not limited thereto. One end of the conductive line L is connected with the second-type pixel circuit 20, and the other end of the conductive line L is connected with the second-region light emitting element 40. As shown in FIG. 2, the conductive line L extends from the first display region R1 to the second display region R2.

FIG. 3 is schematic diagram of another structure of a display substrate according to at least one embodiment of the present disclosure. In some exemplary embodiments, as shown in FIG. 3, a first display region R1 includes not only multiple pixel units, but also multiple columns of second-type pixel circuits, and a second display region R2 only includes multiple second-region light emitting elements. In this example, at least one pixel unit may include one red sub-pixel R, two green sub-pixels G1 and G2, and one blue sub-pixel B, and the red sub-pixel R and the blue sub-pixel B are located in a same column, and the two green sub-pixels G1 and G2 are located in a same column. However, this embodiment is not limited thereto. In some examples, a pixel unit may also include other colors and other numbers of sub-pixels, and an arrangement of multiple sub-pixels is not limited to the structure shown in FIG. 3.

For example, a pixel unit may include three sub-pixels (for example, a red sub-pixel R, a blue sub-pixel B, and a green sub-pixel G), and the three sub-pixels may be arranged horizontally, vertically, or in a form of triangle. For example, a pixel unit may include four sub-pixels (a red sub-pixel R, a blue sub-pixel B, a green sub-pixel G, and a white sub-pixel), and the four sub-pixels may be arranged horizontally, vertically, or in a square manner. However, the present disclosure is not limited thereto.

Figure 4B:
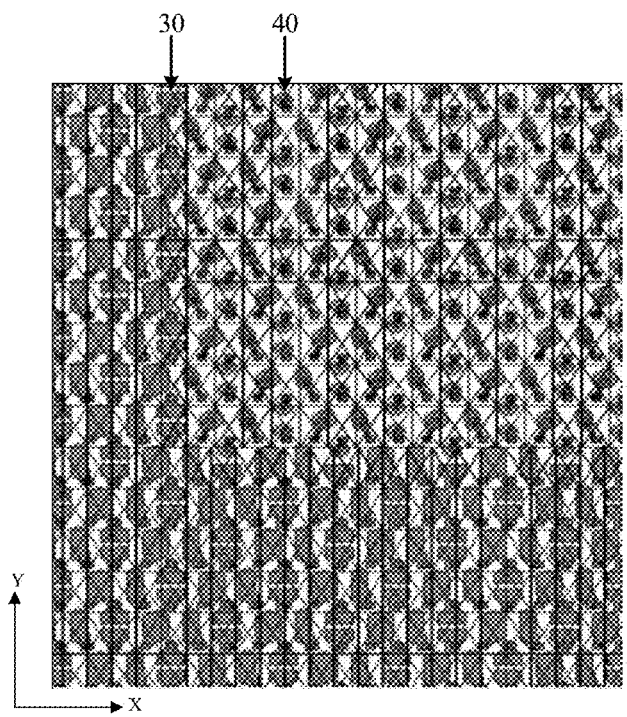
Figure 4C:
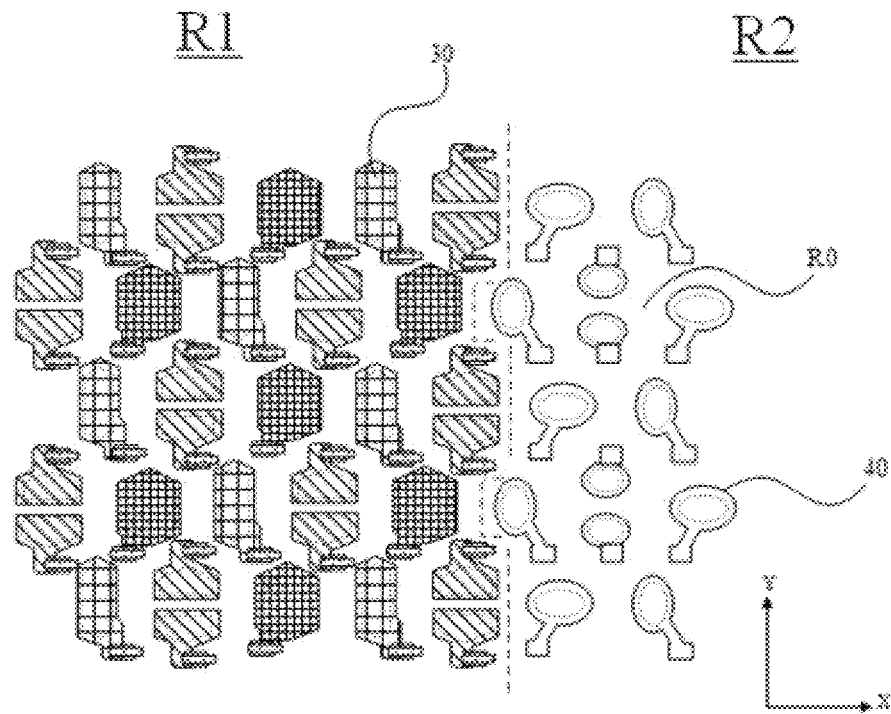

FIG. 4A to FIG. 4C are schematic partial plan views of a display substrate according to at least one embodiment of the present disclosure. In some exemplary embodiments, as shown in FIG. 4A, a second display region R2 is a light-transmitting display region and a first display region R1 is a non-light-transmitting display region. As shown in FIG. 4A and FIG. 4B, a density of second-region light emitting elements 40 of the second display region R2 may be approximately equal to a density of first-region light emitting elements 30 of the first display region R1. That is, a resolution of the second display region R2 may be approximately the same as that of the first display region R1. However, this embodiment is not limited thereto. For example, a density of the second-region light emitting elements 40 may be larger or smaller than that of the first-region light emitting elements 30. That is, the resolution of the second display region R2 may be larger or smaller than that of the first display region R1. As shown in FIG. 4B and FIG. 4C, a light emitting area of a second-region light emitting element 40 is smaller than that of a first-region light emitting element 30. That is, the light emitting area of the first-region light emitting element 30 is larger than that of the second-region light emitting element 40. The light emitting area of the second-region light emitting element 40 and the light emitting area of the first-region light emitting element 30 are shown by dotted lines in FIG. 4C. For example, a light emitting area of a light emitting element may correspond to an area of an opening of a pixel definition layer.

In some exemplary embodiments, as shown in FIG. 4C, in the second display region R2, a light-transmitting region R0 is disposed between adjacent second-region light emitting elements 40. For example, multiple light-transmitting regions R0 are connected with each other to form a continuous light-transmitting region separated by multiple second-region light emitting elements 40. A conductive line L may be made of a transparent conductive material to improve a light transmittance of the light-transmitting region R0 as much as possible. As shown in FIG. 4C, all regions in the second display region R2, except for regions where the second-region light emitting elements 40 are disposed, may all be light-transmitting regions.

Figure 4D:
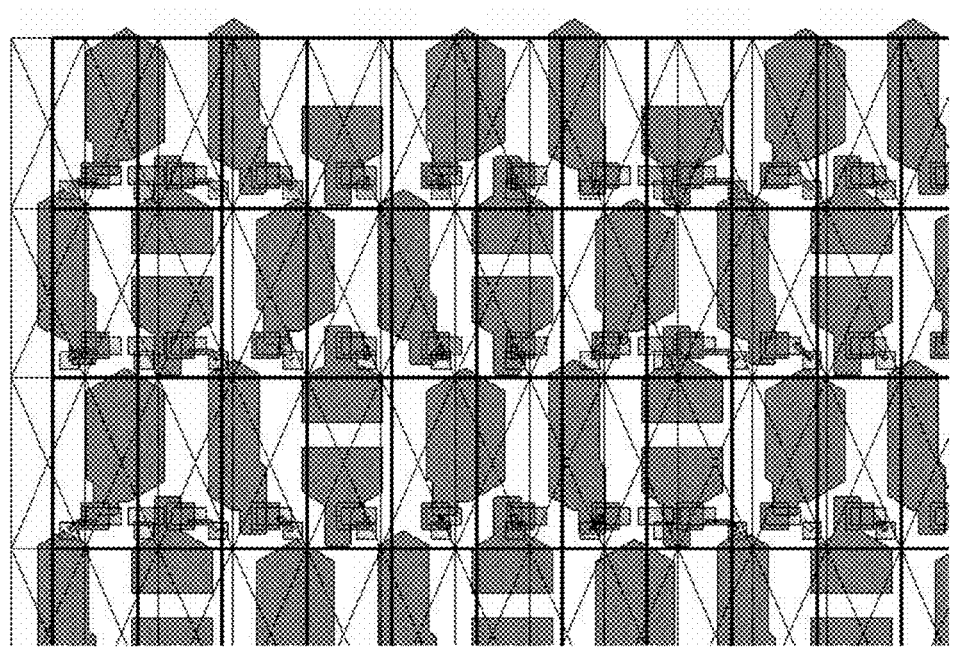

In some exemplary embodiments, as shown in FIG. 4B and FIG. 4D, in the first display region R1, a region where a second-type pixel circuit 20 is disposed may be obtained by reducing a size of a first-type pixel circuit 10 in a first direction X. For example, the size of the first-type pixel circuit 10 in the first direction X may be smaller than a size of a first-region light emitting element 30 in the first direction X. The first direction X is, for example, a row direction, but it is not limited to this. In other embodiments, the first direction X may be a column direction. This exemplary embodiment will be described taking the first direction X as the row direction as an example. For example, sizes of the first-type pixel circuit 10 and the second-type pixel circuit 20 in the first direction X may be the same, and a size of each pixel circuit in the first direction X may differ from the size of the first-region light emitting element in the first direction X by about 4 microns (μm). A size of each pixel circuit in a second direction Y is approximately the same as that of the first-region light emitting element 30 in the second direction Y. The first direction X is perpendicular to the second direction Y.

Figure 4E:
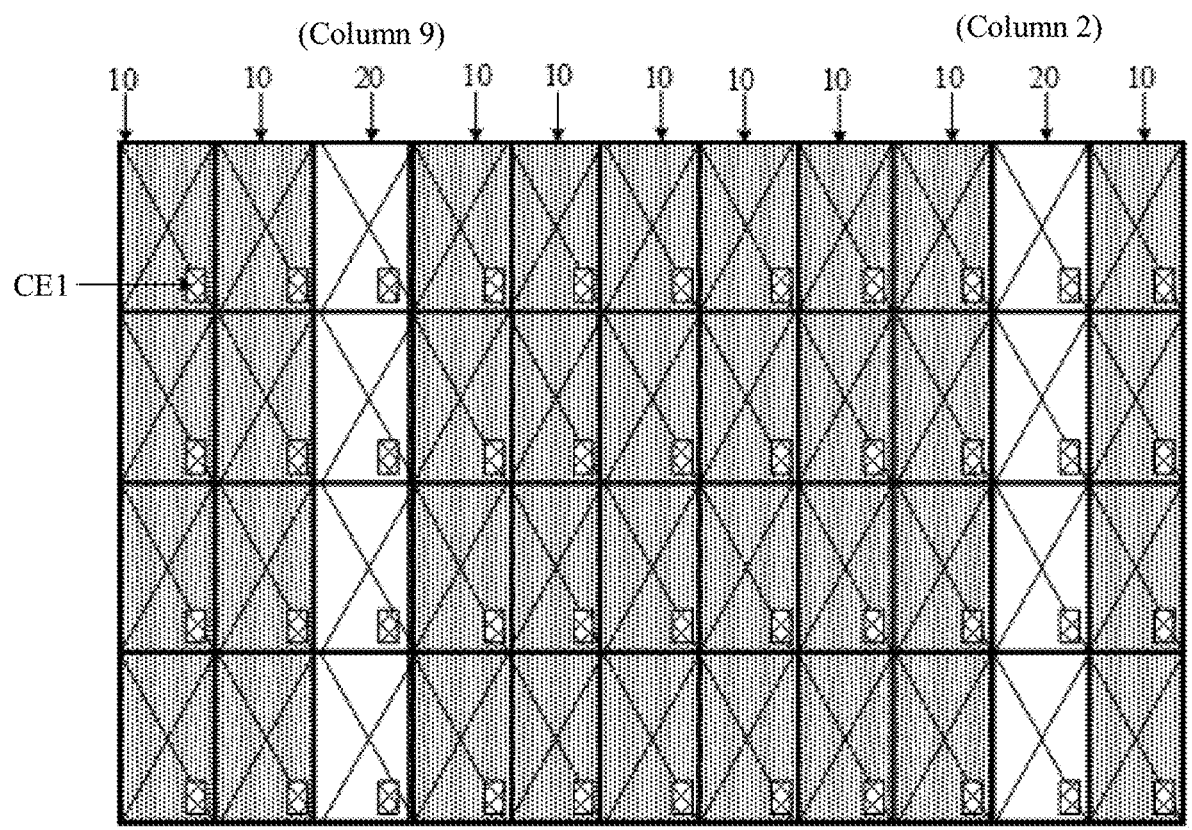
Figure 4F:
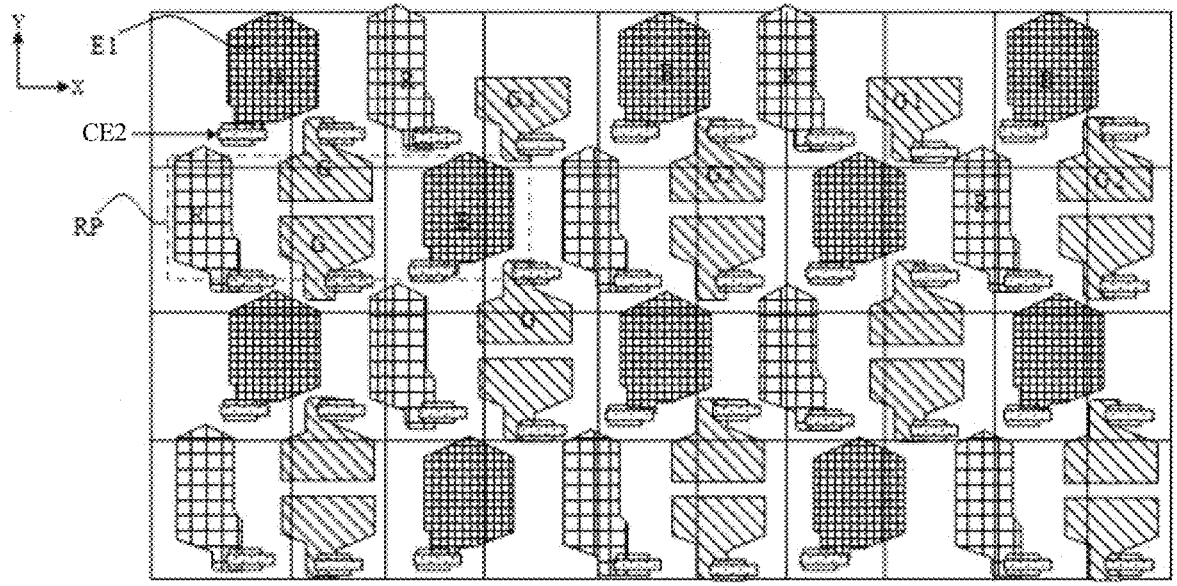

FIG. 4D to FIG. 4F are schematic diagrams of a partial structure of a display substrate according to at least one embodiment of the present disclosure. In order to further show that there are extra more columns of pixel circuits after the pixel circuits are compressed, FIG. 4D shows a schematic diagram of a structure of a first-region light emitting element of the first display region R1. FIG. 4E shows a schematic diagram of a partial structure (including only pixel circuits) of the first display region R1 in FIG. 4A, and FIG. 4F shows a schematic diagram of a partial structure (including only light emitting elements) of the first display region R1 in FIG. 4A.

In some exemplary embodiments, as shown in FIG. 4D to FIG. 4F, a size of a pixel circuit in the first direction X is smaller than that of a light emitting element in the first direction X, so that pixel circuits in second and ninth columns from right to left are not connected with any first-region light emitting element 30, and belong to extra columns of pixel circuits, which may be used as second-type pixel circuits 20 to connect with second-region light emitting elements in the second display region R2. As shown in FIG. 4E and FIG. 4F, any first-region light emitting element 30 may be one of four types of light emitting elements RG1BG2. A first electrode E1 of a first-region light emitting element 30 may be connected with a first transit electrode CE1 of a first-type pixel circuit 10 through a second transit electrode CE2. R represents a light emitting element that emits red light, G1 represents a light emitting element that emits green light, B represents a light emitting element that emits blue light, and G2 represents a light emitting element that emits green light. At least one second-type pixel circuit may have a first transit electrode, and at least one second-region light emitting element 40 may have a second transit electrode. For example, the connection of at least one second-type pixel circuit 20 and at least one second-region light emitting element 40 through the conductive lines L may include that the conductive lines L are respectively connected with a first transit electrode of at least one second-type pixel circuit 20 and a second transit electrode of at least one second-region light emitting element 40. In order to have enough space for disposing the conductive line L, axes of first and second transit electrodes in a same row of sub-pixels may be located on a straight line. However, this embodiment is not limited thereto.

In some exemplary embodiments, as shown in FIG. 4F, G includes G1 or G2. In a pixel arrangement shown in FIG. 4F, one repeating unit RP includes two Gs arranged in a second direction Y and R and B respectively arranged on both sides of the two Gs in a first direction X, wherein R and G constitute a pixel, and a virtual pixel for display with B from another repeating unit adjacent to it, B and G constitute a pixel, and a virtual pixel for display with R from another repeating unit adjacent to it. However, this embodiment is not limited thereto.

Figure 5A:
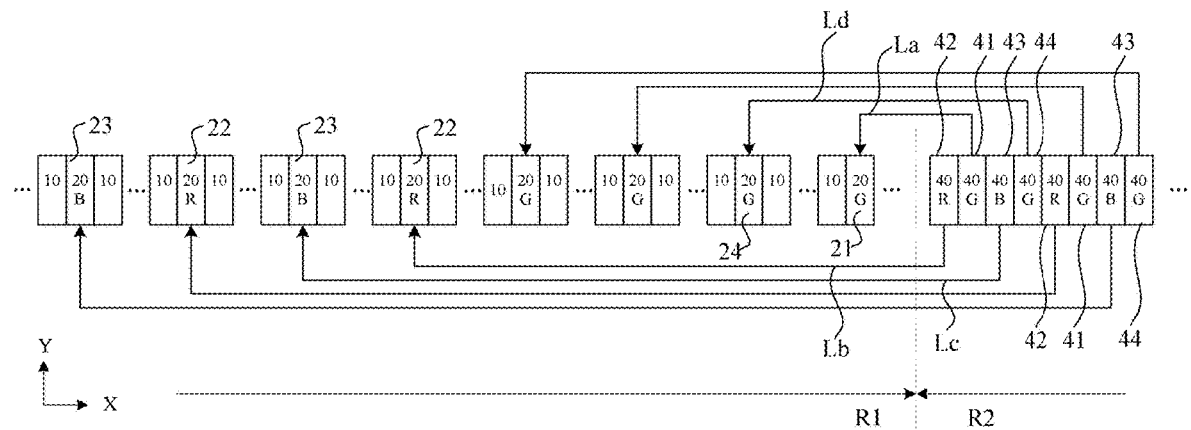
FIG. 5A is a partial schematic diagram of a row of light emitting elements located in a second display region and second-type pixel circuits connected thereto of a display substrate according to at least one embodiment of the present disclosure.
Figure 5B:
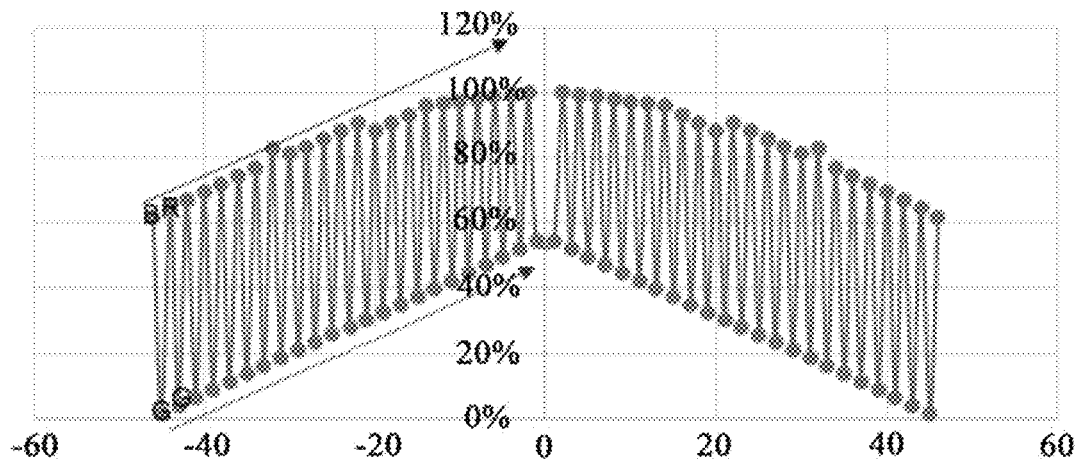
FIG. 5B is a schematic diagram of capacitances of light emitting elements emitting different colors of light in a same row of light emitting elements located in a second display region of a display substrate according to at least one embodiment of the present disclosure.

FIG. 5A is a partial schematic diagram of a row of light emitting elements located in a second display region and second-type pixel circuits connected thereto of a display substrate according to at least one embodiment of the present disclosure. FIG. 5B is a schematic diagram of capacitances of light emitting elements emitting different colors of light in a same row of light emitting elements in a second display region of a display substrate according to at least one embodiment of the present disclosure. In some exemplary embodiments, a second display region R2 is symmetrical about a central axis in a first direction X. FIG. 5A only illustrates a connection relationship between a row of light emitting elements in a left half of the second display region R2 and second-type pixel circuits in a first display region R1.

In some exemplary embodiments, as shown in FIG. 5A, in the second display region R2, multiple second-region light emitting elements 40 includes multiple first light emitting elements 41, multiple second light emitting elements 42, multiple third light emitting elements 43, and multiple fourth light emitting elements 44. A first light emitting element 41 is configured to emit light of a first color, a second light emitting element 42 is configured to emit light of a second color, a third light emitting element 43 is configured to emit light of a third color, and a fourth light emitting element 44 is configured to emit light of a fourth color. In some examples, the light of the first color and the light of the fourth color are both green (G) light, the light of the second color is red (R) light, and the light of the third color is blue (B) light. However, this embodiment is not limited thereto.

In some exemplary embodiments, as shown in FIG. 5A, in the first display region R1, multiple second-type pixel circuits 20 includes multiple first pixel circuits 21, multiple second pixel circuits 22, multiple third pixel circuits 23, and multiple fourth pixel circuits 24. The multiple first light emitting elements 41 are connected with the multiple first pixel circuits 21 through multiple first conductive lines La, the multiple second light emitting elements 42 are connected with the multiple second pixel circuits 22 through multiple second conductive lines Lb, the multiple third light emitting elements 43 are connected with the multiple third pixel circuits 23 through multiple third conductive lines Lc, and the multiple fourth light emitting elements 44 are connected with the multiple fourth pixel circuits 24 through multiple fourth conductive lines Ld. For example, a first light emitting element 41 is connected with a first pixel circuit 21 through a first conductive line La, a second light emitting element 42 is connected with a second pixel circuit 22 through a second conductive line Lb, a third light emitting element 43 is connected with a third pixel circuit 23 through a third conductive line Lc, and a fourth light emitting element 44 is connected with a fourth pixel circuit 24 through a fourth conductive line Ld. However, this embodiment is not limited thereto.

In some exemplary embodiments, at least one of the first conductive line La, the second conductive line Lb, the third conductive line Lc, and the fourth conductive line Ld may be made of a transparent conductive material.

In some exemplary embodiments, the multiple second-region light emitting elements 40 of the second display region R2 includes multiple groups of second-region light emitting elements 40, second-region light emitting elements 40 in each group are arranged along the first direction X, and the multiple groups of second-region light emitting elements 40 are arranged along the second direction Y. The multiple second-type pixel circuits 20 includes multiple groups of second-type pixel circuits 20, second-type pixel circuits 20 in each group are arranged along the first direction X, and the multiple groups of second-type pixel circuits 20 are arranged along the second direction Y. First-type pixel circuits 10 are arranged between the second-type pixel circuits 20 in each group. FIG. 5A illustrates a group of second-region light emitting elements 40 and a group of second-type pixel circuits 20. In this example, the group of second-region light emitting elements 40 may be a row of second-region light emitting elements 40, and the group of second-type pixel circuits 20 may be a row of second-type pixel circuits 20. On an upper side, a lower side, or, both of the upper side and the lower side of a row of second-region light emitting elements 40 shown in FIG. 5A, multiple rows of second-region light emitting elements identical to the row of second-region light emitting elements 40 shown in FIG. 5A are further included.

In the embodiment of the present disclosure, a row of light emitting elements may mean that pixel circuits connected with the row of light emitting elements are all connected with a same gate line (for example, a scan line). A row of pixel circuits may mean that the row of pixel circuits is all connected with a same gate line. A row of sub-pixels may mean that pixel circuits connected with the row of sub-pixels are all connected with a same gate line. However, this embodiment is not limited thereto.

In some exemplary embodiments, as shown in FIG. 5A, in a group of second-region light emitting elements 40 and a group of second-type pixel circuits 20, multiple first pixel circuits 21 connected with multiple first light emitting elements 41 are closer to the second display region R2 than each of multiple second pixel circuits 22 connected with multiple second light emitting elements 42 and closer to the second display region R2 than each of multiple third pixel circuits 23 connected with multiple third light emitting elements 43. Multiple fourth pixel circuits 24 connected with the fourth light emitting elements 44 are closer to the second display region R2 than each of multiple second pixel circuits 22 connected with multiple second light emitting elements 42 and closer to the second display region R2 than each of multiple third pixel circuits 23 connected with multiple third light emitting elements 43. In this example, when a second-type pixel circuit 20 connected with a second-region light emitting element 40 is designed, an order in which G is preferred is adopted, that is, a second-type pixel circuit connected with a light emitting element that emits green light are preferentially arranged near the second display region R2.

In some exemplary embodiments, as shown in FIG. 5A, in at least one group of second-region light emitting elements 40 and at least one group of second-type pixel circuits 20, at least one of multiple first-type pixel circuits 10 is arranged between two adjacent second-type pixel circuits 20. In some examples, in at least one group of second-region light emitting elements 40 and at least one group of second-type pixel circuits 20, there are no other second-type pixel circuit 20 between two first pixel circuits 21 connected with two adjacent first conductive lines La. This arrangement is beneficial to reduce a length of a first conductive line La and a length difference between first conductive lines La.

In some exemplary embodiments, as shown in FIG. 5A, in order to make the second conductive lines Lb have a smaller capacitance difference and the third conductive lines Lc have a smaller capacitance difference, in at least one group of second-region light emitting elements 40 and at least one group of second-type pixel circuits 20, multiple second pixel circuits 22 connected with multiple second conductive lines Lb and multiple third pixel circuits 23 connected with multiple third conductive lines Lc are alternately disposed. However, this embodiment is not limited thereto.

In some exemplary embodiments, as shown in FIG. 5A, in order to make the first conductive lines La have a smaller capacitance difference and the fourth conductive lines Ld have a smaller capacitance difference, in at least one group of second-region light emitting elements and at least one group of second-type pixel circuits, multiple fourth pixel circuits 24 connected with multiple fourth conductive lines Ld and multiple first pixel circuits 21 connected with multiple first conductive lines La are alternately disposed. However, this embodiment is not limited thereto.

In some exemplary embodiments, as shown in FIG. 5B, an abscissa indicates a position of the second display region R2 of the display substrate in the first direction X, and an ordinate indicates a ratio of a capacitance of a conductive line connected with a light emitting element at this position to a total capacitance. As shown in FIG. 5B, a capacitance of a conductive line connected with a light emitting element that emits green light is the smallest, and as shown in a left half of FIG. 5B, capacitances of conductive lines connected with light emitting elements that emit green light show a gradually increasing trend, so that a capacitance difference between two conductive lines connected with adjacent light emitting elements that emit green light is relatively small. Since a structure of the second display region R2 of the display substrate is symmetrically disposed with respect to the first direction X, a right half shown in FIG. 5B will not be described in detail. As shown in FIG. 5B, a capacitance of a conductive line connected with a light emitting element that emits green light is smaller than that of a conductive line connected with a light emitting element that emits red light, and the capacitance of the conductive line connected with the light emitting element that emits green light is smaller than that of a conductive line connected with a light emitting element that emits blue light. As shown in FIG. 5B, capacitances of conductive lines connected with light emitting elements that emit red light show a gradually increasing trend, and capacitances of conductive lines connected with light emitting elements that emit blue light show a gradually increasing trend, and there is little difference between a capacitance of a conductive line connected with a light emitting element that emits red light and a capacitance of a conductive line connected with a light emitting element that emits blue light.

In some exemplary embodiments, the multiple second-type pixel circuits 20 in the first display region R1 include multiple pixel circuits of a first structure and multiple pixel circuits of a second structure. The multiple first-type pixel circuits 10 in the first display region R1 are all pixel circuits of the first structure. In some examples, the pixel circuits of the first structure and the pixel circuits of the second structure may both have a 7T1C structure, that is, they include 7 transistors and one capacitor. However, this embodiment is not limited thereto.

Next, the pixel circuits of the first structure and the pixel circuits of the second structure of this exemplary embodiment will be described in detail.

Figure 6A:
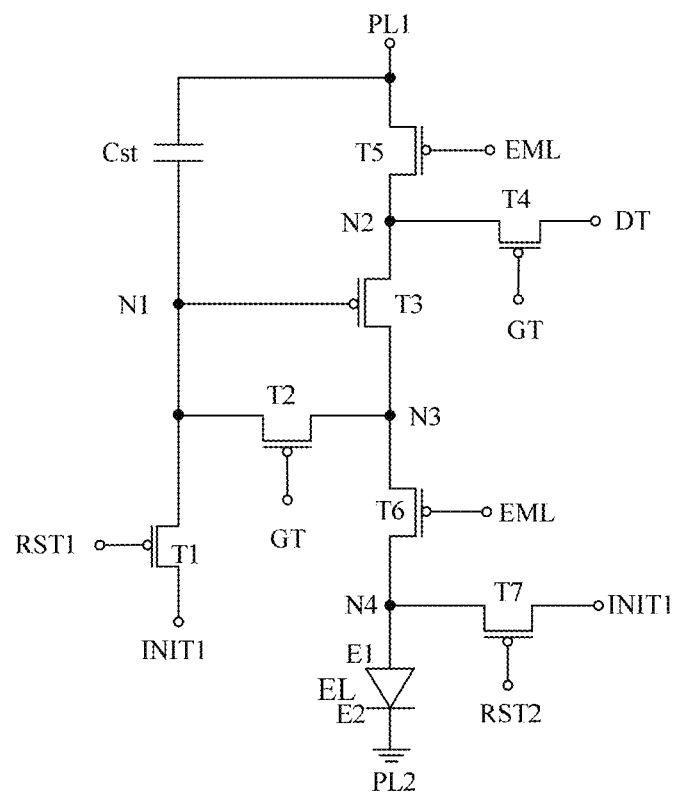
FIG. 6A is a schematic diagram of a pixel circuit of a first structure according to at least one embodiment of the present disclosure.
Figure 6B:
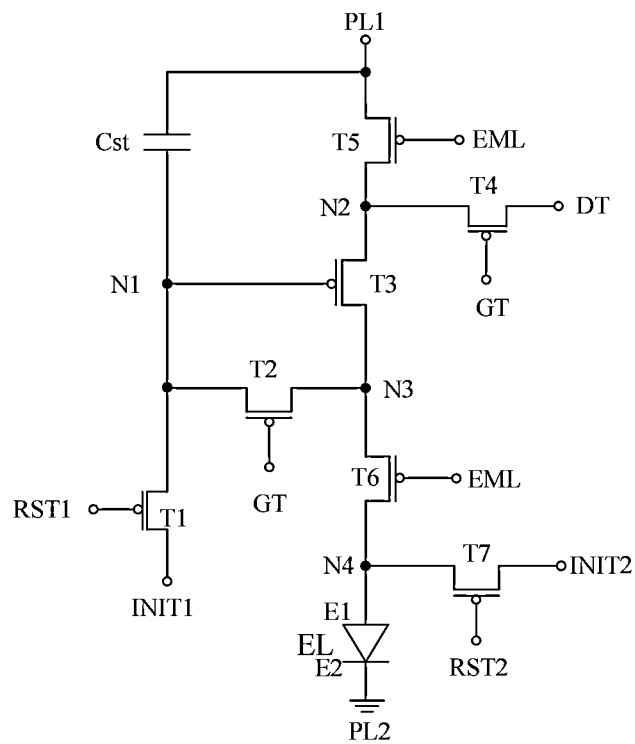
FIG. 6B is a schematic diagram of a pixel circuit of a second structure according to at least one embodiment of the present disclosure.
Figure 6C:
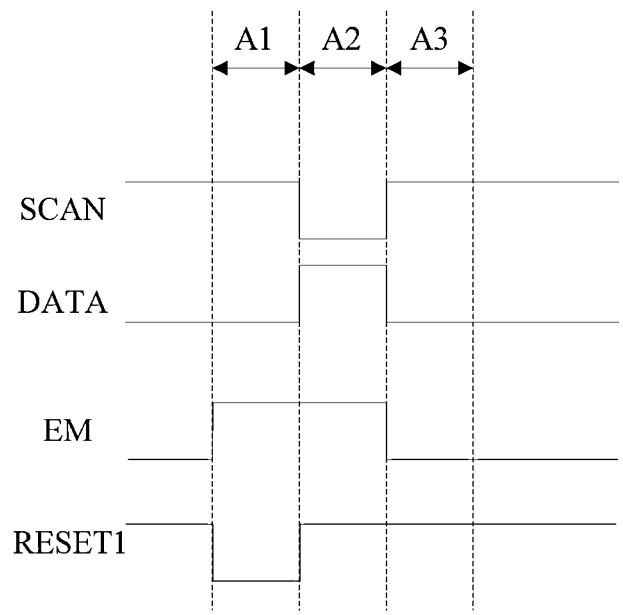
FIG. 6C is a working timing diagram of a pixel circuit of a first structure and a pixel circuit of a second structure according to at least one embodiment of the present disclosure.

FIG. 6A is a schematic diagram of a pixel circuit of a first structure according to at least one embodiment of the present disclosure. FIG. 6B is a schematic diagram of a pixel circuit of a second structure according to at least one embodiment of the present disclosure. FIG. 6C is a working timing diagram of a pixel circuit of a first structure and a pixel circuit of a second structure according to at least one embodiment of the present disclosure.

In some exemplary embodiments, as shown in FIG. 6A and FIG. 6B, both the pixel circuit of the first structure and the pixel circuit of the second structure include six switching transistors (T1, T2, and T4 to T7), a drive transistor T3, and a storage capacitor Cst. The six switching transistors are respectively a data writing transistor T4, a threshold compensation transistor T2, a first light emitting control transistor T5, a second light emitting control transistor T6, a first reset transistor T1, and a second reset transistor T7. A light emitting element EL includes a first electrode E1, a second electrode E2, and an organic light emitting layer located between the first electrode E1 and the second electrode E2. For example, the first electrode E1 may be an anode and the second electrode E2 may be a cathode.

In some exemplary embodiments, the drive transistor and the six switching transistors may be P-type transistors or may be N-type transistors. Adopting a same type of transistors in a pixel circuit may simplify a process flow, reduce a process difficulty of a display substrate, and improve a yield of products. In some exemplary embodiments, the drive transistor and the six switching transistors may include a P-type transistor and an N-type transistor.

In some exemplary embodiments, Low Temperature Poly-Silicon thin film transistors, or oxide thin film transistors, or a Low Temperature Poly-Silicon thin film transistor and an oxide thin film transistor may be adopted for the drive transistor and the six switching transistors. An active layer of a Low Temperature Poly-Silicon thin film transistor is made of Low Temperature Poly-Silicon (LTPS), and an active layer of an oxide thin film transistor is made of an oxide semiconductor (Oxide). A Low-temperature Poly-Silicon thin film transistor has advantages such as high mobility and fast charging, while an oxide thin film transistor has an advantage such as low leakage current. The Low Temperature Poly-Silicon thin film transistor and the oxide thin film transistor are integrated on one display substrate to form a Low Temperature Polycrystalline Oxide (LTPO) display substrate, and advantages of both the Low Temperature Poly-Silicon thin film transistor and the oxide thin film transistor may be utilized to achieve low frequency drive, which reduces power consumption and improves display quality.

In some exemplary embodiments, as shown in FIG. 6A and FIG. 6B, a display substrate includes a scan line GT, a data line DT, a first power supply line PL1, a second power supply line PL2, a light emitting control line EML, a first initial signal line INIT1, a second initial signal line INIT2, a first reset control line RST1, and a second reset control line RST2. In some examples, the first power supply line PL1 is configured to provide a constant first voltage signal VDD to a pixel circuit, the second power supply line PL2 is configured to provide a constant second voltage signal VSS to a pixel circuit, and the first voltage signal VDD is greater than the second voltage signal VSS. The scan line GT is configured to provide a scan signal SCAN to a pixel circuit, the data line DT is configured to provide a data signal DATA to a pixel circuit, the light emitting control line EML is configured to provide a light emitting control signal EM to a pixel circuit, the first reset control line RST1 is configured to provide a first reset control signal RESET1 to a pixel circuit, and the second reset control line RST2 is configured to provide a scan signal SCAN to a pixel circuit. For example, in a row of pixel circuits, a second reset control line RST2 may be connected with a scan line GT to be input with a scan signal SCAN. However, this embodiment is not limited thereto. For example, a second reset control signal line RST2 may be input with a second reset control signal RESET2. For example, in a pixel circuit in a n-th row, a first reset control line RST1 may be connected with a scan line GT of a pixel circuit in a (n−1)-th row to be inputted with a scan signal SCAN(n−1), that is, a first reset control signal RESET1(*n*) is the same as a scan signal SCAN(n−1). Thus signal lines of the display substrate may be reduced, and a narrow frame of the display substrate may be achieved.

In some exemplary embodiments, the first initial signal line INIT1 is configured to provide a first initial signal Vinit1 to the pixel circuit. The second initial signal line INIT2 is configured to provide a second initial signal Vinit2 to the pixel circuit. For example, the first initial signal Vinit1 and the second initial signal Vinit2 may be constant voltage signals, and their magnitudes may be between a first voltage signal VDD and a second voltage signal VSS, but not limited to this. For example, the first initial signal Vinit1 and the second initial signal Vinit2 may be smaller than or equal to the second voltage signal VSS.

In some exemplary embodiments, as shown in FIG. 6A, in the pixel circuit of the first structure, a drive transistor T3 is electrically connected with a light emitting element EL, and outputs a drive current to drive the light emitting element EL to emit light under control of a scan signal SCAN, a data signal DATA, a first voltage signal VDD, a second voltage signal VSS and etc. A gate electrode of a data writing transistor T4 is connected with the scan line GT, a first electrode of the data writing transistor T4 is connected with the data line DT, and a second electrode of the data writing transistor T4 is connected with a first electrode of the drive transistor T3. A gate electrode of a threshold compensation transistor T2 is connected with the scan line GT, a first electrode of the threshold compensation transistor T2 is connected with a gate electrode of the drive transistor T3, and a second electrode of the threshold compensation transistor T2 is connected with a second electrode of the drive transistor T3. A gate electrode of a first light emitting control transistor T5 is connected with the light emitting control line EML, a first electrode of the first light emitting control transistor T5 is connected with the first power supply line PL1, and a second electrode of the first light emitting control transistor T5 is connected with the first electrode of the drive transistor T3. A gate electrode of a second light emitting control transistor T6 is connected with the light emitting control line EML, a first electrode of the second light emitting control transistor T6 is connected with the second electrode of the drive transistor T3, and a second electrode of the second light emitting control transistor T6 is connected with a first electrode E1 of the light emitting element EL. A first reset transistor T1 is connected with the gate electrode of the drive transistor T3 and configured to reset the gate electrode of the drive transistor T3, and a second reset transistor T7 is connected with the first electrode E1 of the light emitting element EL and configured to reset the first electrode E1 of the light emitting element EL. A gate electrode of the first reset transistor T1 is connected with the first reset control line RST1, a first electrode of the first reset transistor T1 is connected with the first initial signal line INIT1, and a second electrode of the first reset transistor T1 is connected with the gate electrode of the drive transistor T3. A gate electrode of the second reset transistor T7 is connected with the second reset control line RST2, a first electrode of the second reset transistor T7 is connected with the first initial signal line INIT1, and a second electrode of the second reset transistor T7 is connected with the first electrode E1 of the light emitting element EL. A first electrode of a storage capacitor Cst is connected with the gate electrode of the drive transistor T3, and a second electrode of the storage capacitor Cst is connected with a first power supply line PL1. In this example, a first node N1 is a connection point of the storage capacitor Cst, the first reset transistor T1, the drive transistor T3, and the threshold compensation transistor T2, a second node N2 is a connection point of the first light emitting control transistor T5, the data writing transistor T4, and the drive transistor T3, a third node N3 is a connection point of the drive transistor T3, the threshold compensation transistor T2, and the second light emitting control transistor T6, and a fourth node N4 is a connection point of the second light emitting control transistor T6, the second reset transistor T7, and the light emitting element EL.

Next, a working process of the pixel circuit of the first structure illustrated in FIG. 6A will be described with reference to FIG. 6C. Explanation will be made by taking an example that multiple transistors included in the pixel circuit of the first structure are all P-type transistors.

In some exemplary embodiments, as shown in FIG. 6C, in one frame display period, the working process of the pixel circuit of the first structure includes a first stage A1, a second stage A2, and a third stage A3.

The first stage A1 is referred to as a reset stage. A first reset control signal RESET1 provided by the first reset control line RST1 is a low-level signal, so that the first reset transistor T1 is turned on, and a first initial signal Vinit1 provided by the first initial signal line INIT1 is provided to the first node N1 to initialize the first node N1 and clear an original data voltage in the storage capacitor Cst. A scan signal SCAN provided by the scan line GT is a high-level signal, and a light emitting control signal EM provided by the light emitting control line EML is a high-level signal, so that the data writing transistor T4, the threshold compensation transistor T2, the first light emitting control transistor T5, the second light emitting control transistor T6, and the second reset transistor T7 are turned off. In this stage, the light emitting element EL does not emit light.

The second stage A2 is referred to as a data writing stage or a threshold compensation stage. A scan signal SCAN provided by the scan line GT is a low-level signal, a first reset control signal RESET1 provided by the first reset control line RST1 and a light emitting control signal EM provided by the light emitting control line EML are both high-level signals, and the data line DT outputs a data signal DATA. In this stage, the second electrode of the storage capacitor Cst is at a low level, so that the drive transistor T3 is turned on. A scan signal SCAN is a low-level signal, which turns on the threshold compensation transistor T2, the data writing transistor T4, and the second reset transistor T7. The threshold compensation transistor T2 and the data writing transistor T4 are turned on, so that a data voltage Vdata output by the data line DL is provided to the first node N2 through the second node N2, the turned-on drive transistor T3, the third node N3, and the turned-on threshold compensation transistor T2, and the storage capacitor Cst is charged with a difference between the data voltage Vdata output by the data line DL and a threshold voltage of the drive transistor T3. A voltage of the second electrode (that is, the first node N1) of the storage capacitor Cst is Vdata-|Vth|, wherein Vdata is the data voltage output by the data line DL, and Vth is the threshold voltage of the drive transistor T3. The second reset transistor T7 is turned on, so that a first initial signal Vinit1 provided by the first initial signal line INIT1 is provided to the first electrode E1 of the light emitting element EL to initialize (reset) the first electrode E1 of the light emitting element EL and clear a pre-stored voltage therein, so as to complete initialization, thereby ensuring that the light emitting element EL does not emit light. A first reset control signal RESET1 provided by the first reset control line RST1 is a high-level signal, which turns off the first reset transistor T1. A light emitting control signal EM provided by the light emitting control signal line EML is a high-level signal, which turns off the first light emitting control transistor T5 and the second light emitting control transistor T6.

The third stage A3 is referred to as a light emitting stage. A light emitting control signal EM provided by the light emitting control signal line EML is a low-level signal, and a scan signal SCAN provided by the scan line GT and a first reset control signal RESET1 provided by the first reset control line RST1 are high-level signals. A light emitting control signal EM of the light emitting control signal line EML is a low-level signal, so that the first light emitting control transistor T5 and the second light emitting control transistor T6 are turned on, and a first voltage signal VDD output by the first power supply line PL1 provides a drive voltage to the first electrode E1 of the light emitting element EL through the first light emitting control transistor T5, the drive transistor T3, and the second light emitting control transistor T6 which are turned on to drive the light emitting element EL to emit light.

In a drive process of a pixel circuit, a drive current flowing through the drive transistor T3 is determined by a voltage difference between the gate electrode and the first electrode of the drive transistor T3. Since the voltage of the first node N1 is Vdata-|Vth|, the drive current of the drive transistor T3 is as follows.

$$I=K*(Vgs-Vth)2=K*[(Vdd-\text{Vdata}+|Vth|)-Vth]2=K*[(Vdd-\text{Vdata}]^2$$

Among them, I is the drive current flowing through the drive transistor T3, that is, the drive current for driving the light emitting element EL; K is a constant; Vgs is the voltage difference between the gate electrode and the first electrode of the drive transistor T3; Vth is A threshold voltage of the drive transistor T3; Vdata is a data voltage output by the data line DT; and VDD is a first voltage signal output by the first power supply line PL1.

It may be seen from the above formula that a current flowing through the light emitting element EL is independent of the threshold voltage of the drive transistor T3. Therefore, the pixel circuit of the first structure of this embodiment may better compensate the threshold voltage of the drive transistor T3.

In some exemplary embodiments, as shown in FIG. 6B, in the pixel circuit of the second structure, a gate electrode of a second reset transistor T7 is connected with a second reset control line RST2, a first electrode of the second reset transistor T7 is connected with a second initial signal line INIT2, and a second electrode of the second reset transistor T7 is connected with a first electrode E1 of a light emitting element EL. A first initial signal line INIT1 and the second initial signal line INIT2 are insulated from each other and configured to input signals respectively. A structure of remaining transistors and storage capacitors of the pixel circuit of the second structure may refer to related description of the pixel circuit of the first structure shown in FIG. 6A, so it will not be repeated here.

In some exemplary embodiments, as shown in FIG. 6B and FIG. 6C, in a working process of the pixel circuit of the second structure, in the second stage A2, the second reset transistor T7 is turned on, so that the second initial signal Vinit2 provided by the second initial signal line INIT2 is provided to the first electrode E1 of the light emitting element EL, and the first electrode E1 of the light emitting element EL is initialized (reset), a pre-stored voltage inside it is cleared, and initialization is completed, it is ensured the light emitting element EL does not emit light. Other operation process of the pixel circuit of the second structure may refer to related description of the operation process of the pixel circuit of the first structure, so it will not be repeated here.

In this exemplary embodiment, the pixel circuit of the first structure is designed with a single initial signal, wherein a first reset transistor and a second reset transistor receive a same initial signal (i.e., a first initial signal). The pixel circuit of the second structure is designed with two initial signals, wherein a first reset transistor and a second reset transistor receive different initial signals (that is, the first reset transistor receives a first initial signal and the second reset transistor receives a second initial signal).

Taking each pixel circuit of the first display region R1 being a pixel circuit shown in FIG. 6B as an example, a second-type pixel circuit is connected with a second-region light emitting element through a conductive line, and an excessively long length of the conductive line leads to an excessively large capacitance of the fourth node N4 in the pixel circuit shown in FIG. 6B, so that after the fourth node N4 is reset to the second initial signal Vinit2 in the second stage A2, it takes a long time to charge to reach a predetermined potential. In this way, a turn-on time length of a second-region light emitting element will be affected adversely, resulting in display darkening and a display brightness difference between the first display region R1 and the second display region R2. A charging amount of the fourth node N4 may be effectively reduced by increasing the second initial signal Vinit2. In a case of a constant current, an amount of electricity is proportional to a time length. Therefore, a charging time length may be effectively reduced by increasing the second initial signal Vinit2, so that a light emitting time length may be increased and a brightness difference caused by an excessively long conductive line may be improved. However, increasing of the second initial signal Vinit2 has a risk of leakage of the light emitting element EL. Since the second initial signal Vinit2 provides an anode voltage of the light emitting element EL, and the second voltage signal VSS provides a cathode voltage of the light emitting element EL, if the second initial signal Vinit2 is too high, there will be some problems such as contrast reduction, inability to display a black screen, and easy lighting of the light emitting element EL.

In this exemplary embodiment, a structure of a pixel circuit is designed considering a length of a conductive line to improve a display effect. No conductive line is needed for connecting a first-type pixel circuit in the first display region with a first-region light emitting element in the first display region. In order to avoid problems caused by increasing the second initial signal Vinit2, the first-type pixel circuit may be designed with a single initial signal. For example, the first-type pixel circuit may be the pixel circuit of the first structure as shown in FIG. 6A.

In this exemplary embodiment, a second-type pixel circuit of the first display region and a second-region light emitting element of the second display region are connected through a conductive line, and lengths of conductive lines connected with different second-region light emitting elements are different. Through simulation, a length boundary-dividing value of a conductive line that causes a brightness difference between the first display region and the second display region may be determined, and conductive lines connecting second-region light emitting elements and second-type pixel circuits may be divided into a first group of conductive lines and a second group of conductive lines using the length boundary-dividing value. A length of the first group of conductive lines may be smaller than the length boundary-dividing value. A length of the second group of conductive lines may be greater than or equal to the length boundary-dividing value, which will cause a brightness difference between the first display region and the second display region. A single initial signal design may be adopted for a second-type pixel circuit connected with a second-region light emitting element through the first group of conductive lines, for example, the second-type pixel circuit may be the pixel circuit of the first structure as shown in FIG. 6A, so as to avoid a case that a light emitting element is easily turned on caused by increasing the second initial signal Vinit2. A dual initial signal design may be adopted for a second-type pixel circuit connected with a second-region light emitting element through the second group of conductive lines, for example, the second-type pixel circuit may be the pixel circuit of the second structure as shown in FIG. 6B. There is a difficulty in turning on a second-region light emitting element connected with the second group of conductive lines due to an excessive capacitance of a conductive line. A charging time length of the fourth node N4 may be reduced by increasing the second initial signal Vinit2, and poor display may be improved.

In some examples, in a simulation process of determining the length boundary-dividing value, a constant second initialization signal may be provided, and then the length boundary-dividing value may be determined according to an influence of brightness of the display substrate changing with a length of a conductive line. Or, a capacitance of a conductive line may be calculated, and the length boundary-dividing value may be determined based on a display effect in low gray scale. However, this embodiment is not limited thereto.

In some exemplary embodiments, as shown in FIG. 5A, a length of a first conductive line La connecting a first light emitting element 41 and a first pixel circuit 21 is about 100 μm to 6000 μm, and a length of a second conductive line Lb connecting a second light emitting element 42 and a second pixel circuit 22 is about 5000 μm to 10000 μm, a length of a third conductive line Lc connecting a third light emitting element 43 and a third pixel circuit 23 is about 5000 μm to 10000 μm, and a length of a fourth conductive line Ld connecting a fourth light emitting element 44 and a fourth pixel circuit 24 is about 100 μm to 6000 μm. In this example, a length boundary-dividing value of a conductive line obtained through simulation may be about 3000 μm. Among them, conductive lines with a length smaller than 3000 μm may be referred to as a first group of conductive lines, and conductive lines with a length greater than or equal to 3000 μm may be referred to as a second group of conductive lines. A second-type pixel circuit connected with the first group of conductive lines may be a pixel circuit of a first structure, and a second-type pixel circuits connected with the second group of conductive lines may be a pixel circuit of a second structure. On a basis of distinguishing the first group of conductive lines from the second group of conductive lines, by adjusting a structure of a pixel circuit, poor display caused by raising a second initial signal may be avoided in a case that a capacitance of a conductive line is relatively small, and a display defect may be improved by raising the second initial signal in a case that a capacitance of a conductive line is relatively large. A length of a conductive line is not limited in this embodiment. When a size of a display substrate is changed, both a length boundary-dividing value and a length of a conductive line will change.

In some exemplary embodiments, as shown in FIG. 5A, a first pixel circuit 21 connected with a first conductive line La with a length of about 100 μm to 3000 μm may be a pixel circuit of a first structure, and a first pixel circuit 21 connected with a first conductive line La with a length of about 3000 μm to 6000 μm may be a pixel circuit of a second structure. A second pixel circuit 22 connected with a second conductive line Lb and a third pixel circuit 23 connected with a third conductive line Lc are pixel circuits of the second structure. A fourth pixel circuit 24 connected with a fourth conductive line Ld with a length of about 100 μm to 3000 μm may be a pixel circuit of the first structure, and a fourth pixel circuit 24 connected with a fourth conductive line Ld with a length of about 3000 μm to 6000 μm may be a pixel circuit of the second structure.

In some exemplary embodiments, as shown in FIG. 5A, in the first display region R1, a first-region light emitting element 30 and a first-type pixel circuit 10 do not need to be connected through a conductive line, and first-type pixel circuits 10 may all be pixel circuits of the first structure, so as to avoid a case that a light emitting element is easily turned on due to raising of a second initial signal.

In some exemplary embodiments, a first initial signal Vinit1 provided by a first initial signal line INIT1 may be a constant voltage signal, for example, about −3V. A second initial signal Vinit2 provided by a second initial signal line INIT2 may be a constant voltage signal and is larger than the first initial signal Vinit1. For example, the second initial signal Vinit2 may be greater than −3V, for example about −2V, −1.5V, −1V, or −0.5V. In some examples, multiple second initial signal lines INIT2 may provide different second initial signals. For example, a magnitude of a second initial signal provided by a second initial signal line connected with a pixel circuit of the second structure is proportional to a length of a second group of conductive lines connected between the pixel circuit of the second structure and a second-region light emitting element. For example, the longer the second group of conductive lines connected with the pixel circuit of the second structure is, the larger the second initial signal provided by the second initial signal line connected with the pixel circuit has. However, this embodiment is not limited thereto.

Figure 7A:
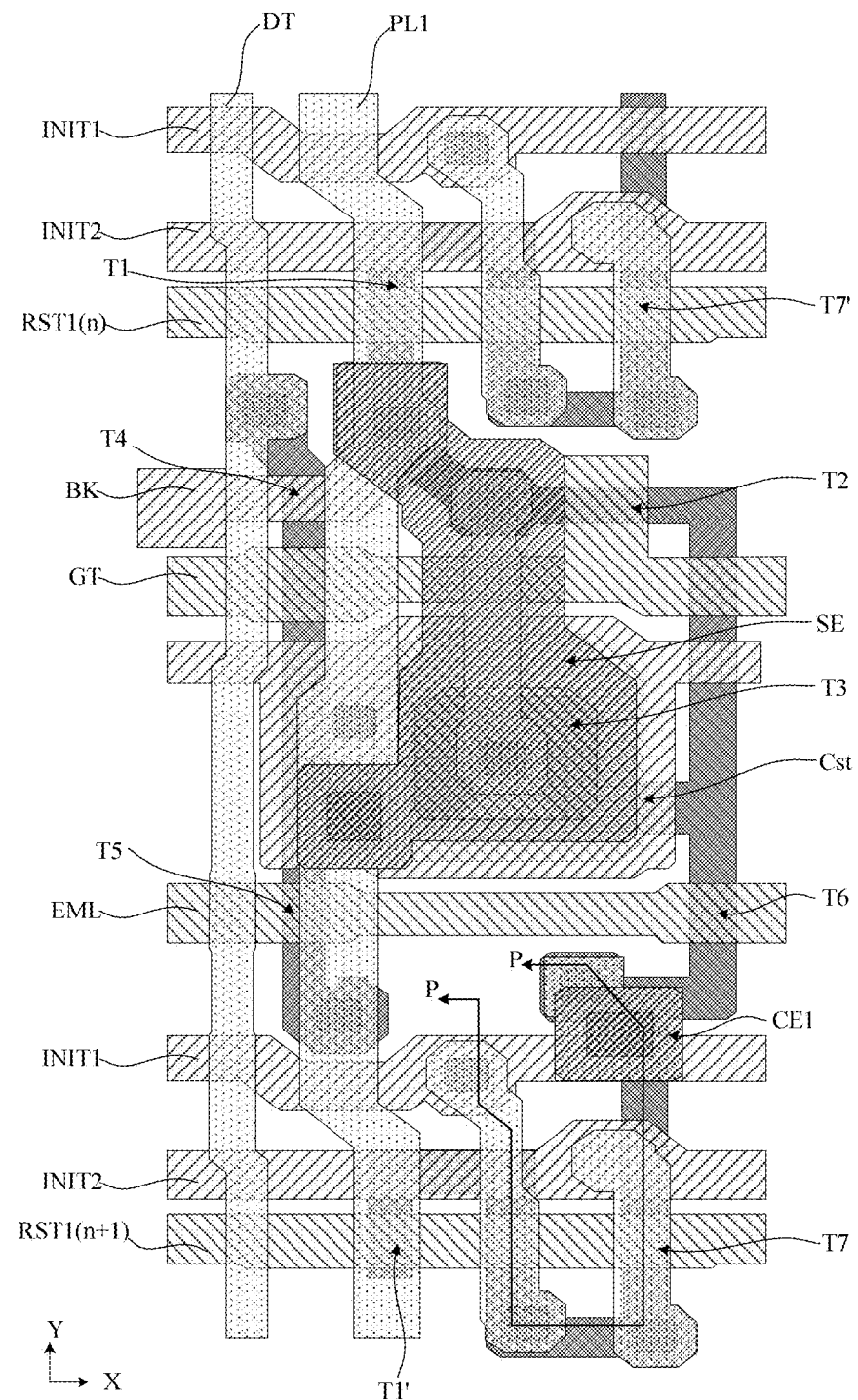
FIG. 7A is a schematic plan view of a pixel circuit of a first structure according to at least one embodiment of the present disclosure.
Figure 7B:
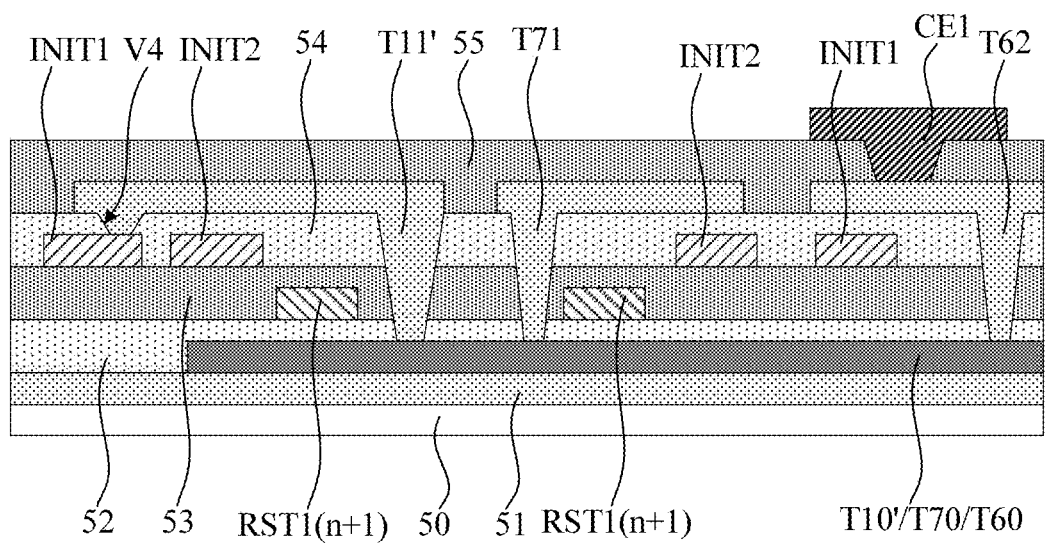
FIG. 7B is a schematic partial sectional view along a P-P direction in FIG. 7A.

FIG. 7A is a schematic plan view of a pixel circuit of a first structure according to at least one embodiment of the present disclosure. FIG. 7B is a schematic partial sectional view along a P-P direction in FIG. 7A. A first direction X may be a direction of sub-pixel rows (a horizontal direction), and a second direction Y may be a direction of sub-pixel columns (a vertical direction).

In some exemplary embodiments, as shown in FIG. 7A, in a plane parallel to a display substrate, the display substrate is disposed with a scan line GT, a light emitting control line EML, a first reset control line RST1, a first initial signal line INIT1, a second initial signal line INIT2, a first power supply line PL1, a data line DT, and a pixel circuit of a first structure. The pixel circuit of the first structure may include multiple transistors and a storage capacitor Cst, and the multiple transistors may include a drive transistor T3, a data writing transistor T4, a threshold compensation transistor T2, a first reset transistor T1, a second reset transistor T7, a first light emitting control transistor T5, and a second light emitting control transistor T6.

In FIG. 7A, multiple transistors T1 to T7 of a pixel circuit in a n-th row, a second reset transistor T7' of a pixel circuit in a (n−1)-th row, and a first reset transistor T1' of a pixel circuit in a (n+1)-th row are illustrated. As shown in FIG. 7A, the first reset transistor T1 of the pixel circuit in the n-th row is connected with a first reset control line RST1($n$), the first reset control line RST1($n$) is connected with a scan line GT(n−1) connected with the pixel circuit in the (n−1)-th row, and the second reset transistor T7' of the pixel circuit in the (n−1)-th row is connected with the first reset control line RST1(n) to achieve input of a scan signal SCAN(n−1). The first reset transistor T1' of the pixel circuit in the (n+1)-th row is connected with a first reset control line RST1(n+1), the first reset control line RST1(n+1) is connected with a scan line GT(n) connected with the pixel circuit in the n-th row, and the second reset transistor T7 of the pixel circuit in the n-th row is connected with the first reset control line RST1(n+1) to achieve input of a scan signal SCAN(n).

In some exemplary embodiments, in a plane perpendicular to a display substrate, the display substrate may include a semiconductor layer, a first conductive layer, a second conductive layer, and a third conductive layer, and a fourth conductive layer that are sequentially disposed on a base substrate 50. In some examples, the semiconductor layer may include active layers of multiple transistors. The first conductive layer may include a scan line GT, a first reset control line RST1, a light emitting control line EML, a first electrode of a storage capacitor Cst, and gate electrodes of multiple transistors. The second conductive layer may include a first initial signal line INIT1, a second initial signal line INIT2, a second electrode of the storage capacitor Cst, and a first shield electrode BK. The third conductive layer may include a first power supply line PL1, a data line DT, and first and second electrodes of multiple transistors. The fourth conductive layer may include a second shield electrode SE and a first connection electrode CE1.

In some exemplary embodiments, as shown in FIG. 7B, a display substrate may include a first insulating layer 51, a second insulating layer 52, a third insulating layer 54, and a fourth insulating layer 55. The first insulating layer 51 is disposed between the base substrate 50 and the semiconductor layer, the second insulating layer 52 is disposed between the semiconductor layer and the first conductive layer, the third insulating layer 53 is disposed between the first conductive layer and the second conductive layer, the fourth insulating layer 54 is disposed between the second conductive layer and the third conductive layer, and the fifth insulating layer 55 is disposed between the third conductive layer and the fourth conductive layer. In some examples, the first insulating layer 51, the second insulating layer 52, the third insulating layer 53, and the fourth insulating layer 54 may be inorganic insulating layers, and the fifth insulating layer 55 may be an organic insulating layer. However, this embodiment is not limited thereto.

Figure 7C:
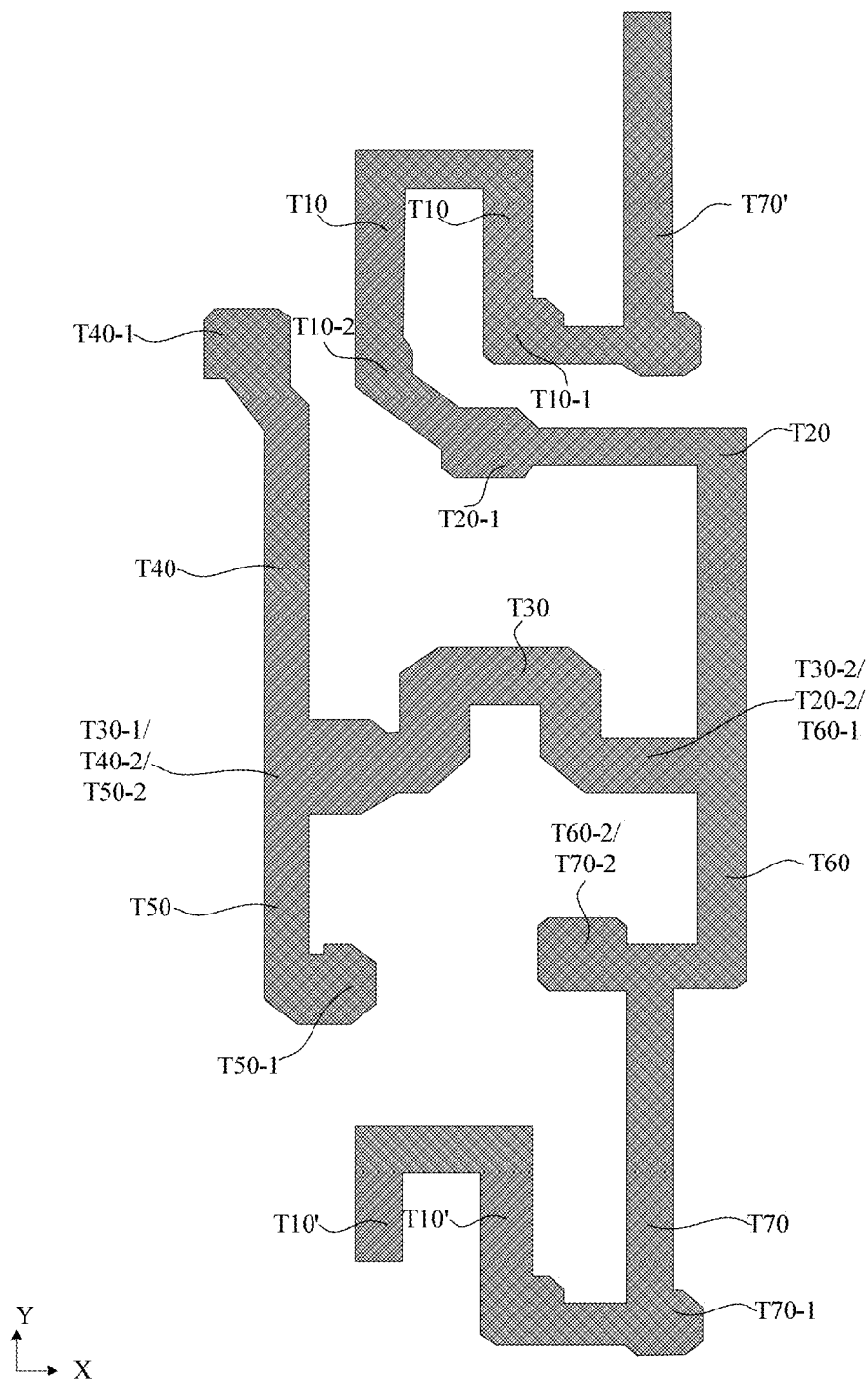
FIG. 7C is a schematic diagram of a pixel circuit of a first structure after a semiconductor layer is formed according to at least one embodiment of the present disclosure.

FIG. 7C is a schematic diagram of a pixel circuit of a first structure after a semiconductor layer is formed according to at least one embodiment of the present disclosure. In some exemplary embodiments, as shown in FIG. 7C, a semiconductor layer of at least one sub-pixel may include a first active layer T10 of a first reset transistor T1, a second active layer T20 of a threshold compensation transistor T2, a third active layer T30 of a drive transistor T3, a fourth active layer T40 of a data writing transistor T4, a fifth active layer T50 of a first light emitting control transistor T5, a sixth active layer T60 of a second light emitting control transistor T6, and a seventh active layer T7 of a second reset transistor T7. Among them, the first active layer T10 to the seventh active layer T70 have an integrated structure connected with each other. The first active layer T10 has an integrated structure with a seventh active layer T70' of a pixel circuit in a previous row, and the seventh active layer T10 has an integrated structure with a first active layer T10' of a pixel circuit of a next row.

In some exemplary embodiments, as shown in FIG. 7C, the first active layers T10 and T10' may be in a shape of "n", the second active layer T20 may be in a shape of "7", the third active layer T30 may be in a shape of " 几 ", the fourth active layer T40 may be in a shape of "1", the fifth active layer T50, the sixth active layer T60, and the seven active layers T70 and T70' may be in a shape of "L".

In some exemplary embodiments, an active layer of each transistor may include a first region, a second region, and a channel region located between the first region and the second region. In some examples, as shown in FIG. 7C, a first region T10-1 of the first active layer T10 simultaneously serves as a first region of a seventh active layer T70' of a seventh transistor T7' of a pixel circuit of a previous row, a second region T10-2 of the first active layer T10 simultaneously serves as a first region T20-1 of the second active layer T20, a first region T30-1 of the third active layer T30 simultaneously serves as a second region T40-2 of the fourth active layer T40 and a second region T50-2 of the fifth active layer T50. A second region T30-2 of the third active layer T30 simultaneously serves as a second region T20-2 of the second active layer T20 and a first region T60-1 of the sixth active layer T60, a second region T60-2 of the sixth active layer T60 simultaneously serves as a second region T70-2 of the seventh active layer T70.

Figure 7D:
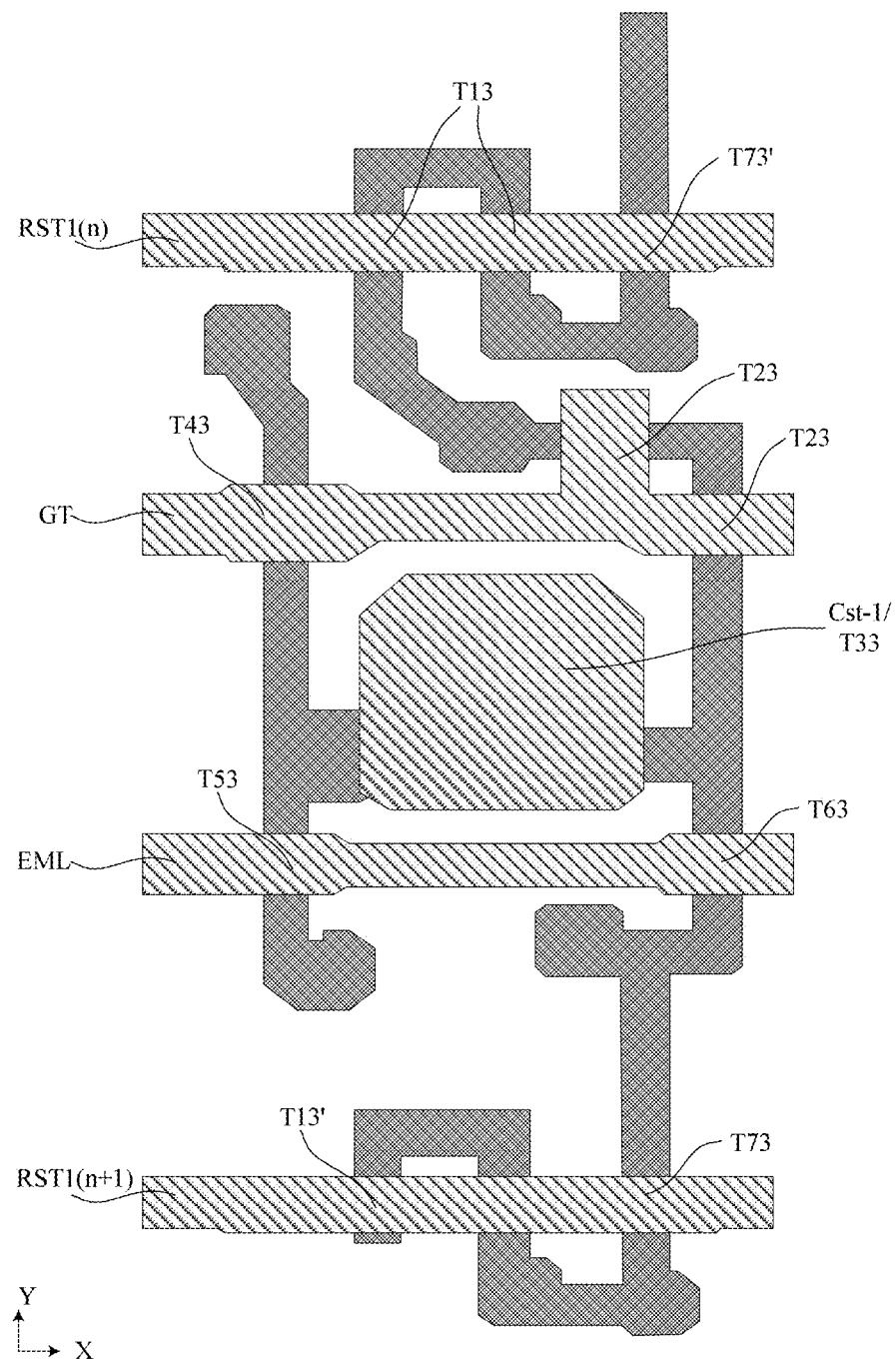
FIG. 7D is a schematic diagram of a pixel circuit of a first structure after a first conductive layer is formed according to at least one embodiment of the present disclosure.

FIG. 7D is a schematic diagram of a pixel circuit of a first structure after a first conductive layer is formed according to at least one embodiment of the present disclosure. In some exemplary embodiments, as shown in FIG. 7D, the first conductive layer at least includes a first electrode Cst-1 of a storage capacitor Cst, a scan line GT extending along a first direction X, a light emitting control line EML, and first reset control lines RST1(n) and RST1(n+1). The first electrode Cst-1 of the storage capacitor Cst may be in a shape of a rectangle, and corners of the rectangle may be chamfered. There is an overlap region between an orthographic projection of the first electrode Cst-1 on a base substrate and an orthographic projection of a third active layer T30 of a drive transistor T3 on the base substrate. The first electrode Cst-1 of the storage capacitor CST also serves as a gate electrode T33 of the drive transistor T3. The scan line GT, a gate electrode T43 of a data writing transistor T4, and a gate electrode T23 of a threshold compensation transistor T2 may have an integrated structure. The light emitting control line EML, a gate electrode T53 of a first light emitting control transistor T5, and a gate electrode T63 of a second light emitting control transistor T6 may have an integrated structure. The first reset control line RST1(n), a gate electrode T13 of a first reset transistor T1, and a gate electrode T73' of a second reset transistor T7' of a pixel circuit in a previous row may have an integrated structure. The first reset control line RST1(n+1), a gate electrode T73 of a second reset transistor T7, and a gate electrode T13' of a first reset transistor T1' of a pixel circuit in a next row may have an integrated structure.

Figure 7E:
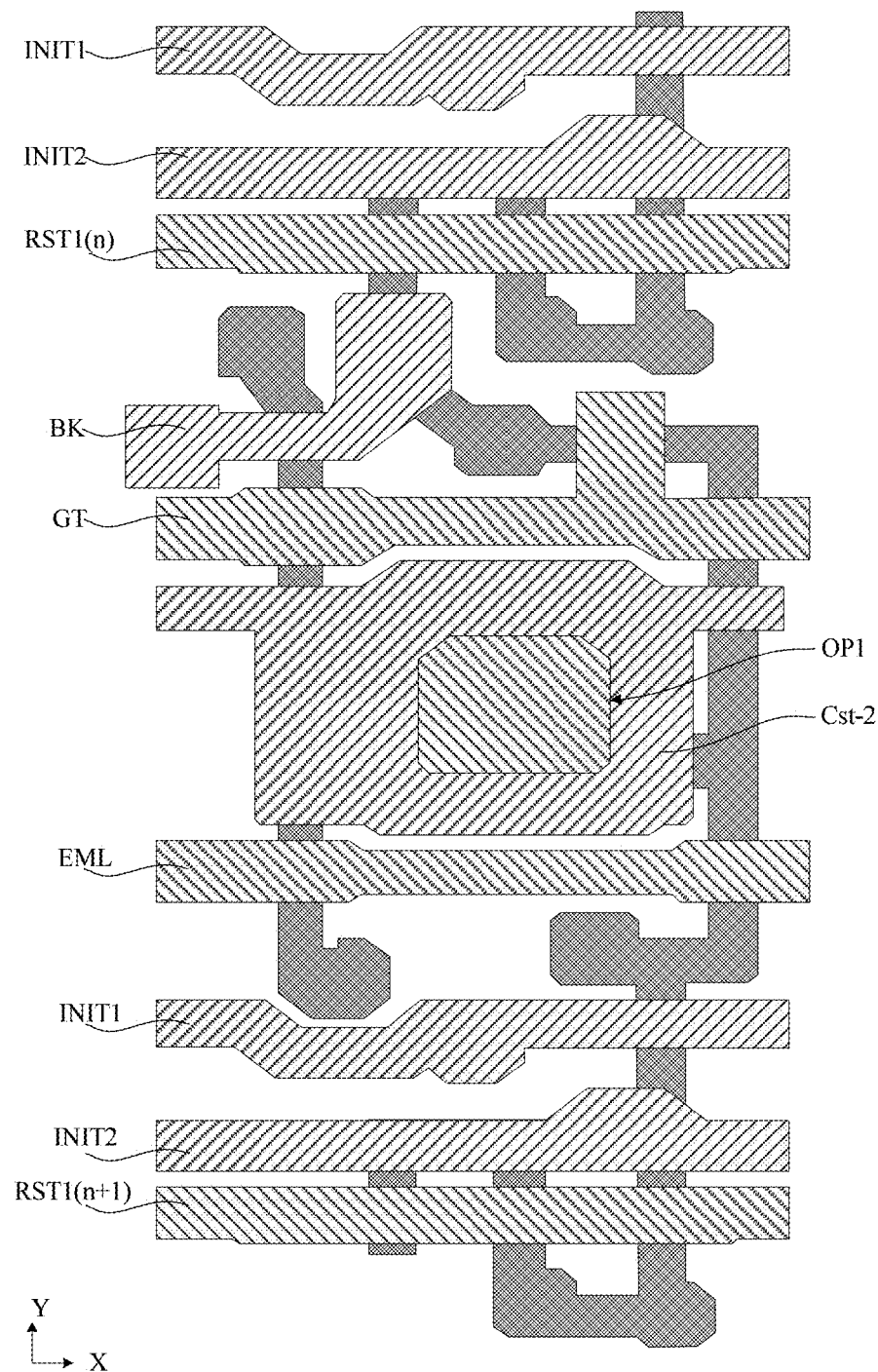
FIG. 7E is a schematic diagram of a pixel circuit of a first structure after a second conductive layer is formed according to at least one embodiment of the present disclosure.

FIG. 7E is a schematic diagram of a pixel circuit of a first structure after a second conductive layer is formed according to at least one embodiment of the present disclosure. In some exemplary embodiments, as shown in FIG. 7E, the second conductive layer at least includes a first initial signal line INIT1, a second initial signal line INIT2, a second electrode Cst-2 of a storage capacitor Cst, and a first shield electrode BK. The first initial signal line INIT1 and the second initial signal line INIT2 extend along a first direction X and are located at a side of a scan line GT. The second electrode Cst-2 of the storage capacitor Cst is located between the scan line GT and a light emitting control line EML. There is an overlap region between an orthographic projection of the second electrode Cst-2 of the storage capacitor Cst on a base substrate and an orthographic projection of a first electrode Cst-1 on the base substrate. The second electrode Cst-2 is disposed with an opening OP1, which exposes a third insulating layer 53 covering the first electrode Cst-1, and an orthographic projection of the first electrode Cst-1 on the base substrate includes an orthographic projection of the opening OP1 on the base substrate. In some examples, the opening OP1 is configured to accommodate a first via H1 subsequently formed, which is located in the opening OP1 and exposes the first electrode Cst-1, so that a second electrode of a first transistor T1 subsequently formed is connected with the first electrode Cst-1.

In some exemplary embodiments, as shown in FIG. 7E, the first shield electrode BK is located at a side of the scan line GT away from the storage capacitor Cst. The first shield electrode BK is configured to shield an influence of a data voltage jump on a key node, avoid an influence of the data voltage jump on a potential of the key node of a pixel circuit, and improve a display effect.

Figure 7F:
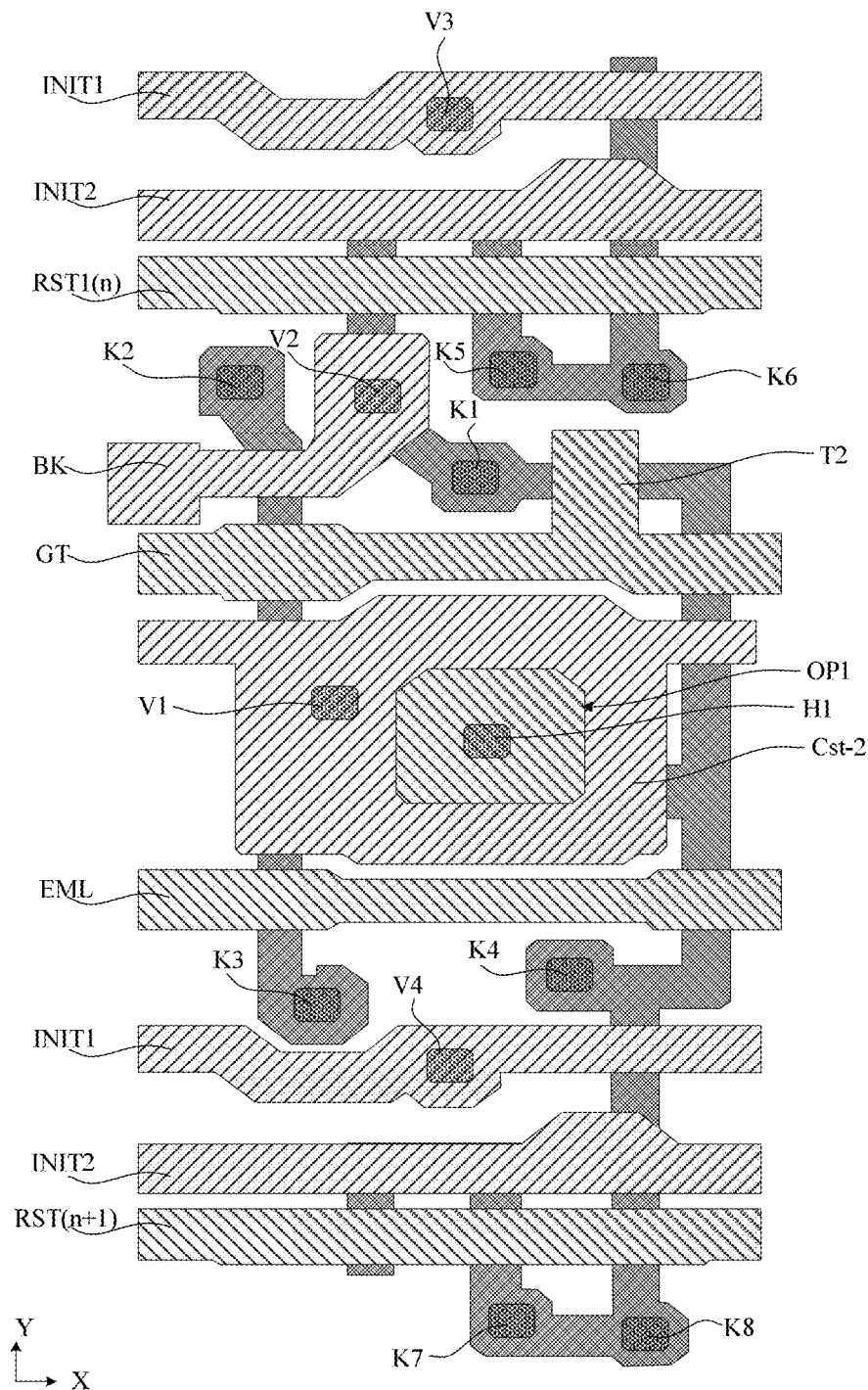
FIG. 7F is a schematic diagram of a pixel circuit of a first structure after a fourth insulating layer is formed according to at least one embodiment of the present disclosure.

FIG. 7F is a schematic diagram of a pixel circuit of a first structure after a fourth insulating layer is formed according to at least one embodiment of the present disclosure. In some exemplary embodiments, as shown in FIG. 7F, a first via H1, multiple second vias V1 to V4, and multiple third vias K1 to K8 are formed on a fourth insulating layer 54. The fourth insulating layer 54 and a third insulating layer 53 in the first via H1 are etched away to expose a surface of a first conductive layer. The fourth insulating layer 54 in the multiple second vias V1 to V4 is etched away to expose a surface of a second conductive layer. The fourth insulating layer 54, the third insulating layer 53, and a second insulating layer 52 in the multiple third vias K1 to K8 are etched away to expose a surface of a semiconductor layer.

Figure 7G:
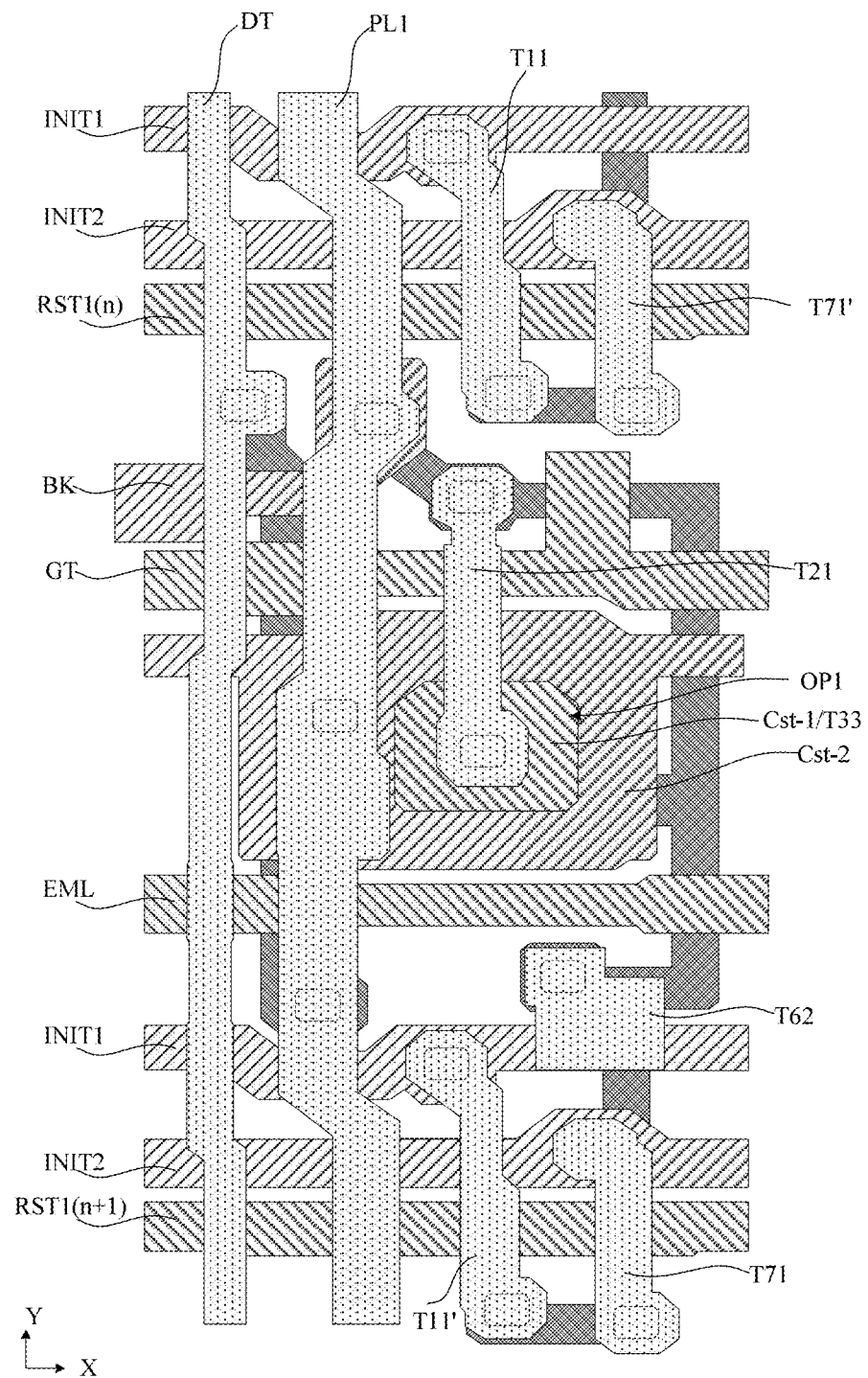
FIG. 7G is a schematic diagram of a pixel circuit of a first structure after a third conductive layer is formed according to at least one embodiment of the present disclosure.

FIG. 7G is a schematic diagram of a pixel circuit of a first structure after a third conductive layer is formed according to at least one embodiment of the present disclosure. In some exemplary embodiments, as shown in FIG. 7G, a third conductive layer may include a data line DT, a first power supply line PL1, a first electrode T11 of a first reset transistor T1, a first electrode T71 of a second reset transistor T7, a first electrode T21 of a threshold compensation transistor T2, a second electrode T62 of a second light emitting control transistor T6, a first electrode T11' of a first reset transistor T1' of a pixel circuit in a next row, and a first electrode T71' of a second reset transistor T7' of a pixel circuit in a previous row. The data line DT and the first power supply line PL1 extend along a second direction Y.

In some exemplary embodiments, as shown in FIG. 7F and FIG. 7G, the data line DT is connected with a first region T40-1 of a fourth active layer T40 of a data writing transistor T4 through a third via K2. The first power supply line PL1 is connected with a second electrode Cst-2 of a storage capacitor Cst through a second via V1, with a first shield electrode BK through a second via V2, and with a first region T50-1 of a fifth active layer T50 of a first light emitting control transistor T5 through a third via K3. A first electrode T21 of the threshold compensation transistor T2 is connected with the first electrode Cst-1 of the storage capacitor Cst through a first via H1, and with a first region T20-1 of a second active layer T20 of the threshold compensation transistor T2 through a third via K1. The second electrode T62 of the second light emitting control transistor T6 is connected with a second region T60-2 of a sixth active layer T60 of the second light emitting control transistor T6 through a third via K4. The first electrode T11 of the first reset transistor T1 is connected with a first initial signal line INIT1 through a second via V3, and with a first region T10-1 of a first active layer T10 of the first reset transistor t1 through a third via K5. The first electrode T71 of the second reset transistor T7 is connected with a first region T70-1 of a seventh active layer t70 of the second reset transistor T7 through a third via K8. The first electrode T11' of the first reset transistor T1' of a pixel circuit in a next row is connected with the first initial signal line INIT1 through a second via V4, and with a first region of a first active layer T10' of the first reset transistor T1' through a third via K7. The first electrode T71' of the second reset transistor T7' of a pixel circuit in a previous row is connected with a first region of a first active layer T80' of the second reset transistor T7' through a third via K6. In this exemplary embodiment, a first electrode of a second reset transistor is not connected with a second initial signal line INIT2. Since active layers of a second reset transistor of a pixel circuit in a current row and a first reset transistor of a pixel circuit in a next row have an integrated structure and the first reset transistor of the pixel circuit in the next row is connected with the first initial signal line INIT1, it is achieved that the second reset transistor of the pixel circuit in the current row is also connected with the first initial signal line INIT1.

Figure 7H:
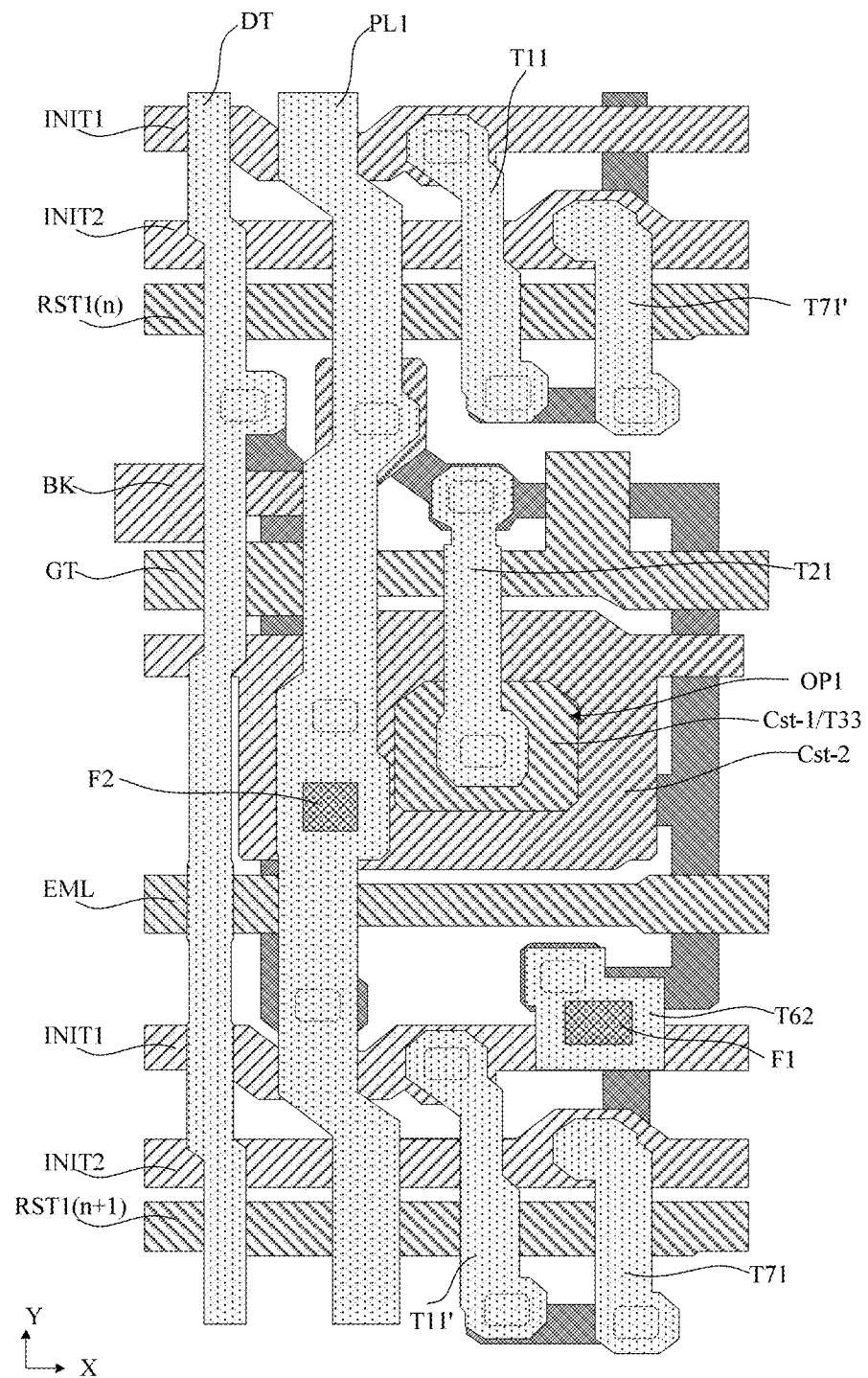
FIG. 7H is a schematic diagram of a pixel circuit of a first structure after a fifth insulating layer is formed according to at least one embodiment of the present disclosure.

FIG. 7H is a schematic diagram of a pixel circuit of a first structure after a fifth insulating layer is formed according to at least one embodiment of the present disclosure. In some exemplary embodiments, multiple fourth vias F1 to F2 are formed on a fifth insulating layer 55. The fifth insulating layer 55 in the multiple fourth vias V1 to F2 is etched away to expose a surface of a third conductive layer.

Figure 7I:
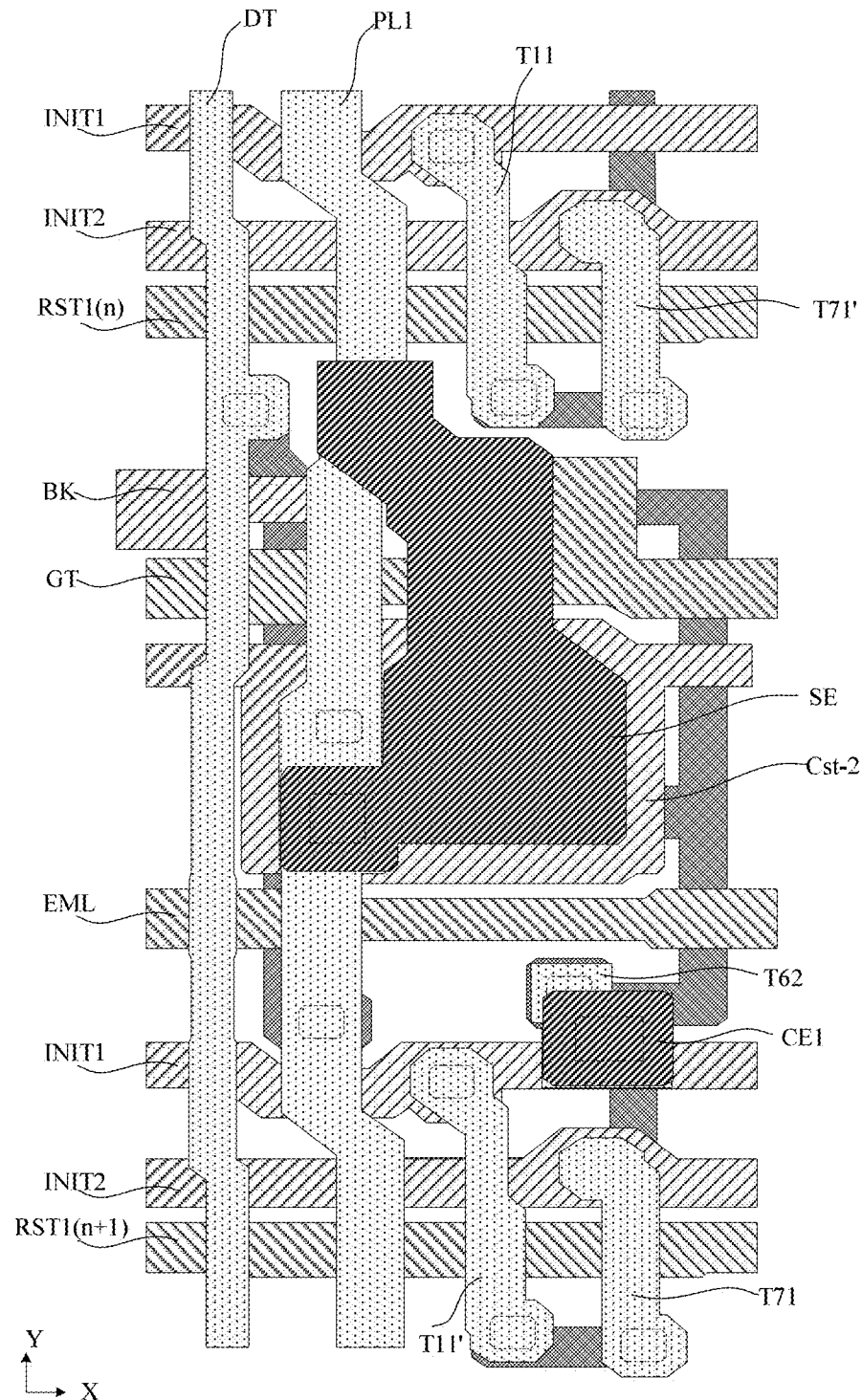
FIG. 7I is a schematic diagram of a pixel circuit of a first structure after a fourth conductive layer is formed according to at least one embodiment of the present disclosure.

FIG. 7I is a schematic diagram of a pixel circuit of a first structure after a fourth conductive layer is formed according to at least one embodiment of the present disclosure. In some exemplary embodiments, a fourth conductive layer at least includes a second shield electrode SE and a first transit electrode CE1. The first transit electrode CE1 is connected with a second electrode T62 of a second light emitting control transistor T6 through a fourth via F1. The first transit electrode CE1 may be directly connected with a first-region light emitting element, or connected with a second transit electrode of a first-region light emitting element, or connected with a second transit electrode of a second-region light emitting element through a conductive line. The second shield electrode SE is connected with a first power supply line PL1 through a fourth via F2. An orthographic projection of the second shield electrode SE on a base substrate overlaps with an orthographic projection of a drive transistor T3 on the base substrate. The second shield electrode SE is configured to shield an influence of a conductive line on the drive transistor T3 and improve a display effect.

Figure 8A:
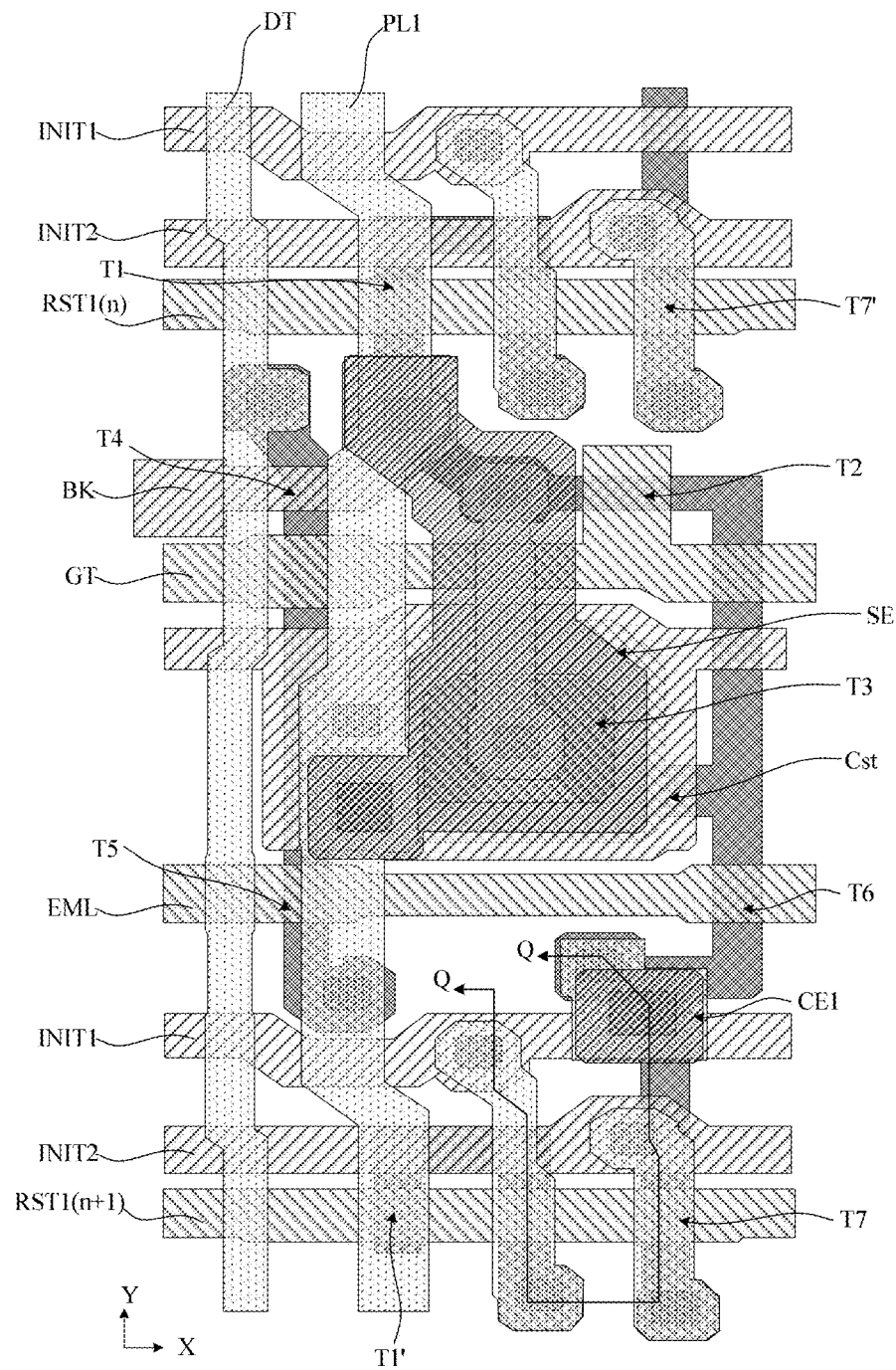
FIG. 8A is a schematic plan view of a pixel circuit of a second structure according to at least one embodiment of the present disclosure.
Figure 8B:
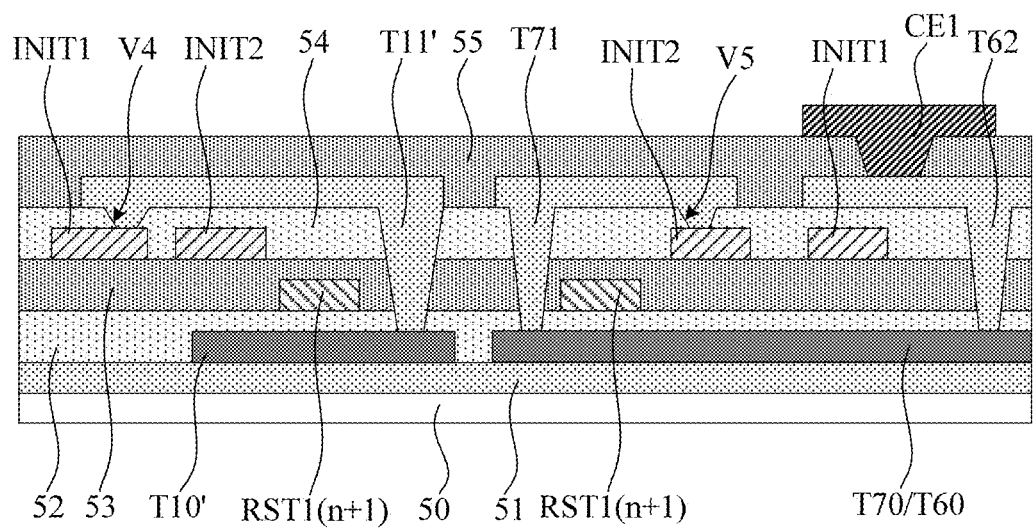
FIG. 8B is a schematic partial sectional view along a Q-Q direction in FIG. 8A.
Figure 8C:
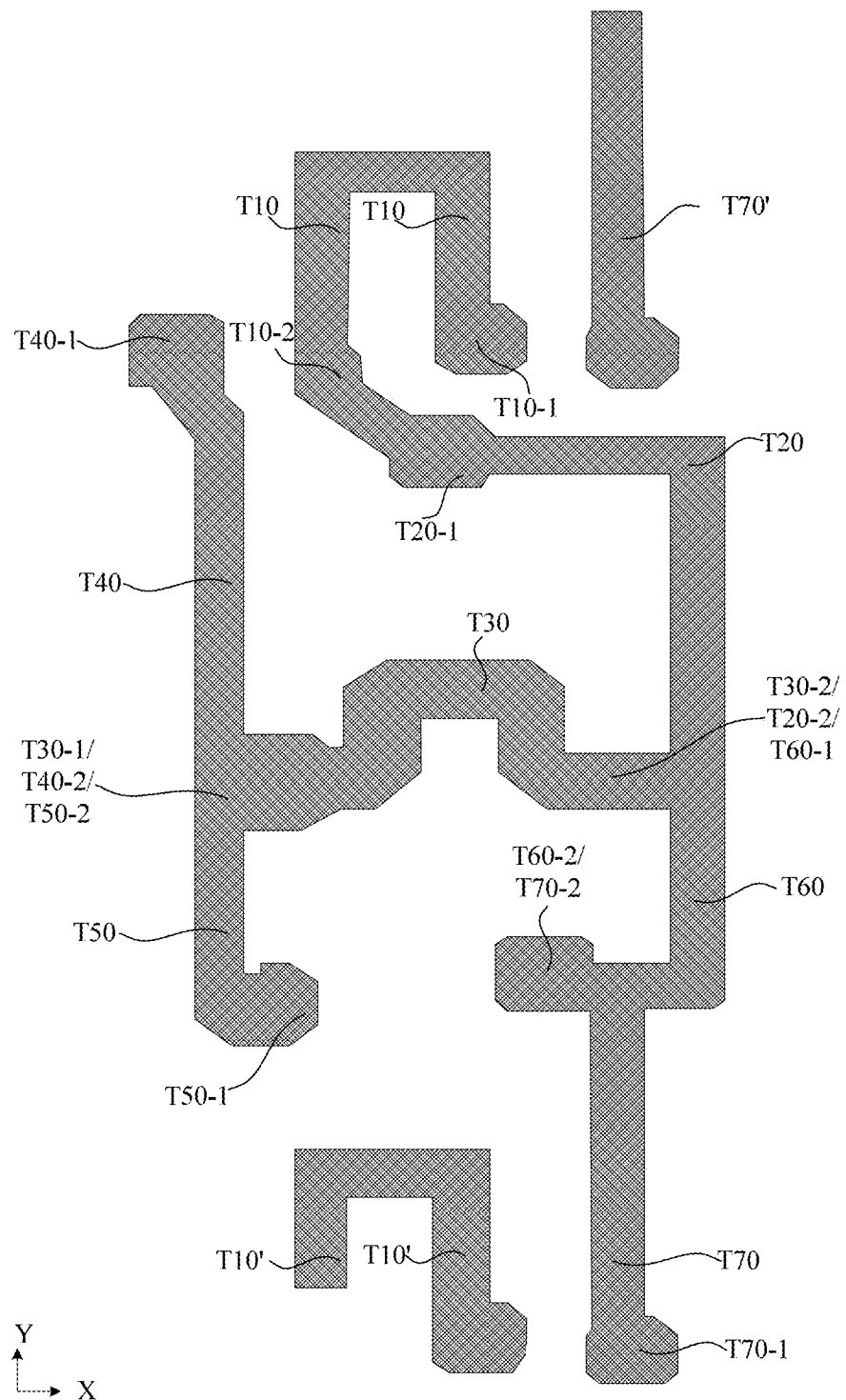
FIG. 8C is a schematic diagram of a pixel circuit of a second structure after a semiconductor layer is formed according to at least one embodiment of the present disclosure.
Figure 8D:
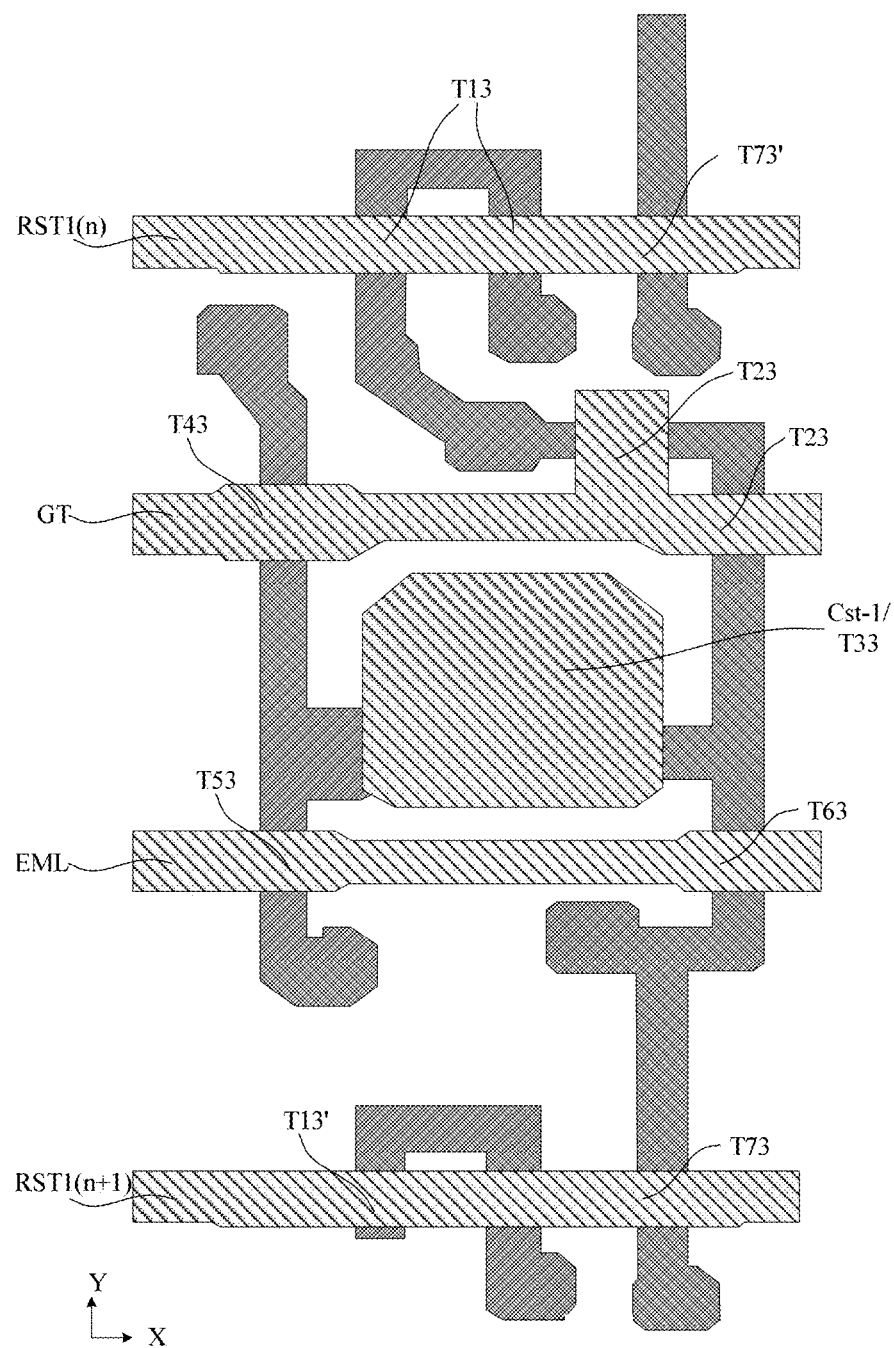
FIG. 8D is a schematic diagram of a pixel circuit of a second structure after a first conductive layer is formed according to at least one embodiment of the present disclosure.
Figure 8E:
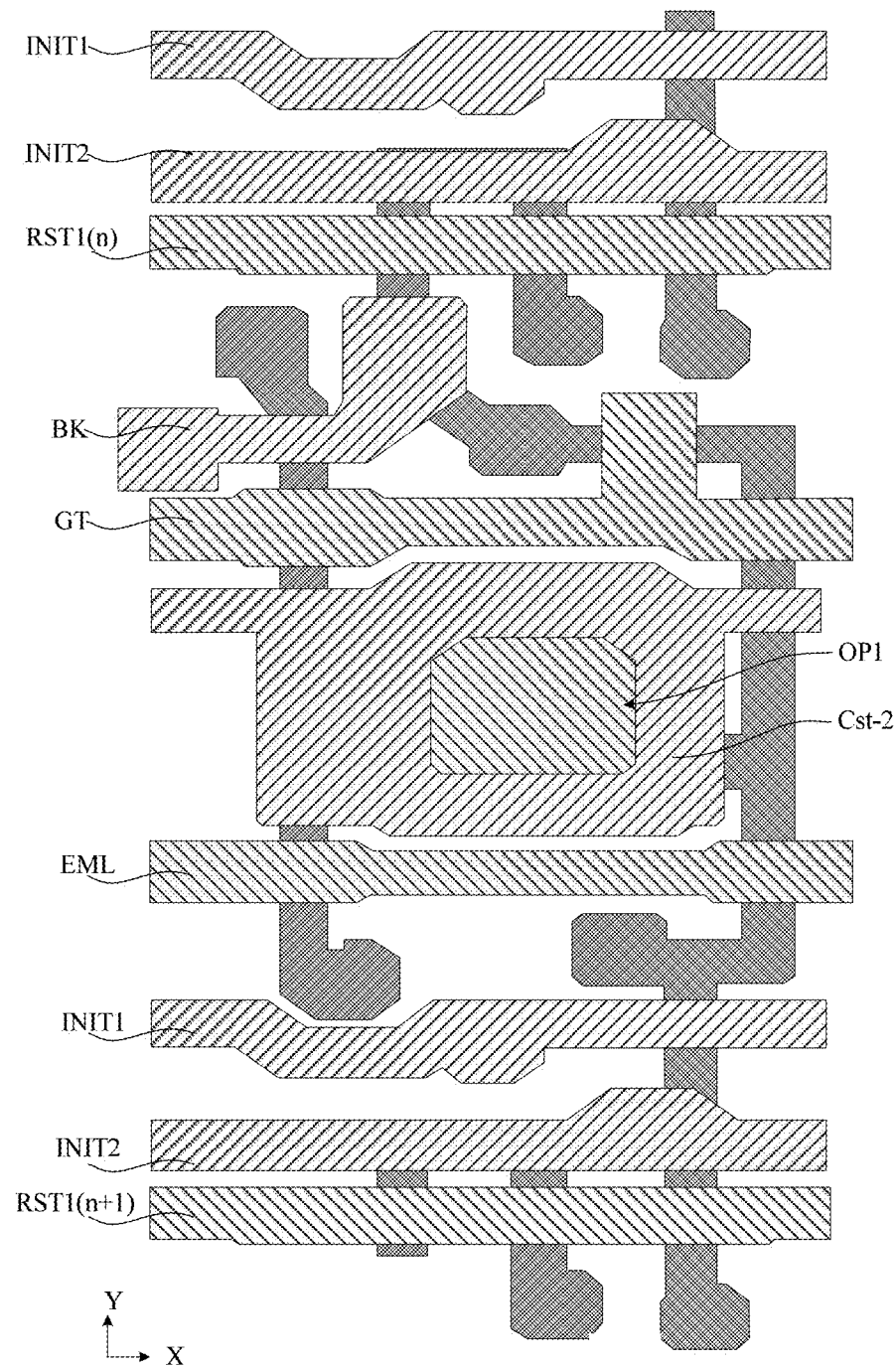
FIG. 8E is a schematic diagram of a pixel circuit of a second structure after a second conductive layer is formed according to at least one embodiment of the present disclosure.
Figure 8F:
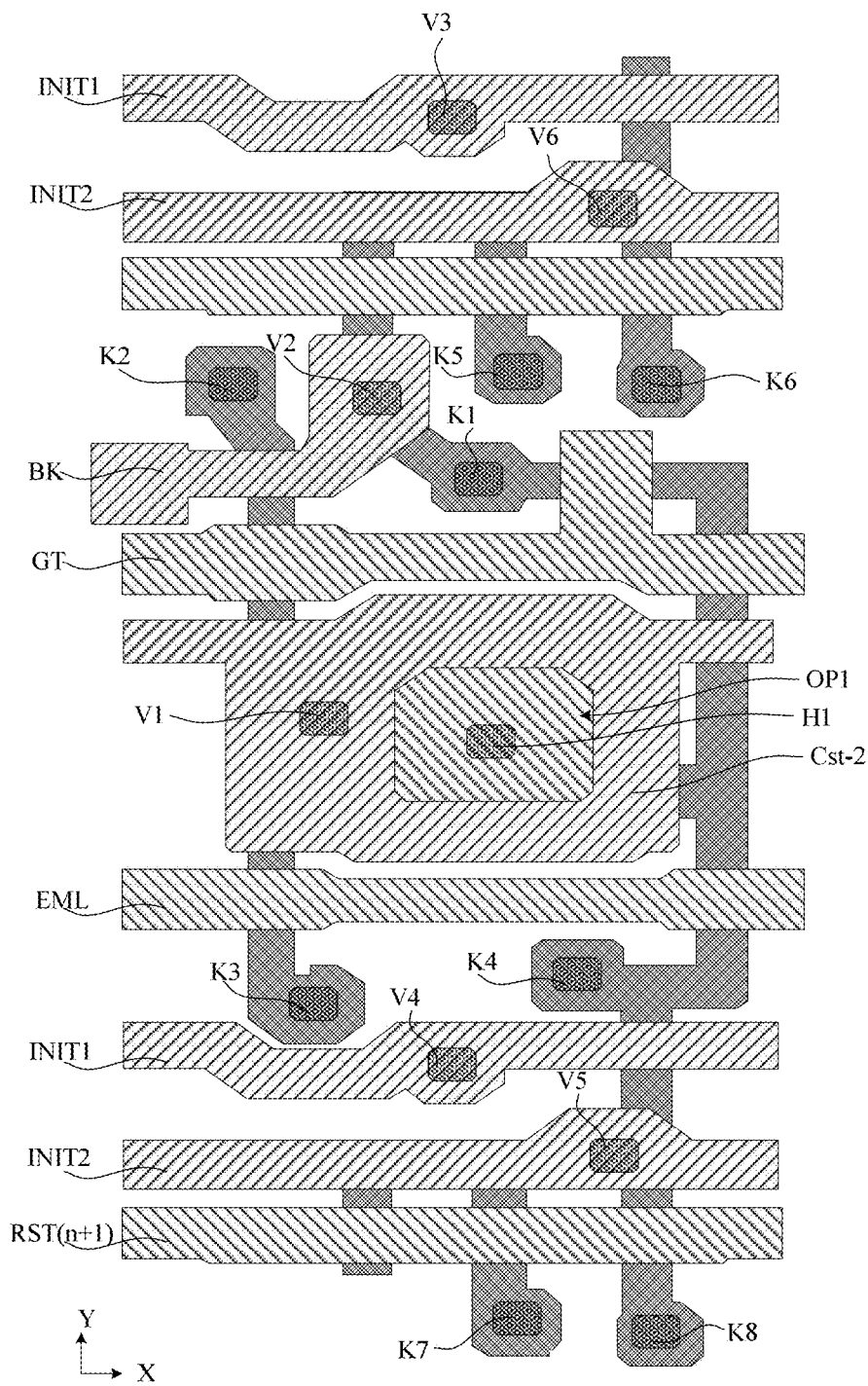
FIG. 8F is a schematic diagram of a pixel circuit of a second structure after a fourth insulating layer is formed according to at least one embodiment of the present disclosure.
Figure 8G:
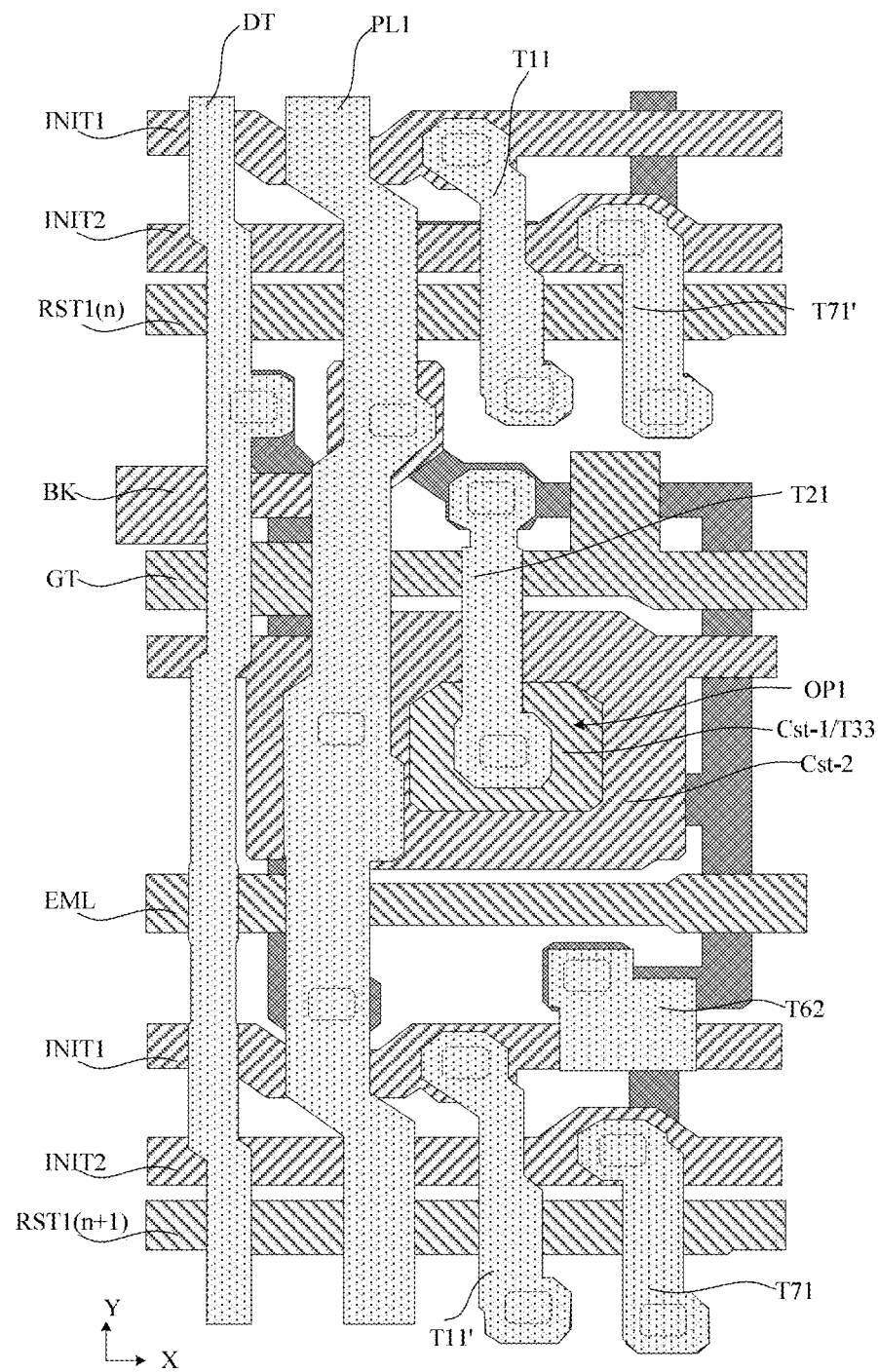
FIG. 8G is a schematic diagram of a pixel circuit of a second structure after a third conductive layer is formed according to at least one embodiment of the present disclosure.
Figure 8H:
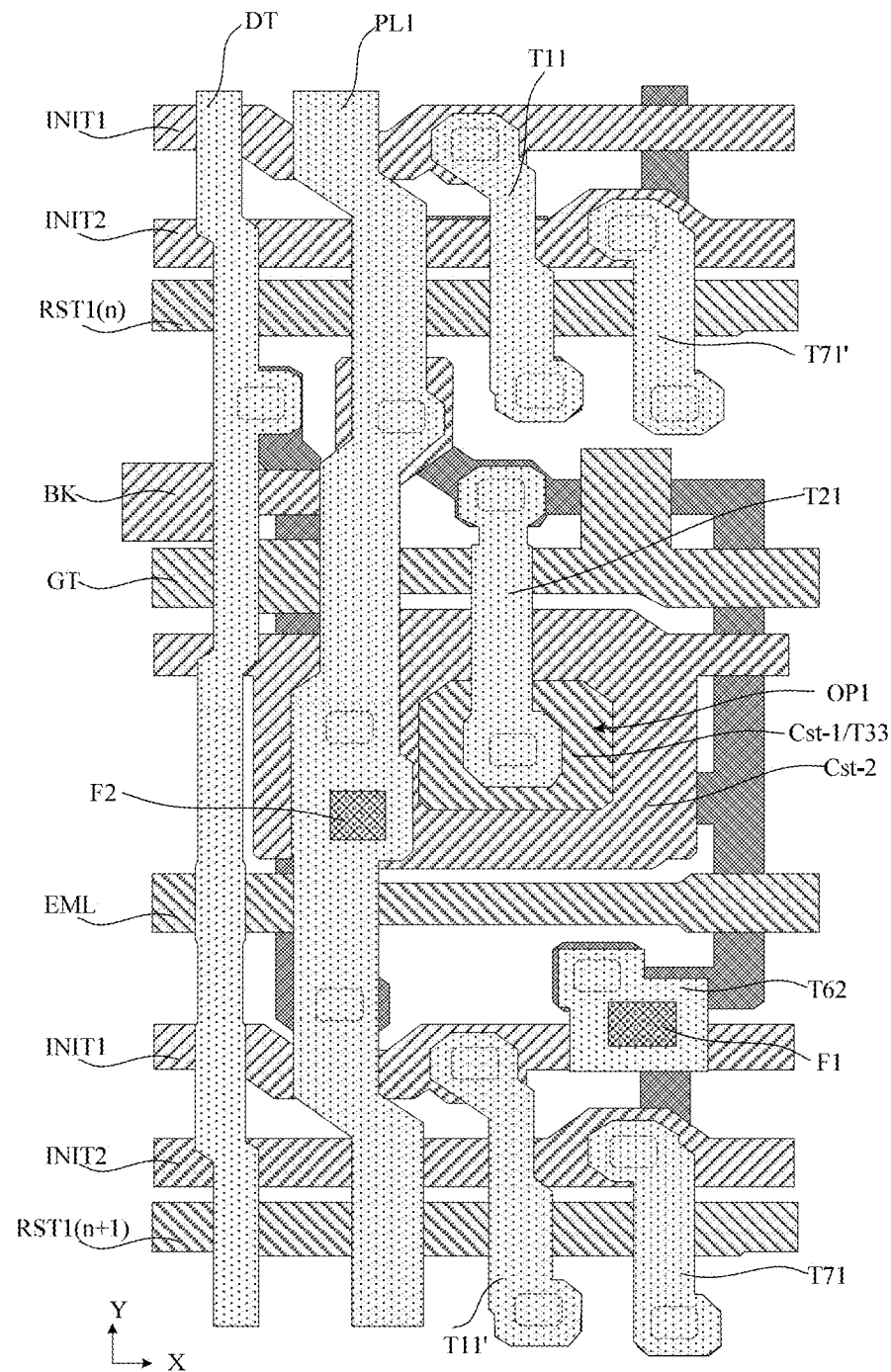
FIG. 8H is a schematic diagram of a pixel circuit of a second structure after a fifth insulating layer is formed according to at least one embodiment of the present disclosure.
Figure 8I:
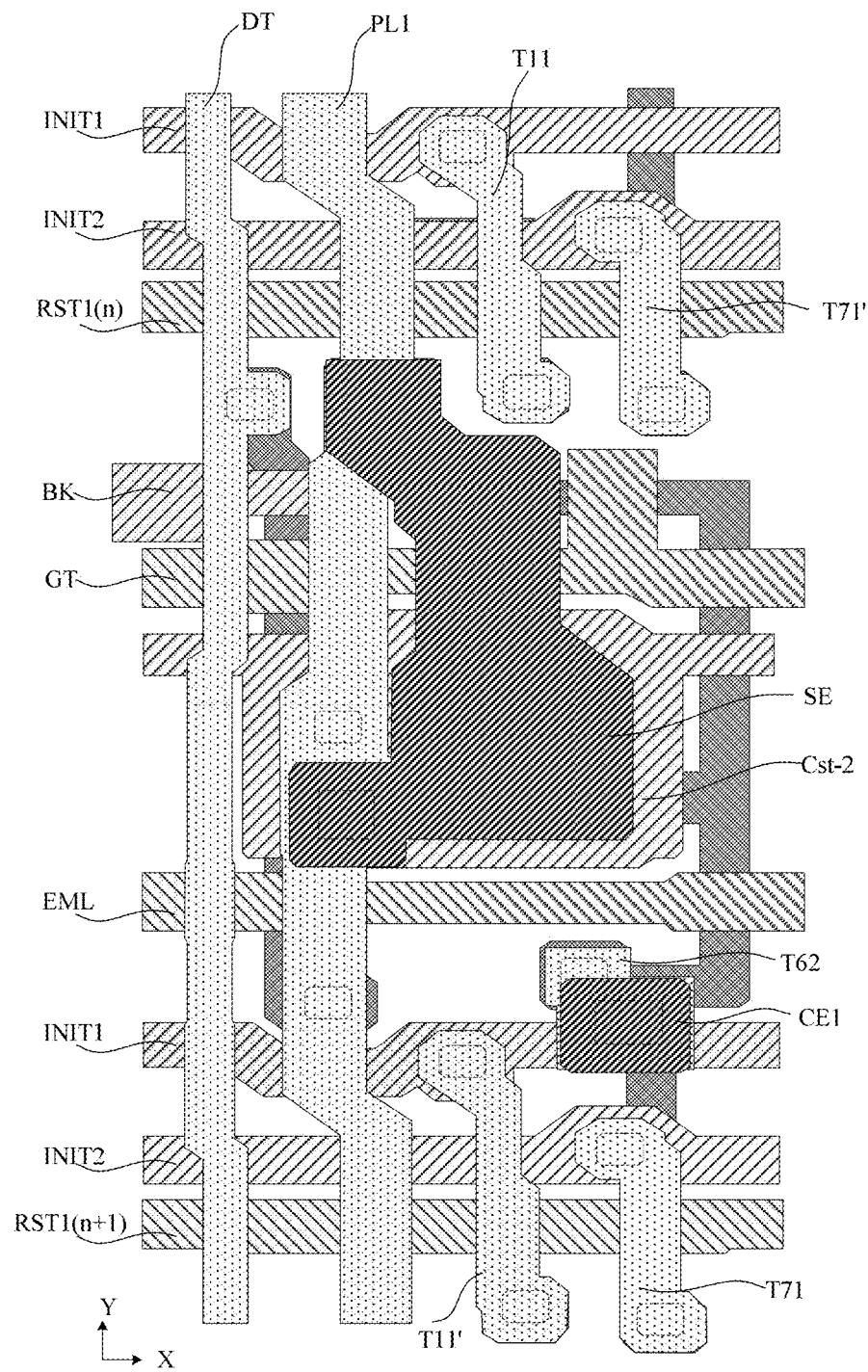
FIG. 8I is a schematic diagram of a pixel circuit of a second structure after a fourth conductive layer is formed according to at least one embodiment of the present disclosure.

FIG. 8A is a schematic plan view of a pixel circuit of a second structure according to at least one embodiment of the present disclosure. FIG. 8B is a schematic partial sectional view along a Q-Q direction in FIG. 8A. FIG. 8C is a schematic diagram of a pixel circuit of a second structure after a semiconductor layer is formed according to at least one embodiment of the present disclosure. FIG. 8D is a schematic diagram of a pixel circuit of a second structure after a first conductive layer is formed according to at least one embodiment of the present disclosure. FIG. 8E is a schematic diagram of a pixel circuit of a second structure after a second conductive layer is formed according to at least one embodiment of the present disclosure. FIG. 8F is a schematic diagram of a pixel circuit of a second structure after a fourth insulating layer is formed according to at least one embodiment of the present disclosure. FIG. 8G is a schematic diagram of a pixel circuit of a second structure after a third conductive layer is formed according to at least one embodiment of the present disclosure. FIG. 8H is a schematic diagram of a pixel circuit of a second structure after a fifth insulating layer is formed according to at least one embodiment of the present disclosure. FIG. 8I is a schematic diagram of a pixel circuit of a second structure after a fourth conductive layer is formed according to at least one embodiment of the present disclosure.

In FIG. 8A, multiple transistors T1 to T7 of a pixel circuit in a n-th row, a second reset transistor T7' of a pixel circuit in a (n−1)-th row, and a first reset transistor T1' of a pixel circuit in a (n+1)-th row are illustrated. As shown in FIG. 7A, the first reset transistor T1 of the pixel circuit in the n-th row is connected with a first reset control line RST1(n), the first reset control line RST1(n) is connected with a scan line GT(n−1) connected with the pixel circuit in the (n−1)-th row, and the second reset transistor T7' of the pixel circuit in the (n−1)-th row is connected with the first reset control line RST1(n) to achieve input of a scan signal SCAN(n−1). The first reset transistor T1' of the pixel circuit in the (n+1)-th row is connected with a first reset control line RST1(n+1), the first reset control line RST1(n+1) is connected with a scan line GT(n) connected with the pixel circuit in the n-th row, and the second reset transistor T7 of the pixel circuit in the n-th row is connected with the first reset control line RST1(n+1) to achieve input of a scan signal SCAN(n).

In some exemplary embodiments, as shown in FIG. 8A to FIG. 8I, a first active layer T10 of a first reset transistor T1, a second active layer T20 of a threshold compensation transistor T2, a third active layer T30 of a drive transistor T3, a fourth active layer T40 of a data writing transistor T4, a fifth active layer T50 of a first light emitting control transistor T5, a sixth active layer T60 of a second light emitting control transistor T6, and a seventh active layer T7 of a second reset transistor T7 have an integrated structure connected with each other. A first active layer T10 of a pixel circuit in a current row is independent of a seventh active layer T70' of a pixel circuit in a previous row, and a seventh active layer T10 of the pixel circuit in the current row is independent of a first active layer T10' of a pixel circuit in a next row. A first electrode T71 of a second reset transistor T7 of a pixel circuit of a second structure is connected with a second initial signal line INIT2 through a second via V5, and with a first region T70-1 of the seventh active layer T70 of the second reset transistor T7 through a third via K8. A first electrode T11 of a first reset transistor T1 of the pixel circuit of the second structure is connected with a first initial signal line INIT1 through a second via V3, and with a first region T10-1 of a first active layer T10 of the first reset transistor T1 through a third via K5. A first electrode T71' of a second reset transistor T7' of a pixel circuit in a previous row is connected with the second initial signal line INIT2 through a second via V6, and with a first region of a seventh active layer T70' of a second reset transistor T7' through a third via K6. The first electrode T11' of the first reset transistor T1' of a pixel circuit in a next row is connected with the first initial signal line INIT1 through a second via V4, and with a first region of a first active layer T10' of the first reset transistor T1' through a third via K7.

Other plane structures of a pixel circuit of a second structure may refer to related description of the pixel circuit of the first structure, so it will not be repeated here.

In this exemplary embodiment, an active layer of a second reset transistor of a pixel circuit of a first structure is connected with an active layer of a first reset transistor of a pixel circuit in a next row, so that it is achieved that the second reset transistor is connected with a first initial signal line. An active layer of a second reset transistor of a pixel circuit of a second structure is disconnected from an active layer of a first reset transistor of a pixel circuit in a next row; and the active layer of the second reset transistor is directly connected with a second initial signal line, so that it is achieved that the second reset transistor is connected with the second initial signal line. According to a layout design of a pixel circuit provided by this exemplary embodiment, an interval disposition of first-type pixel circuits and second-type pixel circuit on a base substrate may be achieved.

The process of preparing the display substrate will be exemplarily described below. "Patterning process" mentioned in the present disclosure includes photoresist coating, mask exposure, development, etching, photoresist stripping and so on for metal materials, inorganic materials or transparent conducting materials, and includes organic material coating, mask exposure, development and so on for organic materials. Deposition may be implemented by adopting any one or more of sputtering, evaporation and chemical vapor deposition. Coating may be implemented by adopting any one or more of spray coating, spin coating and inkjet printing, and etching may be implemented by adopting any one or more of dry etching and wet etching, which are not limited in the present disclosure. A "thin film" refers to a layer of thin film formed by a material on a base substrate through deposition, coating, or other processes. If a "thin film" does not need a patterning process in the whole preparing process, the "thin film" may also be referred to as a "layer". If a "thin film" needs a patterning process in the whole preparing process, it is referred to as "thin film" before the patterning process and "layer" after the patterning process. A "layer" obtained after a patterning process includes at least one "pattern". "A and B are disposed in the same layer" in the present disclosure means that A and B are formed at the same time through a same patterning process, and a "thickness" of a film layer is a size of the film layer in a direction perpendicular to a display substrate. In an exemplary embodiment of the present disclosure, "an orthographic projection of B is within the range of an orthographic projection of A" means that the boundary of the orthographic projection of B falls within the boundary range of the orthographic projection of A, or the boundary of the orthographic projection of A overlaps with the boundary of the orthographic projection of B. "An orthographic projection of A including an orthographic projection of B" means that a boundary of the orthographic projection of B falls within a range of a boundary of the orthographic projection of A, or the boundary of the orthographic projection of A overlaps with the boundary of the orthographic projection of B.

In some exemplary embodiments, a preparation process of a display substrate may include following operations.

(1) A pattern of a semiconductor layer is formed.

In some exemplary embodiments, forming the pattern of the semiconductor layer may include: depositing a first insulating thin film and a semiconductor thin film sequentially on a base substrate 50, patterning the semiconductor thin film through a patterning process to form a first insulating layer 51 covering the base substrate 50 and a semiconductor layer disposed on the first insulating layer, as shown in FIG. 7B and FIG. 8B.

After this process, the display substrate includes the first insulating layer 51 disposed on the base substrate 50 and the semiconductor layer disposed on the first insulating layer 51. The semiconductor layer may include active layers of multiple transistors of a pixel circuit, as shown in FIG. 7C and FIG. 8C. In this exemplary embodiment, an active layer of a second reset transistor of a pixel circuit of a first structure and an active layer of a first reset transistor of an adjacent pixel circuit have an integrated structure, and an active layer of a second reset transistor of a pixel circuit of a second structure and an active layer of a first reset transistor of an adjacent pixel circuit are independent of each other.

(2) A pattern of a first conductive layer is formed.

In some exemplary embodiments, forming the pattern of the first conductive layer may include: depositing a second insulating thin film and a first metal thin film sequentially on the base substrate 50 formed with the aforementioned pattern, and patterning the first metal thin film through a patterning process to form a second insulating layer 52 covering the pattern of the semiconductor layer and a pattern of a first conductive layer disposed on the second insulating layer 52. As shown in FIG. 7D and FIG. 8D, the pattern of the first conductive layer at least includes: a first reset control line RST1, a scan line GT, a light emitting control line EML, and a first electrode Cst-1 of a storage capacitor Cst. The first reset control line RST1, the scan line GT, and the light emitting control line EML extend along a first direction X, and the first electrode Cst-1 of the storage capacitor Cst is located between the scan line GT and the light emitting control line EML. In some examples, the first conductive layer may be referred to as a first gate metal (GATE 1) layer.

In some exemplary embodiments, after the pattern of the first conductive layer is formed, the first conductive layer may be used as a shield to perform a conductive treatment on the semiconductor layer. The semiconductor layer in a region shielded by the first conductive layer forms channel regions of multiple transistor, and the semiconductor layer in a region not shielded by the first conductive layer is made to be conductive, that is, first regions and second regions of a first active layer T10 to a seventh active layer T70 are all made to be conductive.

(3) A pattern of a second conductive layer is formed.

In some exemplary embodiments, forming the pattern of the second conductive layer may include: depositing a third insulating thin film and a second metal thin film sequentially on the base substrate 50 formed with the aforementioned patterns, and patterning the second metal thin film through a patterning process to form a third insulating layer 53 covering the pattern of the first conductive layer, and the pattern of the second conductive layer arranged on the third insulating layer 53. As shown in FIG. 7E and FIG. 8E, the pattern of the second conductive layer at least includes a first initial signal line INIT1, a second initial signal line INIT2, a second electrode Cst-2 of a storage capacitor Cst, and a first shield electrode BK. In some examples, the second conductive layer may be referred to as a second gate metal (GATE 2) layer.

(4) A pattern of a fourth insulating layer is formed.

In some exemplary embodiments, forming the pattern of the fourth insulating layer may include: depositing a fourth insulating thin film on the base substrate 50 formed with the aforementioned patterns, and patterning the fourth insulating thin film through a patterning process to form a pattern of a fourth insulating layer 54 covering the second conductive layer. As shown in FIG. 7F and FIG. 8F, multiple first vias, multiple second vias, and multiple third vias are disposed on the fourth insulating layer. The fourth insulating layer 54 and the third insulating layer 53 in the multiple first vias are etched away to expose a surface of the first conductive layer, the fourth insulating layer 54 in the multiple second vias is etched away to expose a surface of the second conductive layer, and the fourth insulating layer 54, the third insulating layer 53, and the second insulating layer 52 in the multiple third vias are etched away to expose a surface of the semiconductor layer.

(5) A pattern of a third conductive layer is formed.

In some exemplary embodiments, forming the pattern of the third conductive layer may include: depositing a third metal thin film on the base substrate 50 formed with the aforementioned patterns, and patterning the third metal thin film through a patterning process to form a third conductive layer on the fourth insulating layer 54. As shown in FIG. 7G and FIG. 8G, the third conductive layer at least includes a data line DT, a first power supply line PL1, and first and second electrodes of multiple transistors. In some examples, the third conductive layer is referred to as a first source-drain metal (SD1) layer.

In this example, as shown in FIG. 7G, a first electrode T71 of a second reset transistor T7 of a pixel circuit of a first structure is not connected with a second initial signal line INIT2. As shown in FIG. 8G, a first electrode T71 of a second reset transistor T7 of a pixel circuit of a second structure is connected with a second initial signal line INIT2 through a second via V5.

(6) A pattern of a fifth insulating layer is formed.

In some exemplary embodiments, forming the pattern of the fifth insulating layer may include: coating a flat thin film on the base substrate 50 formed with the aforementioned patterns, and patterning the flat thin film through a patterning process to form a fifth insulating layer 55 covering the third conductive layer. As shown in FIG. 7H and FIG. 8H, multiple fourth vias F1 and F2 are disposed on the fifth insulating layer 55. The fifth insulating layer 55 in the multiple fourth vias is etched away to expose a surface of the third conductive layer. In some examples, the fifth insulating layer 55 may be referred to as a flat layer.

(7) A pattern of a fourth conductive layer is formed.

In some exemplary embodiments, forming the pattern of the fourth conductive layer may include: depositing a fourth metal thin film on the base substrate 50 formed with the aforementioned patterns, patterning the fourth metal thin film through a patterning process, and forming a fourth conductive layer disposed on the fifth insulating layer 55. As shown in FIG. 7I and FIG. 8I, the pattern of the fourth conductive layer at least includes a first connection electrode CE1 and a second shield electrode SE. The second shield electrode SE is connected with a first power supply line PL1 through a fourth via F2, and the first connection electrode CE1 is connected with a second electrode T62 of a second light emitting control transistor T6 through a fourth via F1. In some examples, the fourth conductive layer may be referred to as a second source-drain metal (SD1) layer.

In some exemplary embodiments, a subsequent preparation process may include: forming a conductive line layer. In some examples, multiple conductive lines connecting second-type pixel circuits of a first display region and second-region light emitting elements of a second display region may have a same layer structure. The forming the conductive line layer may include: coating a flat thin film on the base substrate formed with the fourth conductive layer, patterning the flat thin film through a patterning process, and forming a sixth insulating layer covering the fourth conductive layer; then depositing a transparent conductive thin film, and patterning the transparent conductive thin film through a patterning process to form a conductive line layer disposed on the sixth insulating layer. A first connection electrode CE1 of a second-type pixel circuit of a first display region R1 is connected with a conductive line which may extend from the first display region R1 to the second display region R2, so as to be connected with a second-region light emitting element of the second display region R2. However, this embodiment is not limited thereto. In some examples, multiple conductive lines connecting second-type pixel circuits of the first display region R1 and second-region light emitting elements of the second display region R2 may have a different layer structure. Or, at least one conductive line may be formed by connecting multiple conductive line segments located in different conductive line layers.

In some exemplary embodiments, a preparation process after the conductive line layer is formed may include: forming a flat layer covering the conductive line layer; depositing a transparent conductive thin film, patterning the transparent conductive thin film through a patterning process, and forming an anode disposed on the flat layer; coating a pixel definition thin film, and patterning the pixel definition thin film through a patterning process to form a pixel definition layer, a pixel definition layer of each sub-pixel is disposed with a pixel opening, and the pixel opening exposes the anode. An organic light emitting layer is formed using an evaporation or ink-jet printing process, and a cathode is formed on the organic light emitting layer. An encapsulation layer is formed, and the encapsulation layer may include a first encapsulation layer, a second encapsulation layer, and a third encapsulation layer stacked, the first encapsulation layer and the third encapsulation layer may be made of an inorganic material, the second encapsulation layer may be made of an organic material, and the second encapsulation layer is disposed between the first encapsulation layer and the third encapsulation layer to ensure that external water vapor cannot enter a light emitting element.

In some exemplary embodiments, the base substrate 50 may be a flexible base substrate or a rigid base substrate. The rigid substrate may be, but is not limited to, one or more of glass and quartz. The flexible substrate may be, but is not limited to, one or more of polyethylene terephthalate, ethylene terephthalate, polyether ether ketone, polystyrene, polycarbonate, polyarylate, polyarylester, polyimide, polyvinyl chloride, polyethylene, and textile fibers. In some examples, the flexible base substrate may include a first flexible material layer, a first inorganic material layer, a semiconductor layer, a second flexible material layer, and a second inorganic material layer stacked, materials of the first flexible material layer and the second flexible material layer may be polyimide (PI), polyethylene terephthalate (PET), or a polymer soft film after a surface treatment, etc.; materials of the first inorganic material layer and the second inorganic material layer may be silicon nitride (SiNx) or silicon oxide (SiOx), etc., for improving capabilities of water-resistance and oxygen-resistance of the base substrate; and a material of the semiconductor layer may be amorphous silicon (a-si).

In some exemplary embodiments, the first conductive layer, the second conductive layer, the third conductive layer, and the fourth conductive layer may be made of a metal material, such as any one or more of Argentum (Ag), Copper (Cu), Aluminum (Al), and Molybdenum (Mo), or an alloy material of the aforementioned metals, such as an Aluminum-Neodymium alloy (AlNd) or a Molybdenum-Niobium alloy (MoNb), and may be in a single-layer structure, or a multilayer composite structure such as Mo/Cu/Mo. The first insulating layer 51, the second insulating layer 52, the third insulating layer 53, and the fourth insulating layer 54 may be made of any one or more of silicon oxide (SiOx), silicon nitride (SiNx), and silicon oxynitride (SiON), and may be a single layer, a multiple layer, or a composite layer.

The first insulating layer is referred to as a buffer layer, which is used for improving capabilities of water-resistance and oxygen-resistance of the base substrate. The second insulating layer 52 and the third insulating layer 53 are referred to as gate insulating (GI) layers. The fourth insulating layer is referred to as an interlayer insulating (ILD) layer. A flat layer may be made of an organic material. A transparent conductive thin film may be made of indium tin oxide (ITO) or indium zinc oxide (IZO). An active layer may be made of Poly-Silicon (p-Si), that is, an LTPS thin film transistor is suitable for this embodiment. However, this embodiment is not limited thereto. For example, transistors in a pixel circuit of a first structure and a pixel circuit of a second structure may both be oxide thin film transistors.

The description of a structure and preparation process of a display substrate of this embodiment is merely illustrative. In some exemplary embodiments, changes in corresponding structures and, addition or deletion of patterning processes may be made according to actual needs. For example, a pixel circuit of a first structure and a pixel circuit of a second structure may include other numbers of transistors and storage capacitors, such as a 7T2C structure, a 6T1C structure, a 6T2C structure, or a 9T2C structure, or the number of transistors is less than seven.

The structure (or method) shown in this embodiment may be combined with structures (or methods) shown in other embodiments as appropriate.

In some exemplary embodiments, in the pixel circuit of the first structure and the pixel circuit of the second structure, the first reset transistor T1 and the threshold compensation transistor T2 may be oxide thin film transistors, and remaining transistors (namely, the drive transistor T3, the data writing transistor T4, the first light emitting control transistor T5, the second light emitting control transistor T6, and the second reset transistor T7) may be Low Temperature Poly-Silicon thin film transistors, thereby forming an LTPO display substrate. In this example, active layers of the first reset transistor T1 have a same layer structure with the threshold compensation transistor T2, and have a different layer structure with active layers of other transistors. Active layers of the second reset transistor T7 of a pixel circuit of a first structure in a n-th row and the first reset transistor T1 of a pixel circuit in a (n+1)-th row are of a different layer structure and isolated from each other, and the second reset transistor T7 and the first reset transistor T1 of the pixel circuit of the first structure are respectively connected with the first initial signal line INIT1. Active layers of the second reset transistor T7 of a pixel circuit of a second structure in a n-th row and the first reset transistor T1 of a pixel circuit in a (n+1)-th row are of a different layer structure and isolated from each other. The second reset transistor T7 of the pixel circuit of the second structure is connected with the second initial signal line INIT2 and the first reset transistor T1 is connected with the first initial signal line INIT1. In some examples, the first reset transistor T1 and the threshold compensation transistor T2 may be N-type transistors, and remaining transistors may be P-type transistors. In a plane perpendicular to a display substrate, the display substrate may include: a first semiconductor layer, a first conductive layer, a second semiconductor layer, a second conductive layer, a third conductive layer, and a fourth conductive layer which are disposed subsequently on a base substrate. The first semiconductor layer at least includes: active layers of multiple P-type transistors; the first conductive layer at least includes gate electrodes of multiple P-type transistors, a first electrode of a storage capacitor, a scan line, a light emitting control line, and a second reset control lines; the second semiconductor layer at least includes: active layers of multiple N-type transistors; the second conductive layer at least includes a second electrode of the storage capacitor and a first reset control line; the third conductive layer at least includes first and second electrodes of multiple transistors, a first power supply line, a data line, a first initial signal line, and a second initial signal line; and the fourth conductive layer at least includes a first connection electrode. An insulating layer is disposed between a semiconductor layer and a conductive layer that are adjacent, and an insulating layer is disposed between adjacent conductive layers. However, this embodiment is not limited thereto.

Figure 9:
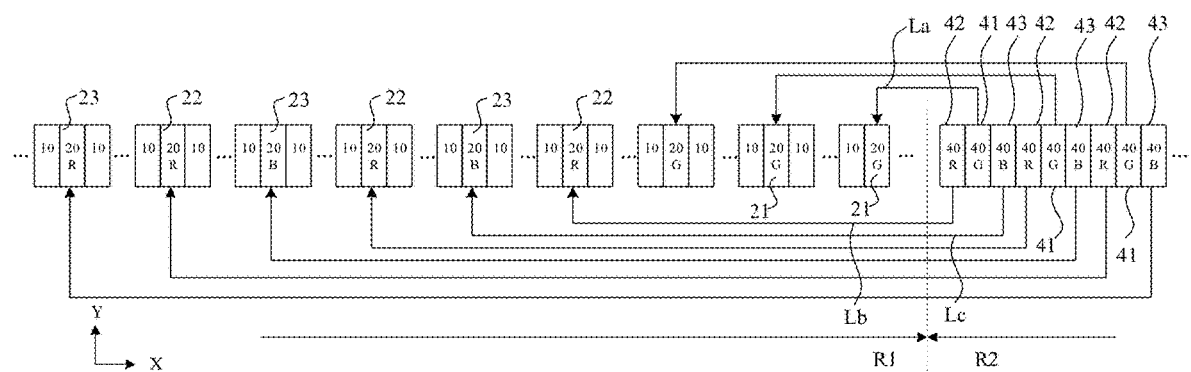
FIG. 9 is another partial schematic diagram of a row of light emitting elements located in a second display region and second-type pixel circuits connected thereto of a display substrate according to at least one embodiment of the present disclosure.

FIG. 9 is another schematic diagram of a row of light emitting elements located in a second display region and second-type pixel circuits connected thereto of a display substrate according to at least one embodiment of the present disclosure. In some exemplary embodiments, a second display region R2 is symmetrical about a central axis in a first direction X. FIG. 9 only illustrates a connection relationship between a row of light emitting elements in a left half of the second display region R2 and second-type pixel circuits in a first display region R1.

In some exemplary embodiments, as shown in FIG. 9, in the second display region R2, multiple second-region light emitting elements 40 includes multiple first light emitting elements 41, multiple second light emitting elements 42, and multiple third light emitting elements 43. A first light emitting element 41 is configured to emit light of a first color, a second light emitting element 42 is configured to emit light of a second color, and a third light emitting element 43 is configured to emit light of a third color. In some examples, the light of the first color is green (G) light, the light of the second color is red (R) light, and the light of the third color is blue (B) light. However, this embodiment is not limited thereto.

In some exemplary embodiments, as shown in FIG. 9, in the first display region R1, multiple second-type pixel circuits 20 includes multiple first pixel circuits 21, multiple second pixel circuits 22, and multiple third pixel circuits 23. The multiple first light emitting elements 41 are connected with the multiple first pixel circuits 21 through multiple first conductive lines La, the multiple second light emitting elements 42 are connected with the multiple second pixel circuits 22 through multiple second conductive lines Lb, and the multiple third light emitting elements 43 are connected with the multiple third pixel circuits 23 through multiple third conductive lines Lc. For example, a first light emitting element 41 is connected with a first pixel circuit 21 through a first conductive line La, a second light emitting element 42 is connected with a second pixel circuit 22 through a second conductive line Lb, and a third light emitting element 43 is connected with a third pixel circuit 23 through a third conductive line Lc. However, this embodiment is not limited thereto.

In some exemplary embodiments, as shown in FIG. 9, in a group of second-region light emitting elements 40 and a group of second-type pixel circuits 20, multiple first pixel circuits 21 connected with multiple first light emitting elements 41 are closer to the second display region R2 than each of multiple second pixel circuits 22 connected with multiple second light emitting elements 42 and closer to the second display region R2 than each of multiple third pixel circuits 23 connected with multiple third light emitting elements 43. In some examples, a second pixel circuit 22 connected with a second light emitting element 42 and a third pixel circuit 23 connected with a third light emitting element 43 may both be pixel circuits of the second structure, and lengths of a second conductive line Lb and a third conductive line Lc are both greater than a length boundary-dividing value. A first pixel circuit 21 connected with a first conductive line La whose length is smaller than a length boundary-dividing value may be a pixel circuit of the first structure, and a first pixel circuit 21 connected with a first conductive line La whose length is greater than the length boundary-dividing value may be a pixel circuit of the second structure. However, this embodiment is not limited thereto. In some examples, when lengths of the first conductive lines La are all smaller than a length boundary-dividing value, and lengths of a part of the second conductive lines Lb and a part of the third conductive lines Lc are greater than the length boundary-dividing value, then a first pixel circuit 21 connected with a first conductive line La is a pixel circuit of the first structure, pixel circuits connected with a second conductive lines Lb and a third conductive lines Lc whose lengths are smaller than the length boundary-dividing value are pixel circuits of the first structure, and pixel circuits connected with a second conductive lines Lb and a third conductive lines Lc whose lengths are greater than the length boundary-dividing value are pixel circuits of the second structure.

For other structures of the display substrate of this embodiment, reference may be made to the description of the aforementioned embodiments, so it will not be repeated here. The structure (or method) shown in this embodiment may be combined with structures (or methods) shown in other embodiments as appropriate.

Figure 10:
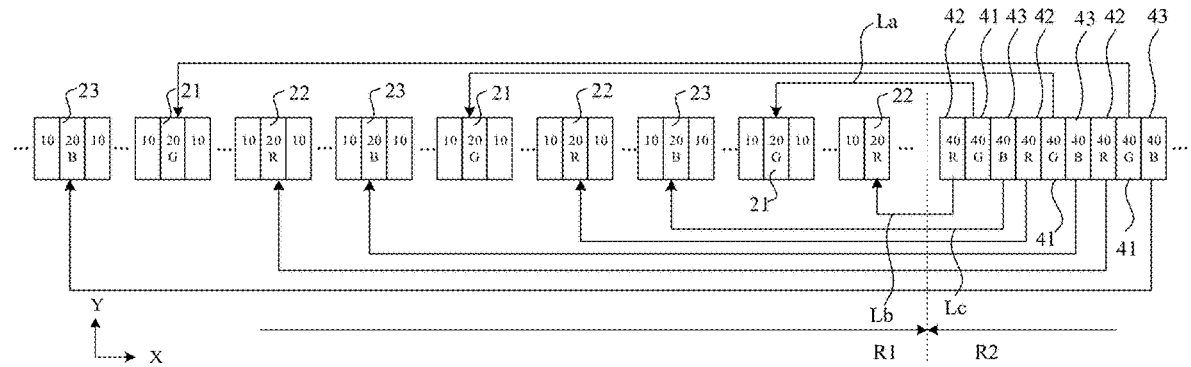
FIG. 10 is another partial schematic diagram of a row of light emitting elements located in a second display region and a second-type pixel circuit connected thereto of a display substrate according to at least one embodiment of the present disclosure.

FIG. 10 is another schematic diagram of a row of light emitting elements located in a second display region and second-type pixel circuits connected thereto of a display substrate according to at least one embodiment of the present disclosure. In some exemplary embodiments, a second display region R2 is symmetrical about a central axis in a first direction X. FIG. 10 only illustrates a connection relationship between a row of light emitting elements in a left half of the second display region R2 and second-type pixel circuits in a first display region R1.

In some exemplary embodiments, as shown in FIG. 10, in a group of second-region light emitting elements 40 and a group of second-type pixel circuits 20, multiple second pixel circuits 22 connected with multiple second light emitting elements 42, multiple first pixel circuits 21 connected with multiple first light emitting elements 41, and multiple third pixel circuits 23 connected with multiple third light emitting elements 43 are alternately disposed in sequence. In this example, a first pixel circuit 21 connected with a first conductive line La whose length is smaller than a length boundary-dividing value may be a pixel circuit of a first structure, and a first pixel circuit 21 connected with a first conductive line La whose length is greater than the length boundary-dividing value may be a pixel circuit of a second structure. A second pixel circuit 22 connected with a second conductive line Lb whose length is smaller than the length boundary-dividing value may be a pixel circuit of the first structure, and a second pixel circuit 21 connected with a second conductive line Lb whose length is greater than the length boundary-dividing value may be a pixel circuit of the second structure. A third pixel circuit 23 connected with a third conductive line Lc whose length is smaller than the length boundary-dividing value may be a pixel circuit of the first structure, and a third pixel circuit 23 connected with a third conductive line Lc whose length is greater than the length boundary-dividing value may be a pixel circuit of the second structure.

For other structures of the display substrate of this embodiment, reference may be made to the description of the aforementioned embodiments, so it will not be repeated here. The structure (or method) shown in this embodiment may be combined with structures (or methods) shown in other embodiments as appropriate.

Figure 11:
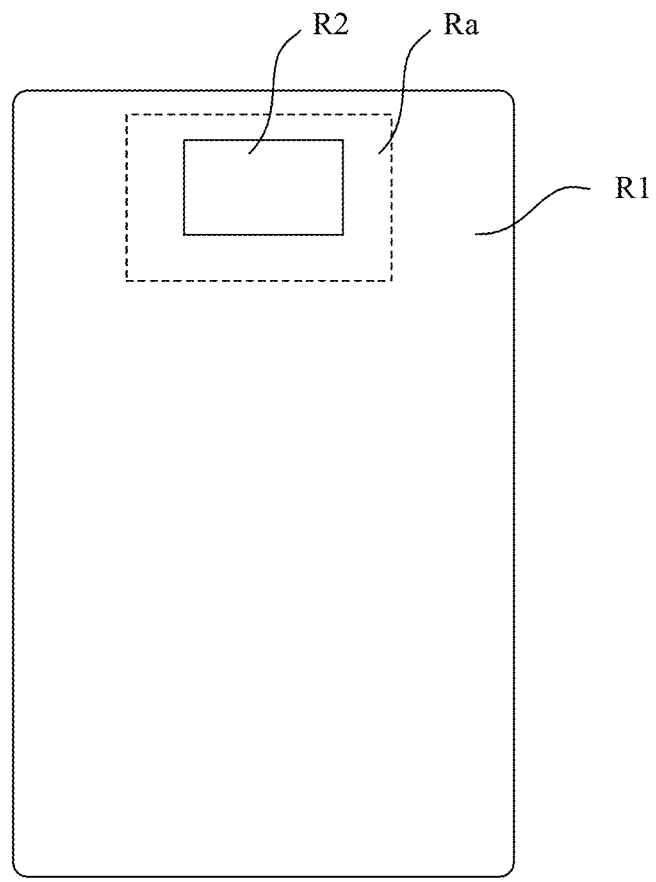
FIG. 11 is another schematic diagram of a display substrate according to at least one embodiment of the present disclosure.

FIG. 11 is a schematic diagram of a display substrate according to at least one embodiment of the present disclosure. In some exemplary embodiments, a first display region R1 includes an auxiliary region Ra. An area of the auxiliary region Ra may be smaller than an area of the first display region R1 except the auxiliary region Ra. The auxiliary region Ra surrounds a second display region R2. Multiple first-type pixel circuits and multiple first-region light emitting elements are located in the first display region R1. At least one first-type pixel circuit among the multiple first-type pixel circuits may be connected with at least one first-region light emitting element among the multiple first-region light emitting elements, and an orthographic projection of at least one first-type pixel circuit on a base substrate may at least partially overlap with an orthographic projection of at least one first-region light emitting element on the base substrate. A first-type pixel circuit may be a pixel circuit of a first structure. Multiple second-type pixel circuits are located in the auxiliary region Ra. Multiple second-region light emitting elements are located in the second display region. At least one second-type pixel circuit of the multiple second-type pixel circuits may be connected with at least one second-region light emitting element of the multiple second-region light emitting elements through conductive lines. A second-type of pixel circuit connected with a conductive line whose length is smaller than a length boundary-dividing value may be a pixel circuit of the first structure, and a second-type of pixel circuit connected with a conductive line whose length is greater than or equal to the length boundary-dividing value may be a pixel circuit of the second structure.

For other structures of the display substrate of this embodiment, reference may be made to the description of the aforementioned embodiments, so it will not be repeated here. The structure (or method) shown in this embodiment may be combined with structures (or methods) shown in other embodiments as appropriate.

An embodiment of the present disclosure further provides a preparation method of a display substrate, which includes: forming multiple second-type pixel circuits in a first display region of a base substrate, and forming multiple second-region light emitting elements in a second display region, wherein the first display region is located at at least one side of the second display region. The multiple second-type pixel circuits include multiple pixel circuits of a first structure and multiple pixel circuits of a second structure. At least one pixel circuit of the multiple pixel circuits of the first structure is connected with at least one light emitting element of the multiple second-region light emitting elements through a first group of conductive lines. At least one pixel circuit of the multiple pixel circuits of the second structure is connected with at least one light emitting element of the multiple second-region light emitting elements through a second group of conductive lines. A length of the second group of conductive lines is greater than a length of the first group of conductive lines.

For the preparation method of the display substrate in this embodiment, reference may be made to description of the aforementioned embodiments, so it will not be repeated here.

Figure 12:
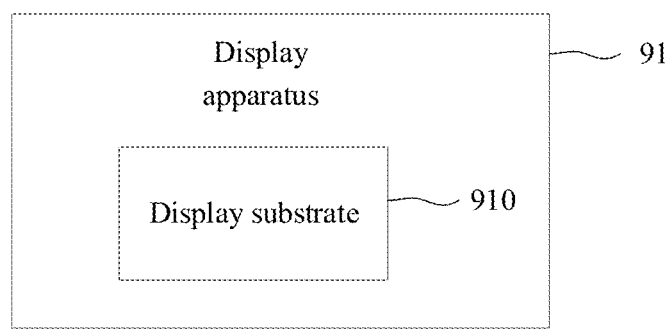
FIG. 12 is a schematic diagram of a display apparatus according to at least one embodiment of the present disclosure.

FIG. 12 is a schematic diagram of a display apparatus according to at least one embodiment of the present disclosure. As shown in FIG. 12, this embodiment provides a display apparatus 91, which includes a display substrate 910 of the aforementioned embodiments. In some examples, the display substrate 910 may be an OLED display substrate. The display apparatus 91 may be any product or component with a display function, such as a mobile phone, a tablet computer, a television, a display, a notebook computer, a digital photo frame, and a navigator. However, this embodiment is not limited thereto.

The drawings of the present disclosure only involve the structures involved in the present disclosure, and other structures may refer to conventional designs. The embodiments of the present disclosure, and features in the embodiments may be combined with each other to obtain new embodiments if there is no conflict.

Those of ordinary skill in the art should understand that modifications or equivalent replacements may be made to the technical solutions of the present disclosure without departing from the spirit and scope of the technical solutions of the present disclosure, and shall all fall within the scope of the claims of the present disclosure.

The invention claimed is:

1. A display substrate, comprising:
 a base substrate disposed with a first display region and a second display region, wherein the first display region is located at at least one side of the second display region;
 a plurality of second-region light emitting elements located in the second display region; and
 a plurality of second-type pixel circuits located in the first display region;
 the plurality of second-type pixel circuits comprise a plurality of pixel circuits of a first structure and a plurality of pixel circuits of a second structure; the second structure is different from the first structure; at least one pixel circuit of the plurality of pixel circuits of the first structure is connected with at least one second-region light emitting element of the plurality of second-region light emitting elements through a first group of conductive lines;
 at least one pixel circuit of the plurality of pixel circuits of the second structure is connected with at least one light emitting element of the plurality of second-region light emitting elements through a second group of conductive lines; and a length of the second group of conductive lines is greater than a length of the first group of conductive lines,
 wherein the pixel circuit of the first structure is only connected with a first initial signal line, and the pixel circuit of the second structure is connected with the first initial signal line and a second initial signal line; and the first initial signal line and the second initial signal line provide different initial signals.

2. The display substrate according to claim 1, further comprising:
 a plurality of first-region light emitting elements located in the first display region; and
 a plurality of first-type pixel circuits located in the first display region;
 at least one first-type pixel circuit of the plurality of first-type pixel circuits is connected with at least one first-region light emitting element of the plurality of first-region light emitting elements, and an orthographic projection of the at least one first-type pixel circuit on the base substrate is at least partially overlapped with an orthographic projection of the at least one first-region light emitting element on the base substrate;
the plurality of first-type pixel circuits are all pixel circuits of the first structure.

3. The display substrate according to claim 1, wherein the pixel circuit of the first structure comprises a drive transistor, a first reset transistor, and a second reset transistor;
a gate electrode of the first reset transistor is connected with a first reset control line, a first electrode of the first reset transistor is connected with a gate electrode of the drive transistor, and a second electrode of the first reset transistor is connected with the first initial signal line; and
a gate electrode of the second reset transistor is connected with a second reset control line, a first electrode of the second reset transistor is connected with a first electrode of a light emitting element, and a second electrode of the second reset transistor is connected with the first initial signal line.

4. The display substrate according to claim 3, wherein the pixel circuit of the second structure comprises a drive transistor, a first reset transistor, and a second reset transistor;
a gate electrode of the first reset transistor is connected with a first reset control line, a first electrode of the first reset transistor is connected with a gate electrode of the drive transistor, and a second electrode of the first reset transistor is connected with the first initial signal line;
a gate electrode of the second reset transistor is connected with a second reset control line, a first electrode of the second reset transistor is connected with a first electrode of a light emitting element, and a second electrode of the second reset transistor is connected with the second initial signal line; and
a second initial signal provided by the second initial signal line is different from a first initial signal provided by the first initial signal line.

5. The display substrate according to claim 4, wherein the first initial signal provided by the first initial signal line is a constant voltage signal.

6. The display substrate according to claim 4, wherein the second initial signal provided by the second initial signal line is a constant voltage signal, and the second initial signal is larger than the first initial signal provided by the first initial signal line.

7. The display substrate according to claim 4, wherein a magnitude of the second initial signal provided by the second initial signal line with which the pixel circuit of the second structure is connected is proportional to the length of the second group of conductive lines with which the pixel circuit of the second structure is connected.

8. The display substrate according to claim 4, wherein the pixel circuit of the first structure or the pixel circuit of the second structure further comprises a data writing transistor, a threshold compensation transistor, a first light emitting control transistor, and a second light emitting control transistor;
a gate electrode of the data writing transistor is connected with a scan line, a first electrode of the data writing transistor is connected with a data line, and a second electrode of the data writing transistor is connected with a first electrode of the drive transistor;
a gate electrode of the threshold compensation transistor is connected with the scan line, a first electrode of the threshold compensation transistor is connected with the gate electrode of the drive transistor, and a second electrode of the threshold compensation transistor is connected with a second electrode of the drive transistor;
a gate electrode of the first light emitting control transistor is connected with a light emitting control line, a first electrode of the first light emitting control transistor is connected with a first power supply line, and a second electrode of the first light emitting control transistor is connected with the first electrode of the drive transistor; and
a gate electrode of the second light emitting control transistor is connected with a light emitting control line, a first electrode of the second light emitting control transistor is connected with the second electrode of the drive transistor, and a second electrode of the second light emitting control transistor is connected with the first electrode of the light emitting element.

9. The display substrate according to claim 8, wherein in a direction perpendicular to the display substrate, the display substrate at least comprises: a semiconductor layer, a first conductive layer, a second conductive layer, and a third conductive layer which are disposed on the base substrate;
the semiconductor layer at least comprises active layers of a plurality of transistors;
the first conductive layer at least comprises gate electrodes of the plurality of transistors and a first electrode of a storage capacitor, the scan line, the light emitting control line, the first reset control line, and the second reset control line;
the second conductive layer at least comprises a second electrode of the storage capacitor, the first initial signal line, and the second initial signal line; and
the third conductive layer at least comprises first and second electrodes of the plurality of transistors, the first power supply line, and the data line.

10. The display substrate according to claim 9, wherein active layers of the first reset transistor and the second reset transistor of the pixel circuit of the first structure form an integrated structure; an active layer of the second reset transistor of the pixel circuit of the first structure of a n-th row and an active layer of the first reset transistor of the pixel circuit of a (n+1)-th row form an integrated structure, and n is a positive integer.

11. The display substrate according to claim 9, wherein active layers of the first reset transistor and the second reset transistor of the pixel circuit of the second structure form an integrated structure; an active layer of the second reset transistor of the pixel circuit of the second structure of a n-th row is not connected with an active layer of the first reset transistor of the pixel circuit of a (n+1)-th row, and n is a positive integer.

12. The display substrate according to claim 9, wherein the third conductive layer comprises the second electrode of the second reset transistor of the pixel circuit of the second structure and the second electrode of the second reset transistor of the pixel circuit of the first structure;
the second electrode of the second reset transistor of the pixel circuit of the second structure is connected with the second initial signal line through a via; and
the second electrode of the second reset transistor of the pixel circuit of the first structure is not connected with the second initial signal line.

13. The display substrate according to claim 2, wherein the plurality of second-type pixel circuits are distributed among the plurality of first-type pixel circuits at intervals.

14. The display substrate according to claim 13, wherein, among the plurality of first-type pixel circuits and the plurality of second-type pixel circuits, a size of any pixel circuit in a first direction is smaller than a size of the first-region light emitting element in the first direction.

15. The display substrate according to claim 13, wherein the plurality of second-region light emitting elements comprises a plurality of groups of second-region light emitting elements, second-region light emitting elements in each group are arranged along the first direction, and the plurality of groups of second-region light emitting elements are arranged along a second direction;

the plurality of second-type pixel circuits comprise a plurality of groups of second-type pixel circuits, second-type pixel circuits in each group are arranged along the first direction, and the plurality of groups of second-type pixel circuits are arranged along the second direction;

the plurality of second-region light emitting elements at least comprises a plurality of first light emitting elements, a plurality of second light emitting elements, and a plurality of third light emitting elements;

the plurality of second-type pixel circuits comprise a plurality of first pixel circuits, a plurality of second pixel circuits, and a plurality of third pixel circuits; the plurality of first light emitting elements are connected with the plurality of first pixel circuits, the plurality of second light emitting elements are connected with the plurality of second pixel circuits, and the plurality of third light emitting elements are connected with the plurality of third pixel circuits; and in at least one group of second-region light emitting elements and at least one group of second-type pixel circuits, the plurality of first pixel circuits connected with the plurality of first light emitting elements are closer to the second display region than each of the plurality of second pixel circuits connected with the plurality of second light emitting elements and closer to the second display region than each of the plurality of third pixel circuits connected with the plurality of third light emitting elements.

16. The display substrate according to claim 15, wherein the second pixel circuits connected with the second light emitting elements through the second group of conductive lines are the pixel circuits of the second structure, the third pixel circuits connected with the third light emitting elements through the second group of conductive lines are the pixel circuits of the second structure, the first pixel circuits connected with the first light emitting elements through the first group of conductive lines are the pixel circuits of the first structure, and the first pixel circuits connected with the first light emitting elements through the second group of conductive lines are the pixel circuits of the second structure.

17. The display substrate according to claim 16, wherein a first light emitting element is configured to emit green light, one of a second light emitting element and a third light emitting element is configured to emit red light, and the other of the second light emitting element and the third light emitting element is configured to emit blue light.

18. The display substrate according to claim 1, wherein the length of the first group of conductive lines is smaller than a length boundary value, and the length of the second group of conductive lines is greater than or equal to the length boundary value; a ratio of the length boundary value to a maximum length of the second group of conductive lines is about 0.25 to 0.35.

19. A display apparatus, comprising a display substrate and a photosensitive sensor, wherein the display substrate comprises:
a base substrate disposed with a first display region and a second display region, wherein the first display region is located at at least one side of the second display region;
a plurality of second-region light emitting elements located in the second display region; and
a plurality of second-type pixel circuits located in the first display region,
wherein the plurality of second-type pixel circuits comprise a plurality of pixel circuits of a first structure and a plurality of pixel circuits of a second structure; the second structure is different from the first structure; at least one pixel circuit of the plurality of pixel circuits of the first structure is connected with at least one second-region light emitting element of the plurality of second-region light emitting elements through a first group of conductive lines;
wherein at least one pixel circuit of the plurality of pixel circuits of the second structure is connected with at least one light emitting element of the plurality of second-region light emitting elements through a second group of conductive lines; and a length of the second group of conductive lines is greater than a length of the first group of conductive lines, and
wherein the photosensitive sensor located at a side of the display substrate, and an orthographic projection of the photosensitive sensor on the display substrate is overlapped with the second display region of the display substrate,
wherein the pixel circuit of the first structure is only connected with a first initial signal line, and the pixel circuit of the second structure is connected with the first initial signal line and a second initial signal line; and the first initial signal line and the second initial signal line provide different initial signals.

* * * * *